United States Patent
Widjaja et al.

(10) Patent No.: US 11,882,684 B2
(45) Date of Patent: *Jan. 23, 2024

(54) MEMORY DEVICE COMPRISING AN ELECTRICALLY FLOATING BODY TRANSISTOR

(71) Applicant: Zeno Semiconductor, Inc., Sunnyvale, CA (US)

(72) Inventors: Yuniarto Widjaja, Cupertino, CA (US); Jin-Woo Han, San Jose, CA (US)

(73) Assignee: Zeno Semiconductor Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/863,848

(22) Filed: Jul. 13, 2022

(65) Prior Publication Data

US 2022/0344337 A1  Oct. 27, 2022

Related U.S. Application Data

(63) Continuation of application No. 17/047,623, filed as application No. PCT/US2019/027994 on Apr. 17, 2019, now Pat. No. 11,404,419.

(60) Provisional application No. 62/678,975, filed on May 31, 2018, provisional application No. 62/661,722, filed on Apr. 24, 2018, provisional application No. 62/659,628, filed on Apr. 18, 2018.

(51) Int. Cl.
*G11C 11/40* (2006.01)
*H10B 12/00* (2023.01)
*G11C 11/402* (2006.01)
*H01L 29/78* (2006.01)

(52) U.S. Cl.
CPC .......... *H10B 12/20* (2023.02); *G11C 11/4023* (2013.01); *H01L 29/785* (2013.01); *H01L 29/7841* (2013.01)

(58) Field of Classification Search
None
See application file for complete search history.

(56) References Cited

U.S. PATENT DOCUMENTS

| | | | |
|---|---|---|---|
| 4,300,212 A | 11/1981 | Simko | |
| 4,959,812 A | 9/1990 | Momodomi et al. | |
| 4,975,764 A | 12/1990 | Hsu | |
| 5,304,833 A | 4/1994 | Shigeki et al. | |
| 5,365,477 A | 11/1994 | Cooper, Jr. et al. | |
| 5,465,249 A | 11/1995 | Cooper, Jr. et al. | |

(Continued)

FOREIGN PATENT DOCUMENTS

KR  1020100006085  1/2010

OTHER PUBLICATIONS

Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.

(Continued)

*Primary Examiner* — Tan T. Nguyen
(74) *Attorney, Agent, or Firm* — Law Office of Alan W. Cannon

(57) ABSTRACT

A semiconductor memory cell having an electrically floating body having two stable states is disclosed. A method of operating the memory cell is disclosed.

16 Claims, 53 Drawing Sheets

Cut along gate length

(56) References Cited

U.S. PATENT DOCUMENTS

| | | | |
|---|---|---|---|
| 5,519,831 A | 5/1996 | Holzhammer | |
| 5,581,504 A | 12/1996 | Chang | |
| 5,767,549 A | 6/1998 | Chen et al. | |
| 5,999,444 A | 12/1999 | Fujiwara et al. | |
| 6,005,818 A | 12/1999 | Ferrant et al. | |
| 6,141,248 A | 10/2000 | Forbes et al. | |
| 6,163,048 A | 12/2000 | Hirose et al. | |
| 6,166,407 A | 12/2000 | Ohta | |
| 6,277,689 B1 | 8/2001 | Wong | |
| 6,341,087 B1 | 1/2002 | Kunikiyo et al. | |
| 6,356,485 B1 | 3/2002 | Proebsting et al. | |
| 6,376,876 B1 | 4/2002 | Shin et al. | |
| 6,433,391 B1 | 8/2002 | En et al. | |
| 6,542,411 B2 | 4/2003 | Tanikawa et al. | |
| 6,614,684 B1 | 9/2003 | Shukuri et al. | |
| 6,661,042 B2 | 12/2003 | Hsu | |
| 6,686,624 B2 | 2/2004 | Hsu | |
| 6,724,657 B2 | 4/2004 | Shukuri et al. | |
| 6,791,882 B2 | 9/2004 | Seki et al. | |
| 6,801,452 B2 | 10/2004 | Miwa et al. | |
| 6,835,979 B1 | 12/2004 | Liu et al. | |
| 6,885,581 B2 | 4/2005 | Nemati et al. | |
| 6,913,964 B2 | 7/2005 | Hsu | |
| 6,925,006 B2 | 8/2005 | Fazan et al. | |
| 6,954,377 B2 | 10/2005 | Choi et al. | |
| 6,969,662 B2 | 11/2005 | Fazan et al. | |
| 7,030,435 B2 | 4/2006 | Gnadinger | |
| 7,085,156 B2 | 8/2006 | Ferrant et al. | |
| 7,118,986 B2 | 10/2006 | Steigerwalt et al. | |
| 7,170,807 B2 | 1/2007 | Fazan et al. | |
| 7,208,795 B2 | 4/2007 | Carver et al. | |
| 7,224,019 B2 | 5/2007 | Hieda et al. | |
| 7,259,420 B2 | 8/2007 | Anderson et al. | |
| 7,259,992 B2 | 8/2007 | Shirota | |
| 7,285,820 B2 | 10/2007 | Park et al. | |
| 7,301,803 B2 | 11/2007 | Okhonin et al. | |
| 7,329,580 B2 | 2/2008 | Cho et al. | |
| 7,376,006 B2 | 5/2008 | Bednorz et al. | |
| 7,440,333 B2 | 10/2008 | Hsia et al. | |
| 7,447,068 B2 | 11/2008 | Tsai et al. | |
| 7,450,423 B2 | 11/2008 | Lai et al. | |
| 7,473,611 B2 | 1/2009 | Cho et al. | |
| 7,504,302 B2 | 3/2009 | Mathew et al. | |
| 7,541,636 B2 | 6/2009 | Ranica et al. | |
| 7,542,345 B2 | 6/2009 | Okhonin et al. | |
| 7,579,241 B2 | 8/2009 | Hieda et al. | |
| 7,609,551 B2 | 10/2009 | Shino et al. | |
| 7,622,761 B2 | 11/2009 | Park et al. | |
| 7,701,763 B2 | 4/2010 | Roohparvar | |
| 7,709,875 B2 * | 5/2010 | Villaret | H01L 29/1075 257/314 |
| 7,733,693 B2 | 6/2010 | Ferrant et al. | |
| 7,759,715 B2 | 7/2010 | Bhattacharyya | |
| 7,760,548 B2 | 7/2010 | Widjaja | |
| 7,847,338 B2 | 12/2010 | Widjaja | |
| 7,924,630 B2 | 4/2011 | Carman | |
| 7,933,140 B2 | 4/2011 | Wang et al. | |
| 8,014,200 B2 | 9/2011 | Widjaja | |
| 8,036,033 B2 | 10/2011 | Widjaja | |
| 8,059,459 B2 | 11/2011 | Widjaja | |
| 8,077,536 B2 | 12/2011 | Widjaja | |
| 8,130,547 B2 | 3/2012 | Widjaja et al. | |
| 8,130,548 B2 | 3/2012 | Widjaja et al. | |
| 8,159,878 B2 | 4/2012 | Widjaja | |
| 8,169,823 B2 | 5/2012 | Bae | |
| 8,174,886 B2 | 5/2012 | Widjaja et al. | |
| 8,194,451 B2 | 6/2012 | Widjaja | |
| 8,208,302 B2 | 6/2012 | Widjaja et al. | |
| 8,243,499 B2 | 8/2012 | Widjaja | |
| 8,264,876 B2 * | 9/2012 | Widjaja | H01L 29/7841 365/177 |
| 8,294,193 B2 | 10/2012 | Widjaja | |
| 8,391,066 B2 | 3/2013 | Widjaja | |
| 8,472,249 B2 | 6/2013 | Widjaja | |
| 8,514,622 B2 | 8/2013 | Widjaja | |
| 8,514,623 B2 | 8/2013 | Widjaja et al. | |
| 8,531,881 B2 | 9/2013 | Widjaja | |
| 8,559,257 B2 | 10/2013 | Widjaja | |
| 8,570,803 B2 | 10/2013 | Widjaja | |
| 8,582,359 B2 | 11/2013 | Widjaja | |
| 8,654,583 B2 | 2/2014 | Widjaja | |
| 8,711,622 B2 | 4/2014 | Widjaja | |
| 8,767,458 B2 | 7/2014 | Widjaja | |
| 8,787,085 B2 | 7/2014 | Widjaja | |
| 8,837,247 B2 | 9/2014 | Widjaja | |
| 8,923,052 B2 | 12/2014 | Widjaja | |
| 8,934,296 B2 | 1/2015 | Widjaja | |
| 8,937,834 B2 | 1/2015 | Widjaja et al. | |
| 8,957,458 B2 | 2/2015 | Widjaja | |
| 8,995,186 B2 | 3/2015 | Widjaja | |
| 9,001,581 B2 | 4/2015 | Widjaja | |
| 9,025,358 B2 | 5/2015 | Widjaja | |
| 9,029,922 B2 | 5/2015 | Han et al. | |
| 9,030,872 B2 | 5/2015 | Widjaja et al. | |
| 9,087,580 B2 | 7/2015 | Widjaja | |
| 9,153,309 B2 | 10/2015 | Widjaja et al. | |
| 9,153,333 B2 | 10/2015 | Widjaja | |
| 9,208,840 B2 | 12/2015 | Widjaja et al. | |
| 9,208,880 B2 | 12/2015 | Louie et al. | |
| 9,209,188 B2 | 12/2015 | Widjaja | |
| 9,230,651 B2 | 1/2016 | Widjaja et al. | |
| 9,230,965 B2 | 1/2016 | Widjaja | |
| 9,236,382 B2 | 1/2016 | Widjaja et al. | |
| 9,257,179 B2 | 2/2016 | Widjaja | |
| 9,275,723 B2 | 3/2016 | Louie et al. | |
| 9,281,022 B2 | 3/2016 | Louie et al. | |
| 9,368,625 B2 | 6/2016 | Louie et al. | |
| 9,391,079 B2 | 7/2016 | Widjaja | |
| 9,401,206 B2 | 7/2016 | Widjaja | |
| 9,431,401 B2 | 8/2016 | Han et al. | |
| 9,455,262 B2 | 9/2016 | Widjaja | |
| 9,460,790 B2 | 10/2016 | Widjaja | |
| 9,484,082 B2 | 11/2016 | Widjaja | |
| 9,490,012 B2 | 11/2016 | Widjaja | |
| 9,496,053 B2 | 11/2016 | Han et al. | |
| 9,514,803 B2 | 12/2016 | Widjaja et al. | |
| 9,524,970 B2 | 12/2016 | Widjaja | |
| 9,536,595 B2 | 1/2017 | Louie et al. | |
| 9,548,119 B2 | 1/2017 | Han et al. | |
| 9,576,962 B2 | 2/2017 | Widjaja et al. | |
| 9,589,963 B2 | 3/2017 | Widjaja | |
| 9,601,493 B2 | 3/2017 | Widjaja | |
| 9,614,080 B2 | 4/2017 | Widjaja | |
| 9,646,693 B2 | 5/2017 | Widjaja | |
| 9,653,467 B2 | 5/2017 | Widjaja et al. | |
| 9,666,275 B2 | 5/2017 | Widjaja | |
| 9,679,648 B2 | 6/2017 | Widjaja | |
| 9,704,578 B2 | 7/2017 | Louie et al. | |
| 9,704,870 B2 | 7/2017 | Widjaja | |
| 9,715,932 B2 | 7/2017 | Widjaja | |
| 9,747,983 B2 | 8/2017 | Widjaja | |
| 9,761,311 B2 | 9/2017 | Widjaja | |
| 9,761,589 B2 | 9/2017 | Widjaja | |
| 9,793,277 B2 | 10/2017 | Widjaja et al. | |
| 9,799,392 B2 | 10/2017 | Han et al. | |
| 9,812,203 B2 | 11/2017 | Widjaja | |
| 9,812,456 B2 | 11/2017 | Widjaja | |
| 9,831,247 B2 | 11/2017 | Han et al. | |
| 9,847,131 B2 | 12/2017 | Widjaja | |
| 9,865,332 B2 | 1/2018 | Louie et al. | |
| 9,881,667 B2 | 1/2018 | Han et al. | |
| 9,893,067 B2 | 2/2018 | Widjaja et al. | |
| 9,905,564 B2 | 2/2018 | Widjaja et al. | |
| 9,922,711 B2 | 3/2018 | Widjaja | |
| 9,922,981 B2 | 3/2018 | Widjaja | |
| 9,928,910 B2 | 3/2018 | Widjaja | |
| 9,947,387 B2 | 4/2018 | Louie et al. | |
| 9,960,166 B2 | 5/2018 | Widjaja | |
| 9,978,450 B2 | 5/2018 | Widjaja | |
| 10,008,266 B1 | 6/2018 | Widjaja | |
| 10,026,479 B2 | 7/2018 | Louie et al. | |
| 10,032,514 B2 | 7/2018 | Widjaja | |
| 10,032,776 B2 | 7/2018 | Widjaja et al. | |
| 10,056,387 B2 | 8/2018 | Widjaja | |

(56) References Cited

U.S. PATENT DOCUMENTS

| | | |
|---|---|---|
| 10,074,653 B2 | 9/2018 | Widjaja |
| 10,079,236 B2 | 9/2018 | Widjaja |
| 10,079,301 B2 | 9/2018 | Han et al. |
| 10,103,148 B2 | 10/2018 | Louie et al. |
| 10,103,149 B2 | 10/2018 | Han et al. |
| 10,109,349 B2 | 10/2018 | Widjaja |
| 10,115,451 B2 | 10/2018 | Han et al. |
| 10,141,046 B2 | 11/2018 | Han et al. |
| 10,141,315 B2 | 11/2018 | Widjaja et al. |
| 10,157,663 B2 | 12/2018 | Louie et al. |
| 10,163,907 B2 | 12/2018 | Widjaja et al. |
| 10,181,471 B2 | 1/2019 | Widjaja et al. |
| 10,192,872 B2 | 1/2019 | Widjaja et al. |
| 10,204,684 B2 | 2/2019 | Widjaja |
| 10,204,908 B2 | 2/2019 | Widjaja |
| 10,210,934 B2 | 2/2019 | Widjaja |
| 10,211,209 B2 | 2/2019 | Widjaja |
| 10,242,739 B2 | 3/2019 | Widjaja |
| 10,249,368 B2 | 4/2019 | Widjaja |
| 10,340,006 B2 | 7/2019 | Widjaja |
| 10,340,276 B2 | 7/2019 | Widjaja et al. |
| 10,347,636 B2 | 7/2019 | Widjaja |
| 10,354,718 B2 | 7/2019 | Louie et al. |
| 10,373,685 B2 | 8/2019 | Louie et al. |
| 10,388,378 B2 | 8/2019 | Widjaja |
| 10,403,361 B2 | 9/2019 | Widjaja |
| 10,453,847 B2 | 10/2019 | Widjaja et al. |
| 10,461,083 B2 | 10/2019 | Han et al. |
| 10,461,084 B2 | 10/2019 | Widjaja |
| 10,468,102 B2 | 11/2019 | Widjaja |
| 10,497,443 B2 | 12/2019 | Widjaja |
| 10,504,585 B2 | 12/2019 | Louie et al. |
| 10,515,968 B2 | 12/2019 | Widjaja |
| 10,522,213 B2 | 12/2019 | Han et al. |
| 10,529,424 B2 | 1/2020 | Widjaja |
| 10,529,853 B2 | 1/2020 | Han et al. |
| 10,546,860 B2 | 1/2020 | Louie et al. |
| 10,553,281 B2 | 2/2020 | Widjaja |
| 10,553,683 B2 | 2/2020 | Han et al. |
| 10,580,482 B2 | 3/2020 | Han et al. |
| 10,593,675 B2 | 3/2020 | Widjaja et al. |
| 10,615,163 B2 | 4/2020 | Widjaja |
| 10,622,069 B2 | 4/2020 | Widjaja |
| 10,629,599 B2 | 4/2020 | Widjaja et al. |
| 10,644,001 B2 | 5/2020 | Widjaja et al. |
| 10,644,002 B2 | 5/2020 | Widjaja |
| 10,707,209 B2 | 7/2020 | Widjaja |
| 10,734,076 B2 | 8/2020 | Widjaja |
| 10,748,904 B2 | 8/2020 | Widjaja et al. |
| 10,783,952 B2 | 9/2020 | Louie et al. |
| 10,797,055 B2 | 10/2020 | Widjaja et al. |
| 10,804,276 B2 | 10/2020 | Widjaja |
| 10,818,354 B2 | 10/2020 | Widjaja |
| 10,825,520 B2 | 11/2020 | Widjaja |
| 10,839,905 B2 | 11/2020 | Louie et al. |
| 10,854,745 B2 | 12/2020 | Han et al. |
| 10,861,548 B2 | 12/2020 | Widjaja |
| 10,867,676 B2 | 12/2020 | Widjaja |
| 10,916,297 B2 | 2/2021 | Han et al. |
| 10,923,183 B2 | 2/2021 | Han et al. |
| 10,978,455 B2 | 4/2021 | Widjaja et al. |
| 10,991,697 B2 | 4/2021 | Louie et al. |
| 10,991,698 B2 | 4/2021 | Widjaja |
| 11,004,512 B2 | 5/2021 | Widjaja |
| 11,011,232 B2 | 5/2021 | Widjaja |
| 11,018,136 B2 | 5/2021 | Widjaja et al. |
| 11,031,401 B2 | 6/2021 | Han et al. |
| 11,037,929 B2 | 6/2021 | Widjaja |
| 11,063,048 B2 | 7/2021 | Widjaja |
| 11,100,994 B2 | 8/2021 | Louie et al. |
| 11,133,313 B2 | 9/2021 | Widjaja |
| 11,183,498 B2 | 11/2021 | Widjaja et al. |
| 11,201,215 B2 | 12/2021 | Han et al. |
| 11,211,125 B2 | 12/2021 | Widjaja |
| 11,217,300 B2 | 1/2022 | Louie et al. |
| 11,250,905 B2 | 2/2022 | Han et al. |
| 11,295,813 B2 | 4/2022 | Widjaja |
| 11,328,765 B2 | 5/2022 | Han et al. |
| 11,342,018 B2 | 5/2022 | Louie et al. |
| 11,348,922 B2 | 5/2022 | Widjaja et al. |
| 11,348,923 B2 | 5/2022 | Widjaja |
| 11,404,419 B2 * | 8/2022 | Widjaja ............ G11C 14/0036 |
| 11,404,420 B2 | 8/2022 | Widjaja |
| 11,417,657 B2 | 8/2022 | Widjaja et al. |
| 11,417,658 B2 | 8/2022 | Louie et al. |
| 2002/0018366 A1 | 2/2002 | Von Schwerin et al. |
| 2002/0048193 A1 | 4/2002 | Tanikawa et al. |
| 2003/0168677 A1 | 9/2003 | Hsu |
| 2005/0024968 A1 | 2/2005 | Lee et al. |
| 2005/0032313 A1 | 2/2005 | Forbes |
| 2005/0124120 A1 | 6/2005 | Du et al. |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0013007 A1 * | 1/2007 | Kusunoki ............ H10B 12/00 257/E27.084 |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0123418 A1 | 5/2008 | Widjaja |
| 2008/0224202 A1 | 9/2008 | Young et al. |
| 2008/0265305 A1 | 10/2008 | He et al. |
| 2008/0303079 A1 | 12/2008 | Cho et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0159650 A1 * | 6/2010 | Song ..................... H10B 12/09 438/155 |
| 2010/0246277 A1 | 9/2010 | Widjaja |
| 2010/0246284 A1 | 9/2010 | Widjaja |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |
| 2013/0148422 A1 | 6/2013 | Widjaja |
| 2013/0250685 A1 | 9/2013 | Widjaja |
| 2013/0264656 A1 | 10/2013 | Widjaja et al. |
| 2013/0292635 A1 | 11/2013 | Widjaja |
| 2013/0301349 A1 | 11/2013 | Widjaja |
| 2014/0021549 A1 | 1/2014 | Widjaja |
| 2014/0159156 A1 | 6/2014 | Widjaja |
| 2014/0160868 A1 | 6/2014 | Widjaja et al. |
| 2014/0198551 A1 | 7/2014 | Louie et al. |

(56) References Cited

U.S. PATENT DOCUMENTS

| | | |
|---|---|---|
| 2014/0252451 A1* | 9/2014 | Han ............... H01L 29/7885 257/324 |
| 2014/0307501 A1 | 10/2014 | Louie et al. |
| 2014/0328128 A1 | 11/2014 | Louie et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0016207 A1 | 1/2015 | Louie et al. |
| 2015/0023105 A1 | 1/2015 | Widjaja et al. |
| 2015/0092486 A1 | 4/2015 | Widjaja |
| 2015/0109860 A1 | 4/2015 | Widjaja |
| 2015/0155284 A1 | 6/2015 | Widjaja |
| 2015/0170743 A1 | 6/2015 | Widjaja |
| 2015/0187776 A1 | 7/2015 | Widjaja |
| 2015/0200005 A1 | 7/2015 | Han et al. |
| 2015/0213892 A1 | 7/2015 | Widjaja |
| 2015/0221650 A1 | 8/2015 | Widjaja et al. |
| 2015/0221653 A1 | 8/2015 | Han et al. |
| 2015/0310917 A1 | 10/2015 | Widjaja |
| 2015/0371707 A1 | 12/2015 | Widjaja |
| 2016/0005741 A1 | 1/2016 | Widjaja |
| 2016/0005750 A1 | 1/2016 | Widjaja |
| 2016/0049190 A1 | 2/2016 | Han et al. |
| 2016/0078921 A1 | 3/2016 | Widjaja et al. |
| 2016/0086655 A1 | 3/2016 | Widjaja |
| 2016/0086954 A1 | 3/2016 | Widjaja et al. |
| 2016/0111158 A1 | 4/2016 | Widjaja |
| 2016/0148674 A1 | 5/2016 | Louie et al. |
| 2016/0148675 A1 | 5/2016 | Louie et al. |
| 2016/0267982 A1 | 9/2016 | Louie et al. |
| 2016/0300613 A1 | 10/2016 | Widjaja |
| 2016/0300841 A1 | 10/2016 | Widjaja |
| 2016/0336326 A1 | 11/2016 | Han et al. |
| 2016/0365444 A1 | 12/2016 | Widjaja |
| 2017/0025164 A1 | 1/2017 | Han et al. |
| 2017/0025534 A1 | 1/2017 | Widjaja |
| 2017/0032842 A1 | 2/2017 | Widjaja |
| 2017/0040326 A1 | 2/2017 | Widjaja |
| 2017/0053919 A1 | 2/2017 | Widjaja et al. |
| 2017/0076784 A1 | 3/2017 | Louie et al. |
| 2017/0092351 A1 | 3/2017 | Han et al. |
| 2017/0092359 A1 | 3/2017 | Louie et al. |
| 2017/0092648 A1 | 3/2017 | Widjaja |
| 2017/0125421 A1 | 5/2017 | Widjaja et al. |
| 2017/0133091 A1 | 5/2017 | Widjaja |
| 2017/0133382 A1 | 5/2017 | Widjaja |
| 2017/0154888 A1 | 6/2017 | Widjaja |
| 2017/0169887 A1 | 6/2017 | Widjaja |
| 2017/0213593 A1 | 7/2017 | Widjaja |
| 2017/0221900 A1 | 8/2017 | Widjaja et al. |
| 2017/0229178 A1 | 8/2017 | Widjaja |
| 2017/0229466 A1 | 8/2017 | Widjaja et al. |
| 2017/0271339 A1 | 9/2017 | Widjaja |
| 2017/0294230 A1 | 10/2017 | Widjaja |
| 2017/0294438 A1 | 10/2017 | Louie et al. |
| 2017/0365340 A1 | 12/2017 | Widjaja |
| 2017/0365607 A1 | 12/2017 | Widjaja |
| 2018/0012646 A1 | 1/2018 | Han et al. |
| 2018/0012893 A1 | 1/2018 | Widjaja et al. |
| 2018/0025780 A1 | 1/2018 | Widjaja |
| 2018/0047731 A1 | 2/2018 | Widjaja |
| 2018/0069008 A1 | 3/2018 | Han et al. |
| 2018/0075907 A1 | 3/2018 | Widjaja |
| 2018/0096721 A1 | 4/2018 | Louie et al. |
| 2018/0122457 A1 | 5/2018 | Han et al. |
| 2018/0122943 A1 | 5/2018 | Han et al. |
| 2018/0158825 A1 | 6/2018 | Widjaja et al. |
| 2018/0158912 A1 | 6/2018 | Han et al. |
| 2018/0166446 A1 | 6/2018 | Widjaja |
| 2018/0174654 A1 | 6/2018 | Widjaja |
| 2018/0182458 A1 | 6/2018 | Widjaja |
| 2018/0182460 A1 | 6/2018 | Widjaja |
| 2018/0204611 A1 | 7/2018 | Louie et al. |
| 2018/0219013 A1 | 8/2018 | Widjaja |
| 2018/0233199 A1 | 8/2018 | Widjaja |
| 2018/0301191 A1 | 10/2018 | Widjaja |
| 2018/0301192 A1 | 10/2018 | Louie et al. |
| 2018/0308848 A1 | 10/2018 | Widjaja et al. |
| 2018/0330790 A1 | 11/2018 | Widjaja |
| 2018/0331109 A1 | 11/2018 | Widjaja |
| 2018/0358360 A1 | 12/2018 | Han et al. |
| 2018/0374854 A1 | 12/2018 | Widjaja |
| 2019/0006367 A1 | 1/2019 | Widjaja |
| 2019/0006516 A1 | 1/2019 | Han et al. |
| 2019/0027220 A1 | 1/2019 | Widjaja |
| 2019/0027476 A1 | 1/2019 | Louie et al. |
| 2019/0043554 A1 | 2/2019 | Han et al. |
| 2019/0066768 A1 | 2/2019 | Han et al. |
| 2019/0067289 A1 | 2/2019 | Widjaja et al. |
| 2019/0080746 A1 | 3/2019 | Louie et al. |
| 2019/0096889 A1 | 3/2019 | Widjaja et al. |
| 2019/0131305 A1 | 5/2019 | Widjaja et al. |
| 2019/0139962 A1 | 5/2019 | Widjaja |
| 2019/0148381 A1 | 5/2019 | Widjaja et al. |
| 2019/0156889 A1 | 5/2019 | Widjaja |
| 2019/0156890 A1 | 5/2019 | Widjaja |
| 2019/0164974 A1 | 5/2019 | Widjaja |
| 2019/0180820 A1 | 6/2019 | Widjaja |
| 2019/0189212 A1 | 6/2019 | Widjaja |
| 2019/0259763 A1 | 8/2019 | Widjaja et al. |
| 2019/0267089 A1 | 8/2019 | Widjaja |
| 2019/0267382 A1 | 8/2019 | Widjaja |
| 2019/0295629 A1 | 9/2019 | Louie et al. |
| 2019/0295646 A1 | 9/2019 | Widjaja |
| 2019/0311769 A1 | 10/2019 | Louie et al. |
| 2019/0355419 A1 | 11/2019 | Widjaja |
| 2020/0013780 A1 | 1/2020 | Widjaja |
| 2020/0013781 A1 | 1/2020 | Widjaja et al. |
| 2020/0035682 A1 | 1/2020 | Han et al. |
| 2020/0051633 A1 | 2/2020 | Widjaja |
| 2020/0075091 A1 | 3/2020 | Louie et al. |
| 2020/0083373 A1 | 3/2020 | Han et al. |
| 2020/0090734 A1 | 3/2020 | Han et al. |
| 2020/0091155 A1 | 3/2020 | Widjaja |
| 2020/0111792 A1 | 4/2020 | Louie et al. |
| 2020/0118627 A1 | 4/2020 | Widjaja |
| 2020/0118628 A1 | 4/2020 | Widjaja |
| 2020/0135863 A1 | 4/2020 | Han et al. |
| 2020/0168267 A1 | 5/2020 | Han et al. |
| 2020/0168609 A1 | 5/2020 | Widjaja et al. |
| 2020/0203346 A1 | 6/2020 | Widjaja |
| 2020/0227415 A1 | 7/2020 | Widjaja et al. |
| 2020/0227478 A1 | 7/2020 | Han et al. |
| 2020/0243529 A1 | 7/2020 | Widjaja et al. |
| 2020/0243530 A1 | 7/2020 | Widjaja |
| 2020/0312855 A1 | 10/2020 | Widjaja |
| 2020/0335156 A1 | 10/2020 | Louie et al. |
| 2020/0335503 A1 | 10/2020 | Widjaja et al. |
| 2020/0342939 A1 | 10/2020 | Widjaja |
| 2020/0411521 A1 | 12/2020 | Widjaja et al. |
| 2021/0005608 A1 | 1/2021 | Widjaja |
| 2021/0050059 A1 | 2/2021 | Widjaja |
| 2021/0057027 A1 | 2/2021 | Louie et al. |
| 2021/0074358 A1 | 3/2021 | Widjaja |
| 2021/0083110 A1 | 3/2021 | Han et al. |
| 2021/0151097 A1 | 5/2021 | Han et al. |
| 2021/0159227 A1 | 5/2021 | Widjaja et al. |
| 2021/0183432 A1 | 6/2021 | Han et al. |
| 2021/0217754 A1 | 7/2021 | Louie et al. |
| 2021/0225844 A1 | 7/2021 | Widjaja et al. |
| 2021/0249078 A1 | 8/2021 | Widjaja |
| 2021/0257025 A1 | 8/2021 | Widjaja |
| 2021/0257365 A1 | 8/2021 | Widjaja |
| 2021/0288051 A1* | 9/2021 | Han ............... G11C 11/404 |
| 2021/0327880 A1 | 10/2021 | Widjaja |
| 2021/0358547 A1 | 11/2021 | Louie et al. |
| 2021/0375870 A1 | 12/2021 | Widjaja |
| 2021/0398981 A1 | 12/2021 | Widjaja |
| 2022/0059537 A1 | 2/2022 | Widjaja et al. |
| 2022/0085168 A1* | 3/2022 | Han ............... H01L 27/1211 |
| 2022/0093175 A1 | 3/2022 | Widjaja |
| 2022/0115061 A1 | 4/2022 | Louie et al. |
| 2022/0130451 A1 | 4/2022 | Han et al. |
| 2022/0199160 A1 | 6/2022 | Widjaja |

(56) References Cited

U.S. PATENT DOCUMENTS

| | | | |
|---|---|---|---|
| 2022/0246205 A1 | 8/2022 | Han et al. |
| 2022/0262430 A1 | 8/2022 | Louie et al. |
| 2022/0262800 A1 | 8/2022 | Widjaja |
| 2022/0278104 A1 | 9/2022 | Widjaja et al. |

OTHER PUBLICATIONS

Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.
Aoulaiche, et al. "Junction Field Effect on the Retention Time for One-Transistor Floating-Body RAM." Electron Devices, IEEE Transactions on, vol. 59, No. 8, 2012, pp. 2167-2172.
Aoulaiche, et al. "Hot hole induced damage in 1T-FBRAM on bulk FinFET." Reliability Physics Symposium (IRPS), 2011 IEEE International. IEEE, 2011, pp. 99-104.
Avci, et al. "Floating-Body Diode—A Novel DRAM Device." Electron Device Letters, IEEE, vol. 33, No. 2, 2012, pp. 161-163.
Bawedin, et al., "Floating-Body SOI Memory: Concepts, Physics, and Challenges", ECS Transactions 19.4 (2009), pp. 243-256.
Ban, et al. "Integration of Back-Gate doping for 15-nm node floating body cell (FBC) memory." VLSI Technology (VLSIT), 2010 Symposium on. IEEE, 2010, pp. 159-160.
Cho, et al. "Variation-aware study of BJT-based capacitorless DRAM cell scaling limit." Silicon Nanoelectronics Workshop (SNW), 2012 IEEE. IEEE, 2012, pp. 1-2.
Cho, et al. "Variation Study and Implications for BJT-Based Thin-Body Capacitorless DRAM." Electron Device Letters, IEEE, vol. 33, No. 3, 2012, pp. 312-314.
Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.
Chiu, et al. "A simple process of thin-film transistor using the trench-oxide layer for improving 1T-DRAM performance." Next-Generation Electronics (ISNE), 2010 International Symposium on. IEEE, 2010, pp. 254-257.
Chun, et al. "A 1.1 V, 667MHz random cycle, asymmetric 2T gain cell embedded DRAM with a 99.9 percentile retention time of 110μsec." VLSI Circuits (VLSIC), 2010 IEEE Symposium on. IEEE, 2010, pp. 191-192.
Chun, et al. "A 667 MHZ Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.
Cao, et al. "A Novel 1T-1D DRAM Cell for Embedded Application." Electron Devices, IEEE Transactions on, vol. 59, No. 5, 2012, pp. 1304-1310.
Collaert, et al. "Substrate bias dependency of sense margin and retention in bulk FinFET 1T-DRAM cells." Solid-State Electronics 65 (2011, pp. 205-210.
Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.
Chatterjee, et al. "Taper isolated dynamic gain RAM cell." Electron Devices Meeting, 1978 International. vol. 24. IEEE, 1978, pp. 698-699.
Chatterjee, et al. Circuit Optimization of the Paper Isolated Dynamic Gain RAM Cell for VLSI Memories, pp. 22-23, 1979.
Chatterjee, et al. "a survey of high-density dynamic RAM cell concepts." Electron Devices, IEEE Transactions on 26.6 (1979): 827-839.
Erb, D. "Stratified charge memory." Solid-State Circuits Conference. Digest of Technical Papers. 1978 IEEE International. vol. 21. IEEE, 1978, pp. 24-25.

Galeti, M., et al. "BJT effect analysis in p-and n-SOI MuGFETs with high-k gate dielectrics and TiN metal gate electrode for a 1T-DRAM application." SOI Conference (SOI), 2011 IEEE International. IEEE, 2011, pp. 1-2.
Gamiz, et al. "3D Trigate 1T-DRAM Memory Cell for 2x nm Nodes." Memory Workshop (IMW), 2012 4th IEEE International. IEEE, 2012, pp. 1-4.
Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.
Giusi, et al. "Bipolar mode operation and scalability of double-gate capacitorless 1T-DRAM cells." Electron Devices, IEEE Transactions on, vol. 57, No. 8 (2010), pp. 1743-1750.
Gupta, et al. "32nm high-density high-speed T-RAM embedded memory technology." Electron Devices Meeting (IEDM), 2010 IEEE International. IEEE, 2010, pp. 12-1.
Han, et al. "Bistable resistor (biristor)-gateless silicon nanowire memory." VLSI Technology (VLSIT), 2010 Symposium on. IEEE, 2010, pp. 171-172.
Han, et al. "Biristor—Bistable resistor based on a silicon nanowire." Electron Device Letters, IEEE 31.8 (2010): 797-799.
Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.
Hwang, et al. "Offset buried metal gate vertical floating body memory technology with excellent retention time for DRAM application." VLSI Technology (VLSIT), 2011 Symposium on. IEEE, 2011, pp. 172-173.
Kim, et al. "Vertical double gate Z-RAM technology with remarkable low voltage operation for DRAM application." VLSI Technology (VLSIT), 2010 Symposium on, 2010, pp. 163-164.
Kim, et al. "Silicon on replacement insulator (SRI) floating body cell (FBC) memory." VLSI Technology (VLSIT), 2010 Symposium on. IEEE, 2010, pp. 165-166.
Kim, et al. "Optical charge-pumping: A universal trap characterization technique for nanoscale floating body devices." VLSI Technology (VLSIT), 2011 Symposium on. IEEE, 2011, pp. 190-191.
Kim, et al. "Investigation of 1T DRAM cell with non-overlap structure and recessed channel." Silicon Nanoelectronics Workshop (SNW), 2010. IEEE, 2010, pp. 1-2.
Kim, et al. Resistive-Memory Embedded Unified RAM (R-URAM, 2009, pp. 2670-2674.
Lu, et al., "A Floating-Body/Gate DRAM Cell Upgraded for Long Retention Time", IEEE Elec. Dev. Letters, vol. 32, No. 6, pp. 731-733, Jun. 2011.
Lu, et al., "A Simplified Superior Floating-Body/Gate DRAM Cell", IEEE Elec. Dev. Letters, vol. 30, No. 3, Mar. 2009, pp. 282-284.
Lee, et al. "A Novel Capacitorless 1T DRAM Cell for Data Retention Time Improvement." Nanotechnology, IEEE Transactions on, vol. 10, No. 3, 2011, pp. 462-466.
Leiss, et al, "dRAM Design Using the Taper-Isolated Dynamic RAM Cell." Solid-State Circuits, IEEE Journal of 17.2 (1982): 337-344.
Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.
Mahatme, et al. "Total ionizing dose effects on ultra thin buried oxide floating body memories." Reliability Physics Symposium (IRPS), 2012 IEEE International, 2012, pp. 1-5.
Moon, et al. "An optically assisted program method for capacitorless 1T-DRAM." Electron Devices, IEEE Transactions on, vol. 57, No. 7, 2010, pp. 1714-1718.
Moon, et al. "Multi-functional universal device using a band-engineered vertical structure." Electron Devices Meeting (IEDM), 2011 IEEE International. IEEE, 2011, pp. 24-26.
Moon, et al. "Fin-width dependence of BJT-based 1T-DRAM implemented on FinFET." Electron Device Letters, vol. 31, No. 9 (2010): 909-911.
Moon, et al. "Ultimately scaled 20nm unified-RAM." Electron Devices Meeting (IEDM), 2010 IEEE International. IEEE, 2010, pp. 12-2.

(56) References Cited

OTHER PUBLICATIONS

Nicoletti, et al. "The Dependence of Retention Time on Gate Length in UTBOX FBRAM With Different Source/Drain Junction Engineering." Electron Device Letters, vol. 33, No. 7, 2012, pp. 940-942.
Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.
Pellizzer et al., A 90nm Phase Change Memory Technology for Stand-Alone Non-Volatile Memory Applications, pp. 1-1, 2006.
Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.
Ranica et al. Scaled 1T-Bulk devices built with CMOS 90nm technology for low-cost eDRAM applications. Pascale. mazoyer@st. com, 2005, 38-39.
Reisch, "On bistable behavior and open-base breakdown of bipolar transistors in the avalanche regime-modeling and applications." Electron Devices, IEEE Transactions on 39.6 (1992): 1398-1409.
Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.
Campardo G. et al., VLSI Design of Non-Volatile Memories, 2005.
Han et al. Programming/Erasing Characteristics of 45 nm NOR-Type Flash Memory Based on SOI FinFET Structure. vol. 47, Nov. 2005, pp. S564-S567.
Headland. Hot electron injection, Feb. 19, 2004.
Lanyon, et al., "Bandgap Narrowing in Moderately to Heavily Doped Silicon", pp. 1014-1018, No. 7, vol. ED-26, 1979.
Lin, et al., A new 1T DRAM Cell with enhanced Floating Body Effect, pp. 1-5, 2006.
Oh, et al., a 4-Bit Double SONOS memory (DSM) with 4 Storage Nodes Per Cell for Ultimate Multi-Bit Operation, pp. 1-2, 2006.
Ohsawa et al., An 18.5ns 128Mb SOI DRAM with a Floating body Cell, IEEE International Solid-State Circuits Conference, 2005, pp. 458-459, 609.
Ohsawa, et al. Autonomous refresh of floating body cell (FBC), 2008, pp. 801-804.
Ohsawa, et al. Autonomous refresh of floating-body cell due to current Anomaly of Impact Ionization, 2009, pp. 2302-2311.
Ohsawa et al., Memory Design Using One-Transistor Gain Cell on SOI, Tech. Digest, IEEE International Solid-State Circuits, vol. 37, No. 11, 2002, pp. 1510-1522.
Ohsawa, et al, "A Novel Capacitor-less DRAM Cell: Floating Body Cell", CRC Press, Taylor & Francis Group, 2012, pp. 1-7.
Okhonin, et al. A Capicitor-Less IT-DRAM Cell, vol. 23, No. 2, Feb. 2002, pp. 85-87.
Okhonin et al. A SOI Capacitor-less 1T-DRAM Concept. 2001, pp. 153-154.
Okhonin, et al., Principles of Transient Charge Pumping on Partially Depleted SOI MOSFETs, IEEE Electron Device Letters, vol. 23, No. 5, May 2002, pp. 279-281.
Rodriguez, et al. "A-RAM: Novel capacitor-less DRAM memory." In SOI Conference, 2009 IEEE International, pp. 1-2. IEEE, 2009.
Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.
Rodriguez, et al. "A-RAM memory cell: concept and operation." Electron Device Letters, IEEE, vol. 31, No. 9 (2010), pp. 972-974.
Robert F. Pierret. Semiconductor Device Fundamentals, ISBN: 0-201-54393-1, 1996, by Addison-Wesley Publishing Company, Inc. PNPN Devices 463-476.
Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.
Rothemund, et al., The importance of being modular, vol. 485, May 2012 pp. 584-585.
Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.
Sakui, K., et al. "A new static memory cell based on the reverse base current effect of bipolar transistors." Electron Devices, IEEE Transactions on 36.6 (1989): 1215-1217.
Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.
Shin, et al. "Vertical-Gate Si/SiGe Double-HBT-Based Capacitor-less 1T DRAM Cell for Extended Retention Time at Low Latch Voltage." Electron Device Letters, vol. 33, No. 2, 2012, pp. 134-136.
Shin, et al. "A novel double HBT-based capacitorless 1T DRAM cell with Si/SiGe heterojunctions." Electron Device Letters, vol. 32, No. 7, 2011, pp. 850-852.
Sze, et al. Physics of Semiconductor Devices, 2007, pp. 1-4.
Tack, et al. "The multistable charge-controlled memory effect in SOI MOS transistors at low temperatures." Electron Devices, IEEE Transactions on 37.5 (1990): 1373-1382.
Terada, et al. "A new VLSI memory cell using capacitance coupling (CC cell)." Electron Devices, IEEE Transactions on 31.9 (1984): pp. 319-1324.
Ventrice, et al. "Analytical model of deeply-scaled thyristors for memory applications." Microelectronics and Electron Devices (WMED), 2012 IEEE Workshop on. IEEE, 2012, pp. 1-4.
Villaret, et al. "Further insight into the physics and modeling of floating-body capacitorless DRAMs." Electron Devices, IEEE Transactions on 52.11 (2005): pp. 2447-2454.
Waser, Rainer, Resistive non-volatile memory devices (Invited Paper), 2009, pp. 1925-1928.
Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.
Yoshida et al., A Design of a Capacitorless 1T-DRAM Cell Using Gate-Induced Drain Leakage (GIDL) Current for Low-power and High-speed Embedded Memory , International Electron Devices Meeting, 2003, pp. 1-4.
Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.
Villaret et al., "Mechanisms of charge modulation in the floating body of triple well nMOSFET capacitor-less DRAMs", Microelectronic Engineering 72 (2004) 434-439.
International Search Report re PCT/US2019/027994, dated Aug. 9, 2019.

* cited by examiner

Cut along gate length

Cut along gate width

Cut along gate length

Cut along gate width

Cut along gate length

Cut along gate width

Cut along gate length

Cut along gate width

MEMORY DEVICE COMPRISING AN ELECTRICALLY FLOATING BODY TRANSISTOR

CROSS-REFERENCE

This application is a continuation of co-pending U.S. Application No. 17/047,623, filed Oct. 14, 2020, which claims the benefit under 35 USC 371(c) of PCT Application No. PCT/US2019/027994, filed 17 Apr. 2019, which claims the benefit of U.S. Provisional Application No. 62/659,628, filed Apr. 18, 2018; U.S. Provisional Application No. 62/661,722, filed Apr. 24, 2018; and U.S. Provisional Application No. 62/678,975, filed May 31, 2018, which applications are each hereby incorporated herein, in their entireties, by reference thereto and to which applications we claim priority under 35 U.S.C. Sections 120, 371 and 119, respectively.

TECHNICAL FIELD

The present invention relates to semiconductor memory technology. More specifically, the present invention relates to a semiconductor memory device comprising of an electrically floating body transistor.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

A DRAM cell without a capacitor has been investigated previously. Such memory eliminates the capacitor used in the conventional 1T/1C memory cell, and thus is easier to scale to smaller feature size. In addition, such memory allows for a smaller cell size compared to the conventional 1T/1C memory cell. Chatterjee et al. have proposed a Taper Isolated DRAM cell concept in "Taper Isolated Dynamic Gain RAM Cell", P. K. Chatterjee et al., pp. 698-699, International Electron Devices Meeting, 1978 ("Chatterjee-1"), "Circuit Optimization of the Taper Isolated Dynamic Gain RAM Cell for VLSI Memories", P. K. Chatterjee et al., pp. 22-23, IEEE International Solid-State Circuits Conference, Feb. 1979 ("Chatterjee-2"), and "dRAM Design Using the Taper-Isolated Dynamic RAM Cell", J. E. Leiss et al., pp. 337-344, IEEE Journal of Solid-State Circuits, vol. SC-17, no. 2, April 1982 ("Leiss"), all of which are hereby incorporated herein, in their entireties, by reference thereto. The holes are stored in a local potential minimum, which looks like a bowling alley, where a potential barrier for stored holes is provided. The channel region of the Taper Isolated DRAM cell contains a deep n-type implant and a shallow p-type implant. As shown in "A Survey of High-Density Dynamic RAM Cell Concepts", P. K. Chatterjee et al., pp. 827-839, IEEE Transactions on Electron Devices, vol. ED-26, no. 6, June 1979 ("Chatterjee-3"), which is hereby incorporated herein, in its entirety, by reference thereto, the deep n-type implant isolates the shallow p-type implant and connects the n-type source and drain regions.

Terada et al. have proposed a Capacitance Coupling (CC) cell in "A New VLSI Memory Cell Using Capacitance Coupling (CC) Cell", K. Terada et al., pp. 1319-1324, IEEE Transactions on Electron Devices, vol. ED-31, no. 9, September 1984 ("Terada"), while Erb has proposed Stratified Charge Memory in "Stratified Charge Memory", D. M. Erb, pp. 24-25, IEEE International Solid-State Circuits Conference, February 1978 ("Erb"), both of which are hereby incorporated herein, in their entireties, by reference thereto.

DRAM based on the electrically floating body effect has been proposed both in silicon-on-insulator (SOI) substrate (see for example "The Multistable Charge-Controlled Memory Effect in SOI Transistors at Low Temperatures", Tack et al., pp. 1373-1382, IEEE Transactions on Electron Devices, vol. 37, May 1990 ("Tack"), "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002, all of which are hereby incorporated herein, in their entireties, by reference thereto) and in bulk silicon (see for example "A one transistor cell on bulk substrate (1T-Bulk) for low-cost and high density eDRAM", R. Ranica et al., pp. 128-129, Digest of Technical Papers, 2004 Symposium on VLSI Technology, June 2004 ("Ranica-1"), "Scaled 1T-Bulk Devices Built with CMOS 90 nm Technology for Low-Cost eDRAM Applications", R. Ranica et al., 2005 Symposium on VLSI Technology, Digest of Technical Papers ("Ranica-2"), "Further Insight Into the Physics and Modeling of Floating-Body Capacitorless DRAMs", A. Villaret et al, pp. 2447-2454, IEEE Transactions on Electron Devices, vol. 52, no. 11, November 2005 ("Villaret"), "Simulation of intrinsic bipolar transistor mechanisms for future capacitor-less eDRAM on bulk substrate", R. Pulicani et al., pp. 966-969, 2010 17th IEEE International Conference on Electronics, Circuits, and Systems (ICECS) ("Pulicani"), all of which are hereby incorporated herein, in their entireties, by reference thereto).

Widjaja and Or-Bach describes a bi-stable SRAM cell incorporating a floating body transistor, where more than one stable state exists for each memory cell (for example as described in U.S. Pat. No. 8,130,548 to Widjaja et al., titled "Semiconductor Memory Having Floating Body Transistor and Method of Operating" ("Widjaja-1"), U.S. Pat. No. 8,077,536, "Method of Operating Semiconductor Memory Device with Floating Body Transistor Using Silicon Controlled Rectifier Principle" ("Widjaja-2"), U.S. Pat. No. 9,230,651, "Memory Device Having Electrically Floating Body Transistor" ("Widjaja-3"), all of which are hereby incorporated herein, in their entireties, by reference thereto). This bi-stability is achieved due to the applied back bias which causes impact ionization and generates holes to compensate for the charge leakage current and recombination.

BRIEF SUMMARY OF THE INVENTION

A semiconductor memory cell comprising an electrically floating body having two stable states is disclosed. A method of operating the memory cell is disclosed.

According to an aspect of the present invention, a semiconductor memory cell is provided that includes: a floating body region configured to be charged to a level indicative of a state of the memory cell selected from at least first and second states; a first region in electrical contact with the floating body region; a second region in electrical contact with said floating body region and spaced apart from the first region; a gate positioned between the first and second regions; a first insulating region located above the floating body region; second insulating regions adjacent to the floating body region on opposite sides of the floating body region; and a well region adjacent to the floating body region and having a different conductivity type from a conductivity type of the floating body region, wherein: the floating body region is bounded by the first insulating region above the floating body region, the second insulating regions adjacent to the floating body region, the well region, and a depletion region formed as a result of an application of a back bias to the semiconductor memory cell.

In at least one embodiment, the application of a back bias results in at least two stable floating body charge levels.

In at least one embodiment, the semiconductor memory cell comprises a fin structure.

In at least one embodiment, the semiconductor memory cell comprises a buried layer region located below the floating body region and the second insulating regions and spaced from the second insulating regions so as not to contact the second insulating regions, wherein: the depletion region is formed as a result of an application of the back bias to the buried layer region.

In at least one embodiment, the depletion region is formed as a result of an application of the back bias to the well region.

In at least one embodiment, the semiconductor memory cell further includes an access transistor; wherein the access transistor comprises the well region, and wherein the well region of the access transistor is electrically connected to the buried layer region.

In at least one embodiment, the well region comprises well regions adjacent to the floating body region on opposite sides of the floating body region.

In at least one embodiment, the well region comprises well regions adjacent to the floating body region on opposite sides of the floating body region; and the well regions are electrically connected to the buried layer region.

According to another aspect of the present invention, a method of operating a semiconductor memory cell includes: providing a memory cell comprising a floating body region configured to be charged to a level indicative of a state of the memory cell selected from at least first and second states; a first region in electrical contact with the floating body region; a second region in electrical contact with the floating body region and spaced apart from the first region; a gate positioned between the first and second regions; a first insulating region located above the floating body region; second insulating regions adjacent to the floating body region on opposite sides of the floating body region; a well region adjacent to the floating body region and having a different conductivity type from a conductivity type of the floating body region: and forming a depletion region by applying a back bias to the memory cell so that the floating body region is bounded by the first insulating region above the floating body region, the second insulating regions adjacent to the floating body region, the well region, and the depletion region.

In at least one embodiment the application of a back bias results in at least two stable floating body charge levels.

In at least one embodiment, the semiconductor memory cell comprises a fin structure.

In at least one embodiment, the application of a back bias comprises applying the back bias to a buried layer region located below the floating body region and the second insulating regions and spaced from the second insulating regions so as not to contact the second insulating regions.

In at least one embodiment, the application of a back bias comprises applying the back bias to the well region.

In at least one embodiment, the memory cell comprises an access transistor; wherein the access transistor comprises the well region, and wherein the well region of the access transistor is electrically connected to the buried layer region.

In at least one embodiment, the well region comprises well regions adjacent to the floating body region on opposite sides of the floating body region.

In at least one embodiment, the well region comprises well regions adjacent to the floating body region on opposite sides of the floating body region; and the well regions are electrically connected to the buried layer region.

According to another aspect of the present invention, a semiconductor memory cell includes: a bi-stable floating body transistor comprising a back-bias region configured to generate impact ionization when the memory cell is in one of first and second states, and wherein the back-bias region is configured so as not to generate impact ionization when the memory cell is in the other of the first and second states; an access device; and a non-volatile memory comprising a resistance change element; wherein the bi-stable floating body transistor and the access device are electrically connected in series; and wherein the bi-stable floating body transistor and the non-volatile memory element are electrically connected in series.

In at least one embodiment, the non-volatile memory is configured to store data upon transfer from the bi-stable floating body transistor.

In at least one embodiment, the non-volatile memory is configured to restore data to the floating body transistor.

In at least one embodiment, the non-volatile memory is reset to an initial state after restoring data to the floating body transistor.

According to another aspect of the present invention, a semiconductor memory cell includes: a bi-stable floating body transistor comprising a back-bias region configured to generate impact ionization when the memory cell is in one of first and second states, and wherein the back-bias region is configured so as not to generate impact ionization when the memory cell is in the other of the first and second states; an access device; and a non-volatile memory comprising a resistance change element; wherein the bi-stable floating body transistor stores data when power is applied to the memory cell; and wherein the non-volatile memory stores data when power is discontinued from the memory cell.

In at least one embodiment, the non-volatile memory is configured to store data upon transfer from the floating body transistor.

In at least one embodiment, the non-volatile memory is configured to restore data to the floating body transistor.

In at least one embodiment, the non-volatile memory is reset to an initial state after restoring data to the floating body transistor.

According to another aspect of the present invention, a memory cell array includes: a plurality of semiconductor memory cells arranged in at least one row and a plurality of columns or at least one column and a plurality of rows of the semiconductor memory cells, each semiconductor memory cell comprising: a floating body region configured to be charged to a level indicative of a state of the memory cell selected from at least first and second states; a first region in electrical contact with the floating body region; a second region in electrical contact with the floating body region and spaced apart from the first region; a gate positioned between the first and second regions; a first insulating region located above the floating body region; second insulating regions adjacent to the floating body region; and a well region adjacent to the floating body region and having a different conductivity type from a conductivity type of the floating body region, wherein the floating body region is bounded by the first insulating region above the floating body region, the second insulating regions adjacent to the floating body region, the well region, and a depletion region formed as a result of an application of a back bias to the semiconductor memory cell; and wherein the well region is continuously connected in at least one of a direction along which the column extends and a direction along which the row extends.

In at least one embodiment, the application of a back bias results in at least two stable floating body charge levels.

In at least one embodiment, the semiconductor memory cell comprises a fin structure.

In at least one embodiment, the semiconductor memory cell comprises a buried layer region located below the floating body region and the second insulating regions and spaced from the second insulating regions so as not to contact the second insulating regions, wherein: the depletion region is formed as a result of an application of the back bias to the buried layer region.

In at least one embodiment, the depletion region is formed as a result of an application of the back bias to the well region.

In at least one embodiment, the semiconductor memory array further comprises an access transistor; wherein the access transistor comprises the well region, and wherein the well region of the access transistor is electrically connected to the buried layer region.

In at least one embodiment, the well region comprises well regions adjacent to the floating body region on opposite sides of the floating body region.

In at least one embodiment, the well region comprises well regions adjacent to the floating body region on opposite sides of the floating body region; and the well regions are electrically connected to the buried layer region.

According to another aspect of the present invention, a memory cell array includes: a plurality of semiconductor memory cells arranged in at least one row and a plurality of columns or at least one column and a plurality of rows of the semiconductor memory cells; each semiconductor memory cell comprising: a floating body region configured to be charged to a level indicative of a state of the memory cell selected from at least first and second states; a first region in electrical contact with the floating body region; a second region in electrical contact with the floating body region and spaced apart from the first region; a gate positioned between the first and second regions; a first insulating region located above the floating body region; second insulating regions adjacent to the floating body region; and a well region adjacent to the floating body region and having a different conductivity type from a conductivity type of the floating body region; wherein the floating body region is bounded by the first insulating region above the floating body region, the second insulating regions adjacent to the floating body region, the well region, and a depletion region formed as a result of an application of a back bias to the semiconductor memory cell; and wherein the application of a back bias generates impact ionization when the memory cell is in one of first and second states, and wherein the application of a back bias does not generate impact ionization when the memory cell is in the other of the first and second states.

In at least one embodiment, the application of a back bias results in at least two stable floating body charge levels.

In at least one embodiment, each semiconductor memory cell includes a fin structure.

In at least one embodiment, each semiconductor memory cell comprises a buried layer region located below the floating body region and the second insulating regions and spaced from the second insulating regions so as not to contact the second insulating regions, wherein: the depletion region is formed as a result of an application of the back bias to the buried layer region.

In at least one embodiment, the depletion region is formed as a result of an application of the back bias to the well region.

In at least one embodiment, the each semiconductor memory cell further includes an access transistor; wherein the access transistor comprises the well region, and wherein the well region of the access transistor is electrically connected to the buried layer region.

In at least one embodiment, the well region comprises well regions adjacent to the floating body region on opposite sides of the floating body region.

In at least one embodiment, the well region comprises well regions adjacent to the floating body region on opposite sides of the floating body region, and the well regions are electrically connected to the buried layer region.

According to another aspect of the present invention, a memory cell array includes: a plurality of semiconductor memory cells arranged in at least one row and a plurality of columns or at least one column and a plurality of rows of the semiconductor memory cells; each semiconductor memory cell comprising: a memory transistor comprising: a floating body region configured to be charged to a level indicative of a state of the memory cell selected from at least first and second states; a first region in electrical contact with the floating body region; a second region in electrical contact with the floating body region and spaced apart from the first region; a gate positioned between the first and second regions; a first insulating region located above the floating body region; second insulating regions adjacent to the floating body region; and a buried layer region located below the floating body region and the second insulating regions and spaced from the second insulating regions so as not to contact the second insulating regions. Each semiconductor memory cell further includes an access transistor comprising a well region; wherein the well region is adjacent to the floating body region and has a different conductivity type from a conductivity type of the floating body region of the memory transistor; wherein the buried layer regions are located below the floating body regions.

In at least one embodiment, the buried layer regions are continuously connected in at least one of a direction along which the column extends and a direction along which the row extends.

In at least one embodiment, the buried layer regions are connected in both directions along which the column and row extend.

In at least one embodiment, the buried layer regions are discontinuous in one of the directions along which the column and row extend.

In at least one embodiment, the array further includes an access select word line configured to select the access transistor through the well region.

According to another aspect of the present invention, an integrated circuit includes: a memory cell array comprising: a plurality of semiconductor memory cells arranged in at least one row and a plurality of columns or at least one column and a plurality of rows of the semiconductor memory cells; each semiconductor memory cell comprising: a floating body region configured to be charged to a level indicative of a state of the memory cell selected from at least first and second states; a first region in electrical contact with the floating body region; a second region in electrical contact with the floating body region and spaced apart from the first region; a gate positioned between the first and second regions; a first insulating region located above the floating body region; second insulating regions adjacent to the floating body region; and a well region adjacent to the floating body region and having a different conductivity type from a conductivity type of the floating body region; wherein the floating body region is bounded by the first insulating region above the floating body region, the second insulating regions adjacent to the floating body region, the well region, and a depletion region formed as a result of an application of a back bias to the semiconductor memory cell; wherein the well region is continuously connected in at least one of a direction along which the column extends and a direction along which the row extends. The integrated circuit further includes a control circuit to apply the back bias to the semiconductor memory cell.

In at least one embodiment, the application of a back bias results in at least two stable floating body charge levels.

In at least one embodiment, each semiconductor memory cell comprises a fin structure.

In at least one embodiment, each semiconductor memory cell comprises a buried layer region located below the floating body region and the second insulating regions and spaced from the second insulating regions so as not to contact the second insulating regions, wherein: the depletion region is formed as a result of an application of the back bias to the buried layer region.

In at least one embodiment, the depletion region is formed as a result of an application of the back bias to the well region.

In at least one embodiment, the memory cells each further include an access transistor; wherein the access transistor comprises the well region, and wherein the well region of the access transistor is electrically connected to the buried layer region.

In at least one embodiment, the well region comprises well regions adjacent to the floating body region on opposite sides of the floating body region.

In at least one embodiment, the well region comprises well regions adjacent to the floating body region on opposite sides of the floating body region, and the well regions are electrically connected to the buried layer region.

According to another aspect of the present invention, an integrated circuit includes: a memory cell array comprising: a plurality of semiconductor memory cells arranged in at least one row and a plurality of columns or at least one column and a plurality of rows of the semiconductor memory cells; each semiconductor memory cell comprising: a floating body region configured to be charged to a level indicative of a state of the memory cell selected from at least first and second states; a first region in electrical contact with the floating body region; a second region in electrical contact with the floating body region and spaced apart from the first region; a gate positioned between the first and second regions; a first insulating region located above the floating body region; second insulating regions adjacent to the floating body region; and a well region adjacent to the floating body region and having a different conductivity type from a conductivity type of the floating body region; wherein the floating body region is bounded by the first insulating region above the floating body region, the second insulating regions adjacent to the floating body region, the well region, and a depletion region formed as a result of an application of a back bias to the semiconductor memory cell; wherein the application of a back bias generates impact ionization when the memory cell is in one of first and second states, and wherein the application of a back bias does not generate impact ionization when the memory cell is in the other of the first and second states. The integrated circuit further includes a control circuit to apply the back bias to the semiconductor memory cell.

In at least one embodiment, the application of a back bias results in at least two stable floating body charge levels.

In at least one embodiment, each semiconductor memory cell comprises a fin structure.

In at least one embodiment, each semiconductor memory cell comprises a buried layer region located below the floating body region and the second insulating regions and spaced from the second insulating regions so as not to contact the second insulating regions, wherein: the depletion region is formed as a result of an application of the back bias to the buried layer region.

In at least one embodiment, the depletion region is formed as a result of an application of the back bias to the well region.

In at least one embodiment, each memory cell further includes an access transistor; wherein the access transistor comprises the well region, and wherein the well region of the access transistor is electrically connected to the buried layer region.

In at least one embodiment, the well region comprises well regions adjacent to the floating body region on opposite sides of the floating body region.

In at least one embodiment, the well region comprises well regions adjacent to the floating body region on opposite sides of the floating body region, and the well regions are electrically connected to the buried layer region.

According to another aspect of the present invention, an integrated circuit includes: a memory cell array comprising: a plurality of semiconductor memory cells arranged in at least one row and a plurality of columns or at least one column and a plurality of rows of the semiconductor memory cells; each semiconductor memory cell comprising: a memory transistor comprising: a floating body region configured to be charged to a level indicative of a state of the memory cell selected from at least first and second states; a first region in electrical contact with the floating body region; a second region in electrical contact with the floating body region and spaced apart from the first region; a gate positioned between the first and second regions; a first insulating region located above the floating body region; second insulating regions adjacent to the floating body region; and a buried layer region located below the floating body region and the second insulating regions and spaced from the second insulating regions so as not to contact the second insulating regions; and an access transistor comprising a well region, wherein the well region is adjacent to the floating body region and has a different conductivity type from a conductivity type of the floating body region of the memory transistor; wherein the buried layer regions are located below the floating body regions; and a control circuit configured to access a selected memory cell and perform a read or write operation on the selected memory cell.

In at least one embodiment, the buried layer regions are continuously connected in at least one of a direction along which the column extends and a direction along which the row extends.

In at least one embodiment, the buried layer regions are connected in both directions along which the column and row extend.

In at least one embodiment, the buried layer regions are discontinuous in one of the directions along which the column and row extend.

In at least one embodiment, the integrated circuit further includes an access select word line configured to select the access transistor through the well region.

These and other advantages and features of the invention will become apparent to those persons skilled in the art upon reading the details of the memory cells, arrays, integrated circuits and methods as more fully described below.

DETAILED DESCRIPTION OF THE INVENTION

Figure 1:
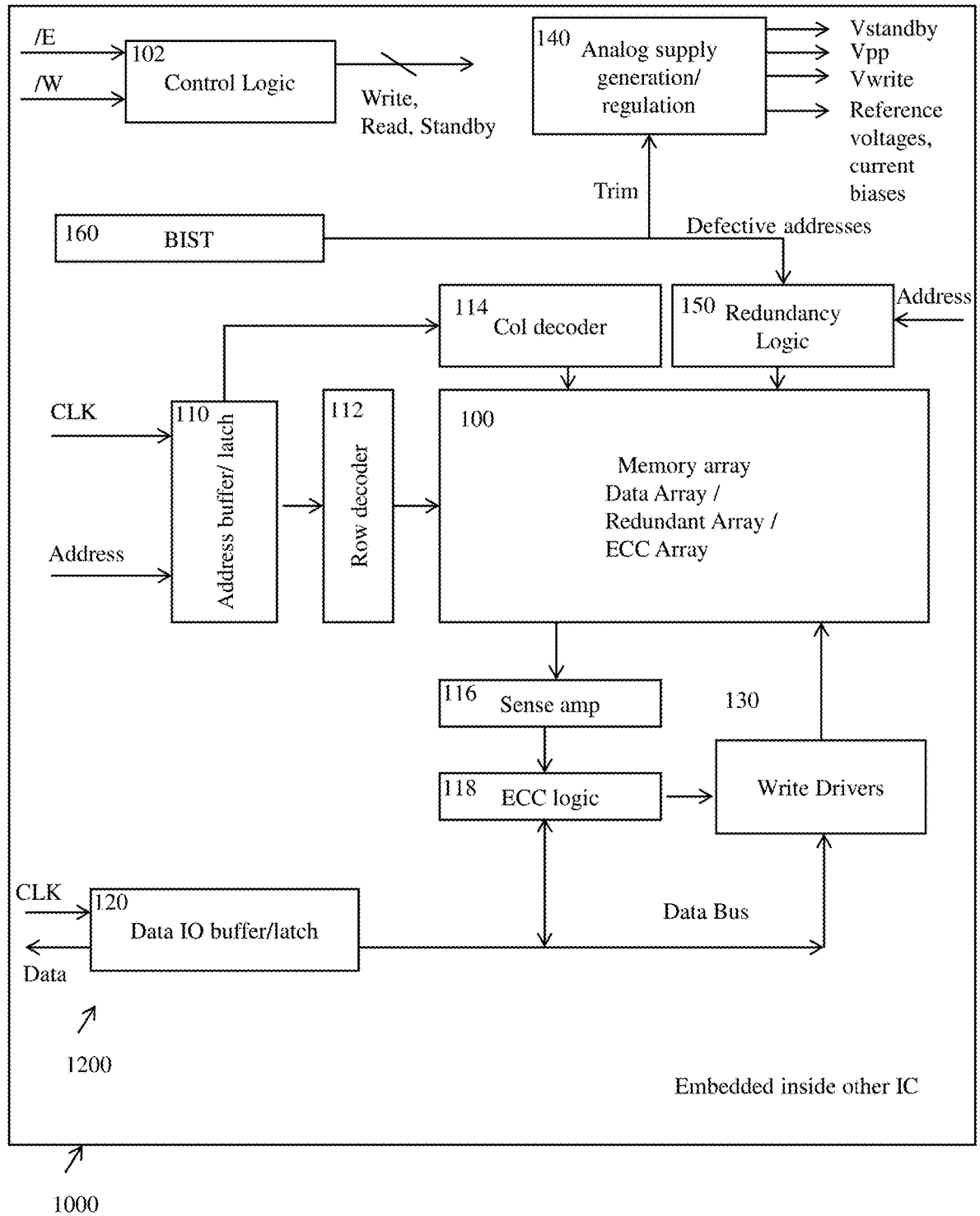
FIG. 1 is a block diagram for a memory instance.

Before the present memory cells, arrays and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a memory cell" includes a plurality of such memory cells and reference to "the region" includes reference to one or more regions and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

The phrases "stable floating body charge level" or "stable charge level", as used herein, refer to the floating body charge level where the amount of holes (or electrons) injected into the floating body region (for example, as a result of holes generated through impact ionization mechanism) compensates for the charge loss out of the floating body region (for example due to p-n junction forward bias current or due to charge recombination). At a stable floating body charge level, a floating body memory cell will maintain the charge stored in the floating body region.

"Bi-stable memory cell" or "bi-stable", as used herein, refers to a memory cell having two stable states. For example, a bi-stable floating body memory cell has two stable floating body charge levels, where the amount of holes (or electrons) injected into the floating body region compensates for the charge loss out of the floating body region (for example due to p-n junction forward bias current or due to charge recombination).

FIG. 1 illustrates a memory instance 1200, comprising memory array 100 and periphery circuitries associated with the memory array 100. Examples of the periphery circuitries are shown in FIG. 1: control logic 102 which receives for example enable (/E) and write (/W) signals and controls the operation of the memory array; address buffer 110, which transmits the address received to row decoder 112 and column decoder 114; reading circuitry such as sense amplifier 116 and error correction circuit (ECC) 118; data buffer 120, which outputs the read data or transmits the write data into write drivers 130; analog supply generators and/or regulators 140 which provide additional voltage levels needed for the memory array operation; redundancy logic 150 which may be used to increase the yield of the memory instance; built-in-self-test (BIST) 160 which may be used to set the trim levels for the supply generators 140 and/or replace the defective units with redundant array. The BIST 160 may sense the chip temperature and trim the voltage levels of the supply generator according to the temperature. The memory instance 1200 may be a discrete memory component or it may be embedded inside another integrated circuit device 1000.

Figure 2:
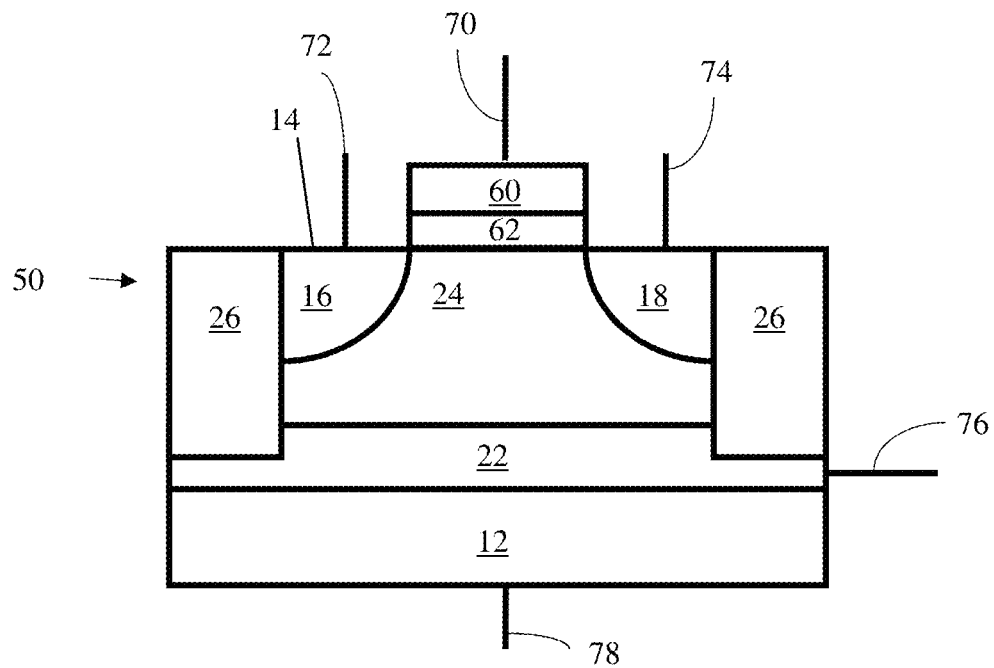
FIGS. 2 and 3 schematically illustrate cross-sectional views of a memory cell according to an embodiment of the present invention.

Referring to FIG. 2, a memory cell 50 according to an embodiment of the present invention is shown. A plurality of memory cells 50 (or any of the other memory cells described herein) may be used to constitute memory array 100 as shown in FIG. 1. Memory cell 50 includes a substrate 12 of a first conductivity type such as p-type, for example. Substrate 12 is typically made of silicon, but may also comprise, for example, germanium, silicon germanium, gallium arsenide, carbon nanotubes, and/or other semiconductor materials. In some embodiments of the invention, substrate 12 can be the bulk material of the semiconductor wafer. In another embodiment shown in FIG. 3, substrate 12A of a first conductivity type (for example, p-type) can be a well of the first conductivity type embedded in a well 29 of a second conductivity type, such as n-type. The well 29 in turn can be another well inside substrate 12B of the first conductivity type (for example, p-type). In another embodiment, well 12A can be embedded inside the bulk of the semiconductor wafer of the second conductivity type (for example, n-type). These arrangements allow for segmentation of the substrate terminal 78, which is connected to region 12A. To simplify the description, the substrate 12 will usually be drawn as the semiconductor bulk material as it is in FIG. 2.

Memory cell 50 also includes a buried layer region 22 of a second conductivity type, such as n-type, for example; a floating body region 24 of the first conductivity type, such as p-type, for example; and source/drain regions 16 and 18 of the second conductivity type, such as n-type, for example.

Buried layer 22 may be formed by an ion implantation process on the material of substrate 12. Alternatively, buried layer 22 can be grown epitaxially on top of substrate 12 or formed through a solid state diffusion process.

The floating body region 24 of the first conductivity type is bounded on top by source line region 16, drain region 18, and insulating layer 62 (or by surface 14 in general), on the sides by insulating layer 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

A source line region 16 having a second conductivity type, such as n-type, for example, is provided in floating body region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A bit line region 18, also referred to as drain region 18, having a second conductivity type, such as n-type, for example, is also provided in floating body region 24, so as to bound a portion of the top of the floating body region in a manner discussed above, and is exposed at cell surface 14. Bit line region 18 may be formed by an implantation process on the material making up substrate 12, according to any implantation process known and typically used in the art. Alternatively, a solid state diffusion or a selective epitaxial growth process could be used to form bit line region 18.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Figure 3:
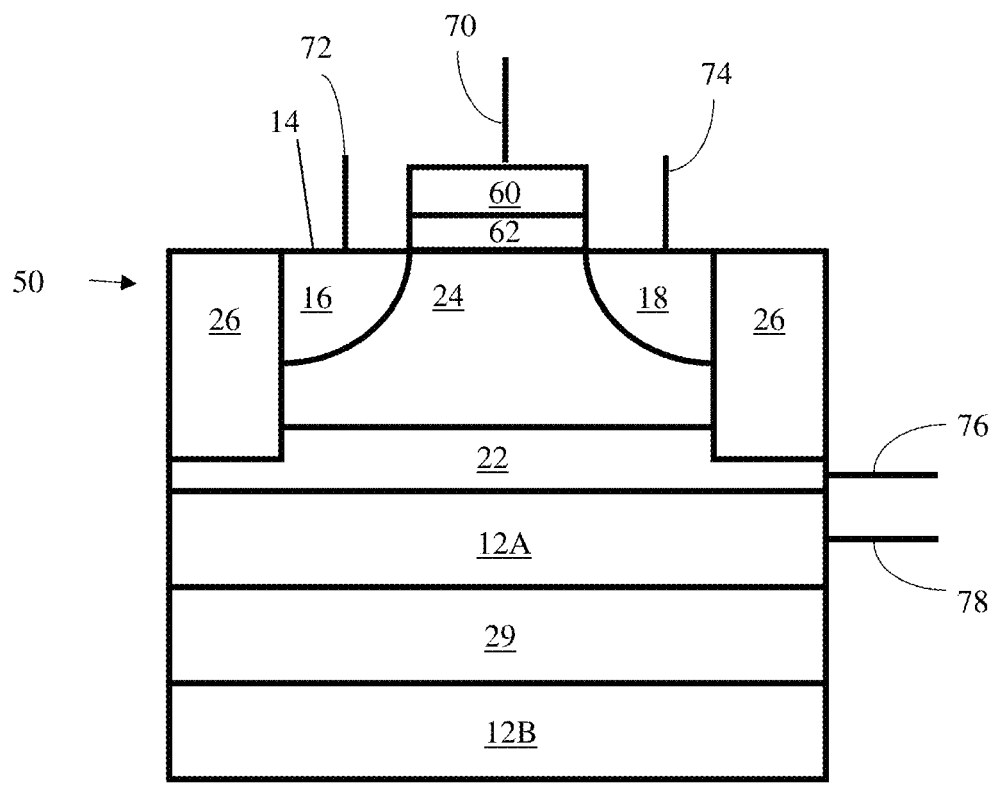
Figure 4A:
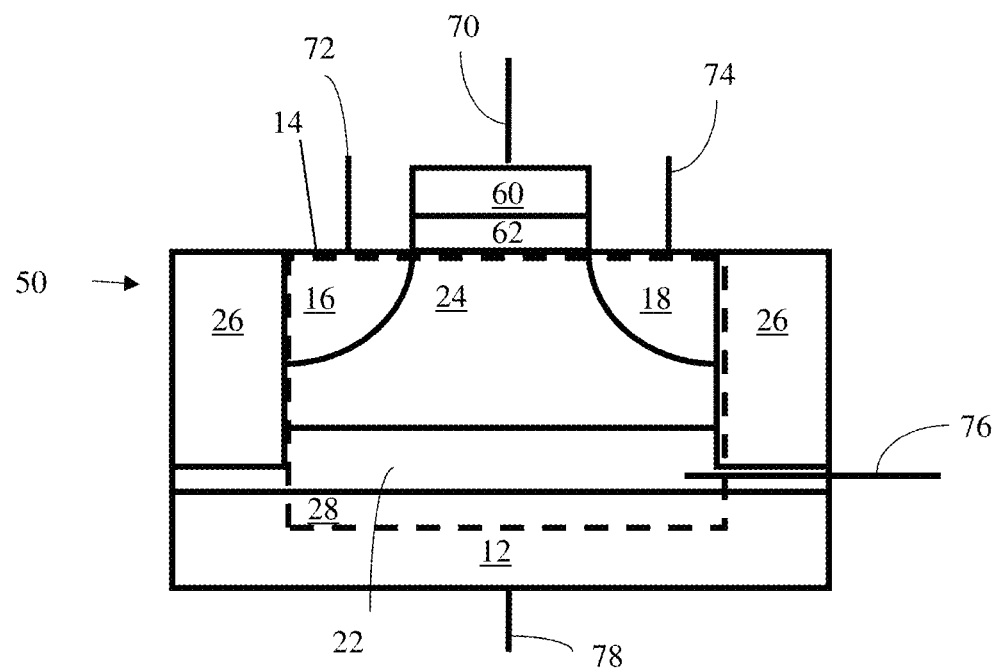
FIG. 4A is a schematic, cross-sectional illustration of a memory cell according to another embodiment of the present invention.
Figure 4B:
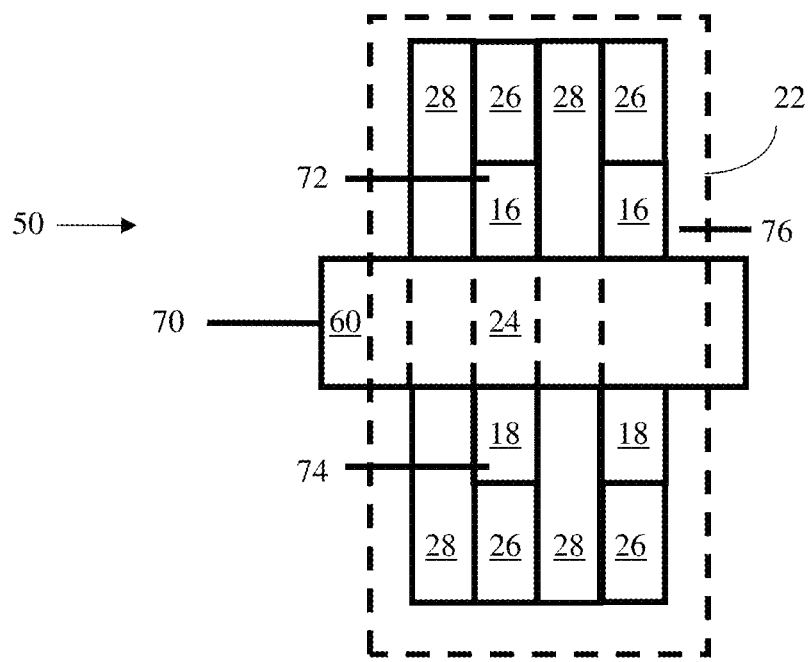
FIG. 4B is a schematic, top-view illustration of the memory cell shown in FIG. 4A.

Insulating layers 26 (like, for example, shallow trench isolation (STI)), may be made of silicon oxide, for example, though other insulating materials may be used. Insulating layers 26 insulate memory cell 50 from adjacent memory cell 50. The bottom of insulating layer 26 may reside inside the buried region 22 allowing buried region 22 to be continuous as shown in FIGS. 2 and 3. Alternatively, the memory device may have two different insulating layers 26 and 28 (like, for example, shallow trench isolation (STI) and deep trench isolation (DTI). As illustrated in FIGS. 4A and 4B, the bottom of insulating layer 26 may reside inside the buried region 22, allowing buried region 22 to be continuous in the bilateral direction of the cross-sectional view shown in FIG. 4A, while the bottom of the insulating layer 28 may reside below the buried layer 22.

Cell 50 includes several terminals: word line (WL) terminal 70 electrically connected to gate 60, bit line (BL) terminal 74 electrically connected to bit line region 18, source line (SL) terminal 72 electrically connected to source line region 16, buried well (BW) terminal 76 electrically connected to buried layer 22, and substrate terminal 78 electrically connected to the substrate 12. Alternatively, the SL terminal 72 may be electrically connected to region 18 and BL terminal 74 may be electrically connected to region 16.

Several operations can be performed by memory cell 50 such as holding, read, write logic-1 and write logic-0 operations, and have been described in U.S. Pat. No. 9,230,651 to Widjaja et al., titled "Memory Device Having Floating Body Transistor" ("Widjaja-3") and U.S. Pat. No. 8,077,536, "Method of Operating Semiconductor Memory Device with Floating Body Transistor Using Silicon Controlled Rectifier Principle" ("Widjaja-2"), which are both hereby incorporated herein, in their entireties, by reference thereto.

Figure 5A:
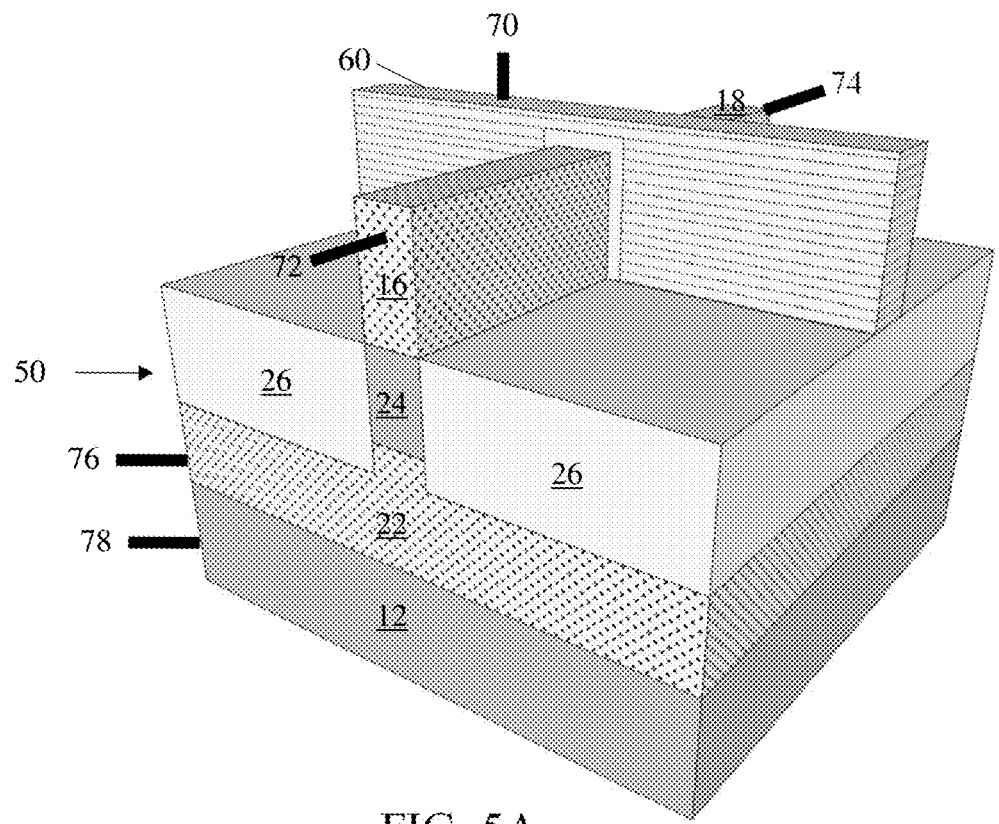
FIGS. 5A and 5B are schematic, three-dimensional view of a memory cell having a fin structure according to an embodiment of the present invention.
Figure 5B:
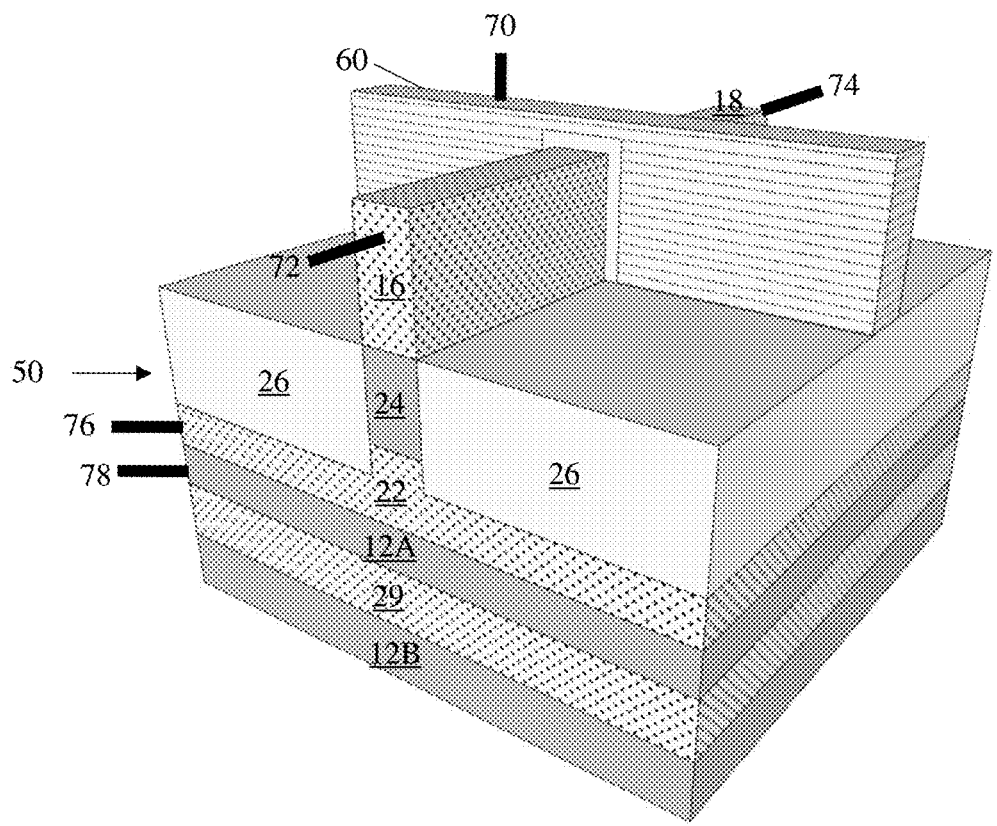

FIGS. 5A and 5B illustrate schematic three-dimensional views of memory cell 50 having a fin structure according to another embodiment of the present invention. Memory cell 50 has a fin structure fabricated on substrate 12 of a first conductivity type such as p-type for example, so as to extend from the surface of the substrate to form a three-dimensional structure, with fin extending substantially perpendicular to and above the top surface of the substrate 12. The fin structure is semiconductive and is built on buried well layer 22 of a second conductivity type such as n-type for example, which is itself built on top of substrate 12. Alternatively, buried well 22 could be a diffusion region inside substrate 12 with the rest of the fin constructed above it, or buried well 22 could be a conductive layer on top of substrate 12 connected to all the other fin structures in a manner similar to memory cell 50 described above. The fin is typically made of silicon, but may comprise germanium, silicon germanium, gallium arsenide, carbon nanotubes, or other semiconductor materials known in the art. In other embodiments, substrate 12A can be a well of the first conductivity type embedded in either a well 29 of the second conductivity type or, alternatively, in the bulk of the semiconductor wafer of the second conductivity type, such as n-type, for example as shown in FIG. 5B. To simplify the description, the substrate 12 will usually be drawn as the semiconductor bulk material as it is in FIG. 5A.

Figure 6A:
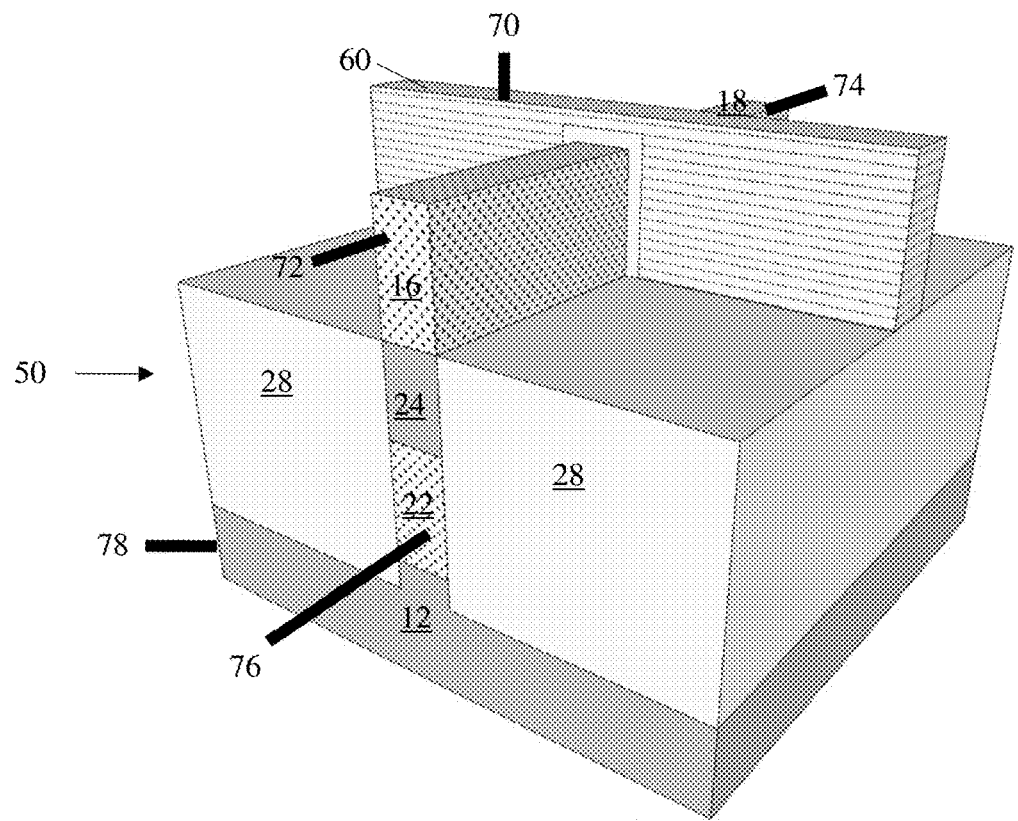
FIG. 6A is schematic, three-dimensional view of a memory cell having a fin structure according to an embodiment of the present invention.
Figure 6B:
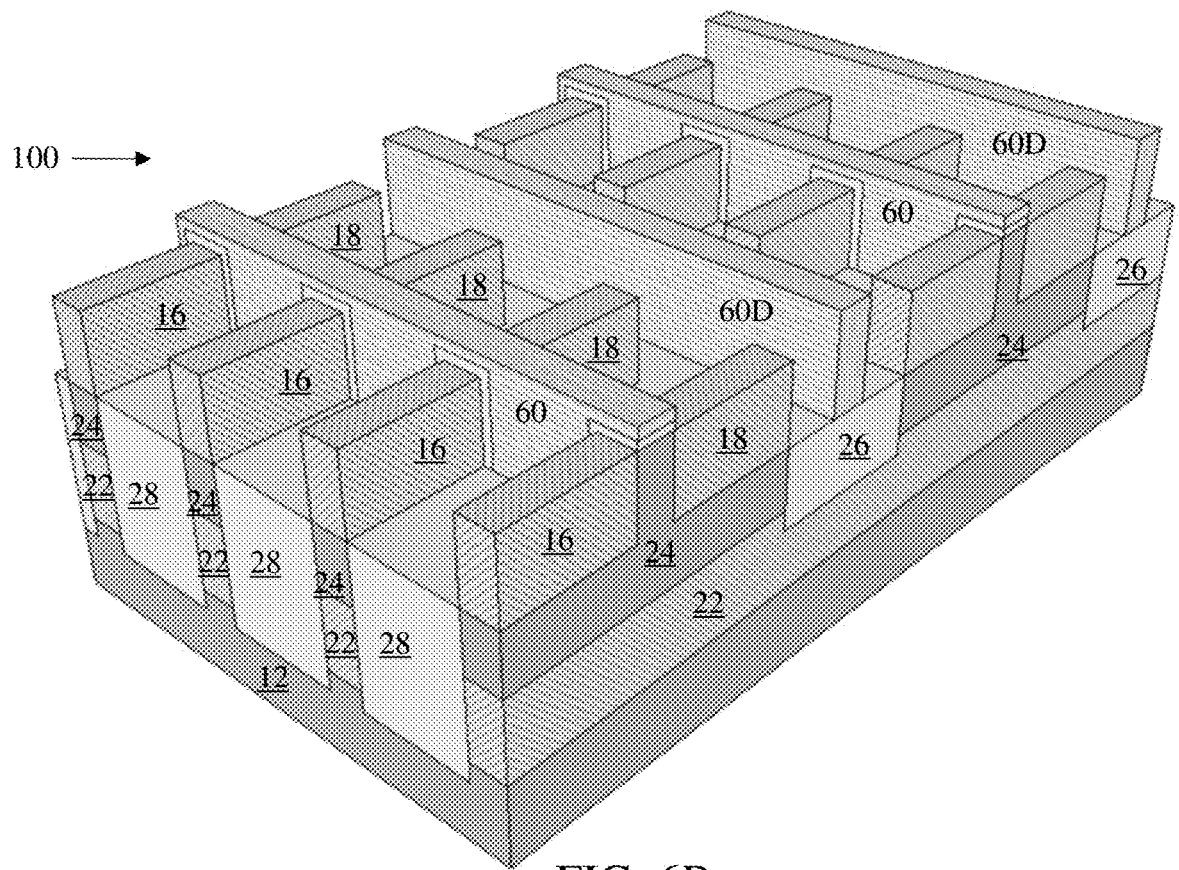
FIG. 6B is schematic, three-dimensional view of a memory cell array having a fin structure according to an embodiment of the present invention.

FIGS. 6A and 6B illustrate schematic three-dimensional views of memory cell 50 having a fin structure and array of the memory cell array 100, respectively, according to another embodiment of the present invention. The memory cell 50 having a fin structure is an example of fin type device shown in FIGS. 4A and 4B. The memory cell 50 may include dual depth insulating layers; insulating layer 26 like shallow trench isolation (STI) and insulating layer 28 like deep trench isolation (DTI). Insulating layers 26 insulate memory cell 50 from adjacent memory cell 50. The bottom of insulating layer 26 resides inside the buried region 22 allowing buried region 22 to be continuous as shown in FIG. 6B. The bottom of the insulating layer 28 resides below the buried layer 22. As a result, the buried layer 22 becomes continuous along the channel length direction but electrically decoupled along the gate 60 direction so that each buried layer along the channel length direction may have independent bias.

Figure 7:
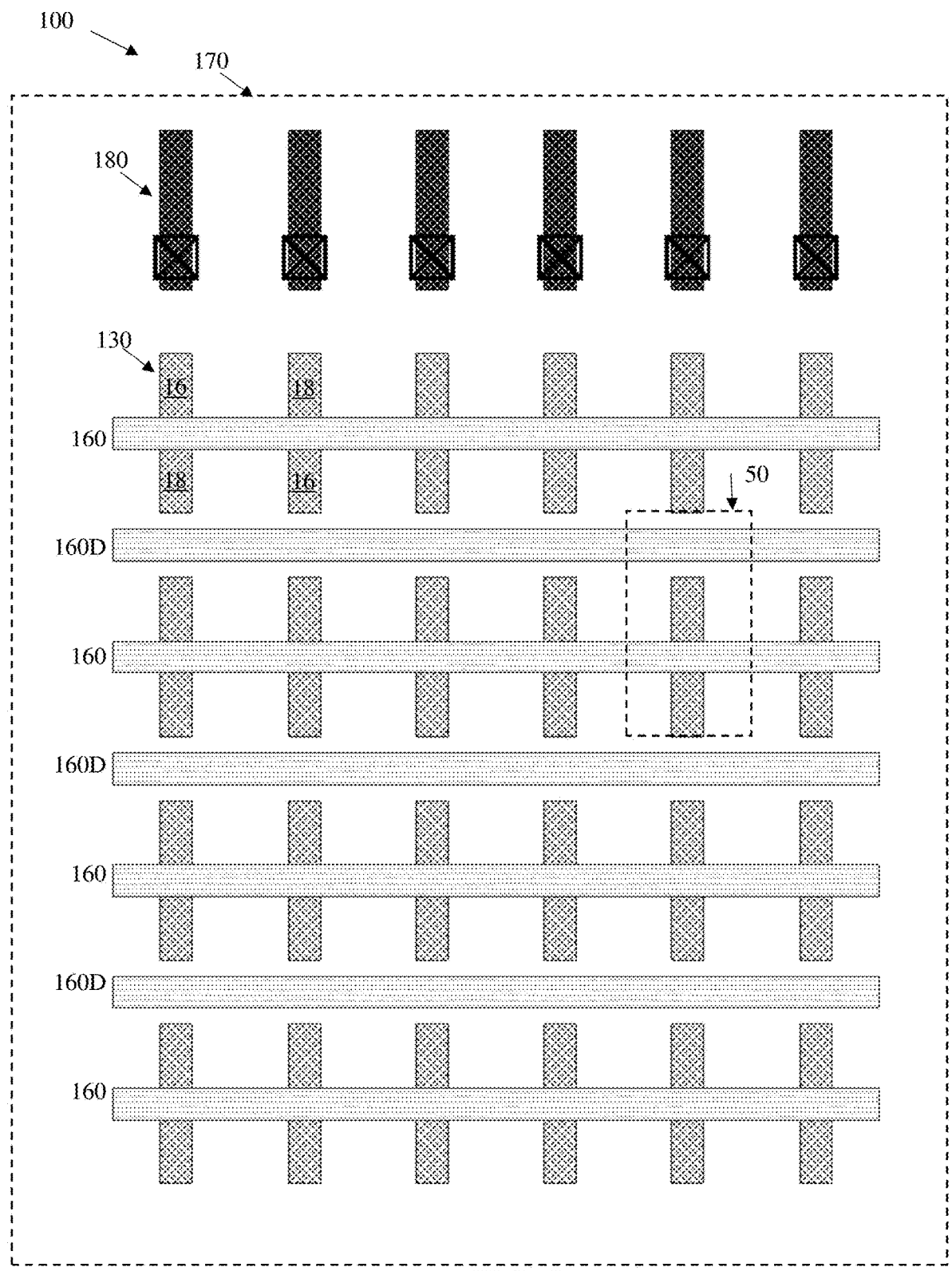
FIG. 7 schematically illustrates a layout view of a memory array illustrated in FIG. 6B according to an embodiment of the present invention.

FIG. 7 illustrates a layout view of memory array 100 according to another embodiment of the present invention. The memory array 100 is located within the buried well region 170 layer. The memory array 100 includes additional dummy POLY layers 160D which are located on the field oxide region. In another embodiment, two dummy POLY layers 160D may be used per every field region (not drawn). For the case of double dummy POLY layers, the dummy POLY layers may partially overlay a DIFF region 130. The dummy layer 160D for example may be a result of restrictive design rules (which guides the layout drawing of the layers) for better lithography patterning process. To simplify the description, the single dummy POLY layer 160D will usually be drawn hereinafter as it is in FIG. 7. The DIFF layers 130 define the active regions of the memory cell (regions between the insulating layers 26 and 28 shown in the cross-sectional view in FIG. 4A). Alternatively, the DIFF layers 130 may define the fin of the memory cell 50. The DIFF layers 130 may be formed by two step processes. A mandrel layer is a long line pattern, where the layers in between the mandrel layers define the insulating layer 28 such as deep trench isolation. Then, a fin cut layer follows, where the layer in between the fin cut layers define the insulating layer 26 such as shallow trench isolation. The POLY layers 160 and dummy POLY layers 160D define the gate region 60 shown in the cross-sectional view of FIG. 4A. As shown in FIG. 7, the unit cell of the memory cell 50 comprises two POLY160 regions; one 160D to define the dummy region and another 160 to define the transistor region fully overlapping with DIFF layer 130. The overlap between POLY 160 and DIFF 130 layers form the channel region of the memory cell 50, for example the region beneath gate region 60 and dielectric layer 62, between the source line region 16 and bit line region 18 shown in FIG. 2. The memory array 100 may include a buried well layer tap 180. The buried well layer tap 180 is formed on DIFF 130 layer while it may be doped by a second conductivity type, such as n-type, the same as a buried layer region 22. The buried well layer taps 180 are formed at perimeter of the memory array 100 or the memory sub-array 100 such as at the top or bottom of the array. Each buried well layer tap 180 connects to its own buried layer 22 and the buried layer 22 voltages are independently controlled through respective buried well layer tap 180.

According to one embodiment of the present invention, the memory cell array 100 as shown in FIG. 7 is configured for a unit memory cell consisting of two transistors; one for floating body memory cell transistor and one for non-floating body access transistor through independent buried well biasing scheme based on the dual depth insulating layer technology as outlined in FIGS. 4A-4B and FIGS. 6A-6B.

Figure 8A:
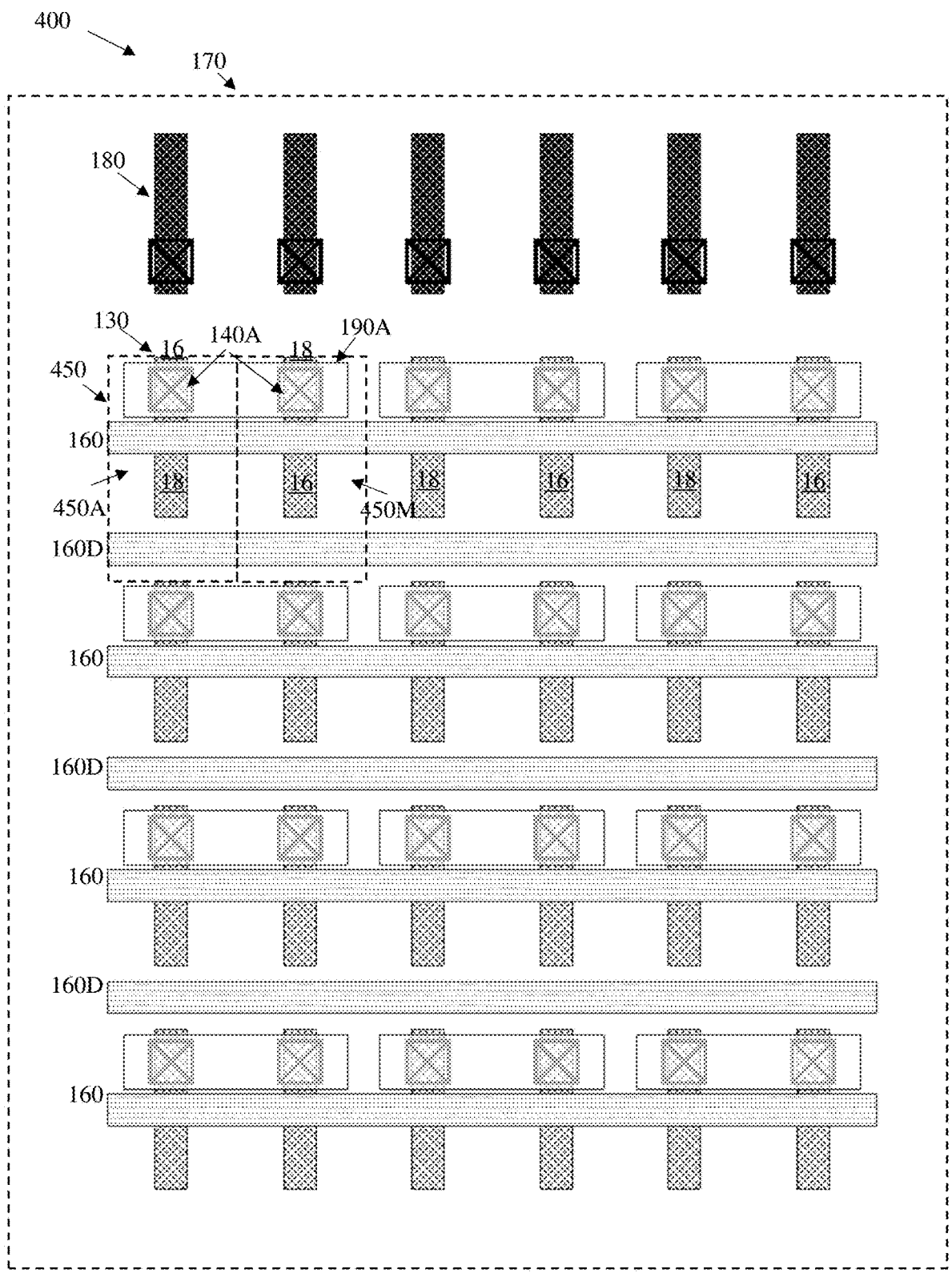
FIGS. 8A and 8B schematically illustrate a layout view of a memory array illustrated in FIG. 6B according to an embodiment of the present invention.
Figure 8B:
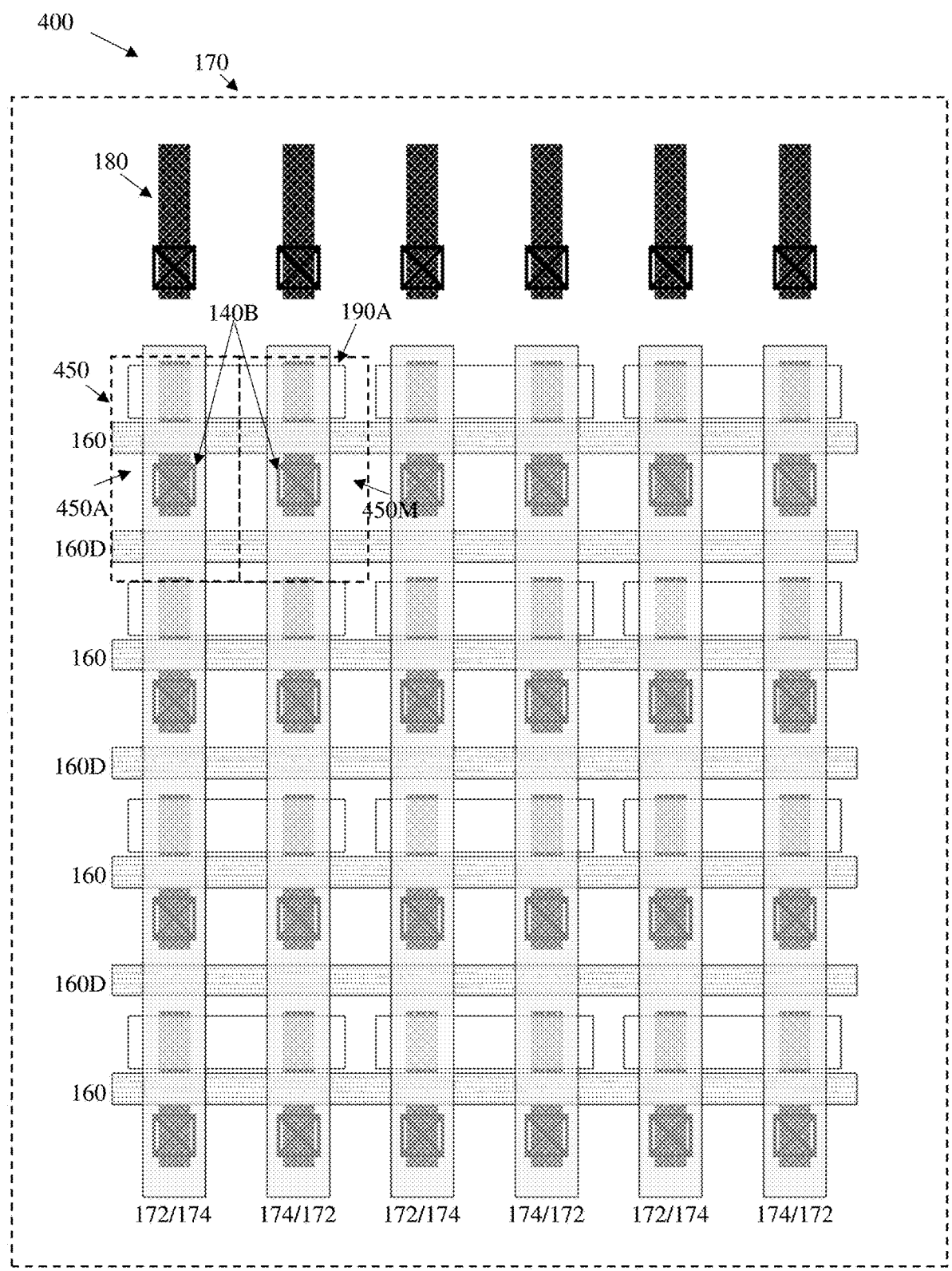

FIGS. 8A and 8B illustrate layout views of memory array 400 from memory array 100 of FIG. 7, illustrating examples on how electrical contact to the source line region 16 and bit line region 18 are formed for two-transistor unit memory cell 450. The two-transistor unit memory cell 450 comprises memory device 450M and access device 450A, which are connected in series, and has been described for example in U.S. application Ser. No. 14/380,779, "Memory Cell Comprising First and Second Transistors and Methods of Operating" ("Widjaja-4"), which is hereby incorporated herein, in its entirety, by reference thereto.

Both the memory device 450M and the access device 450A are transistors found over the buried layer 170. The CONT-A 140A layer can be used to form connection to a DIFF region such as the drain region 18 of the memory device 450M and a DIFF region such as the source region 16 of the access device 450A through a conductive METAL1 layer 190A, for example metal layers. Next, as illustrated in FIG. 8B, the drain region 18 of the access device 450A and the source region 16 of the memory device 450M can then be connected to another conductive layer 172/174, 172/174 (for example METAL2 layer) through a VIA layer 140B, where a conductive layer 172 and conductive layer 174 are interchangeably source line and bit line of the memory array 400.

Figure 9A:
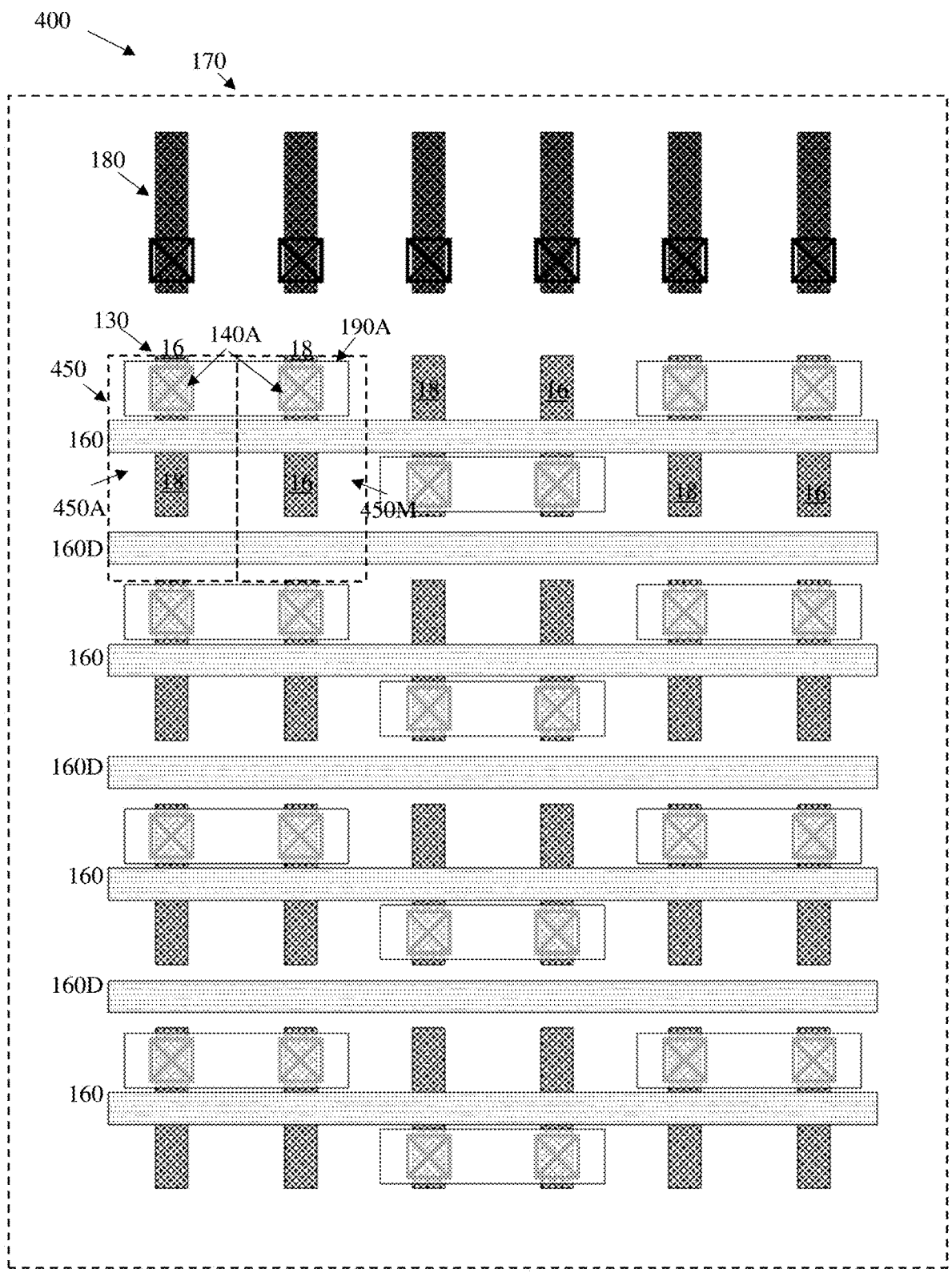
FIGS. 9A and 9B schematically illustrate a layout view of a memory array illustrated in FIG. 6B according to another embodiment of the present invention.
Figure 9B:
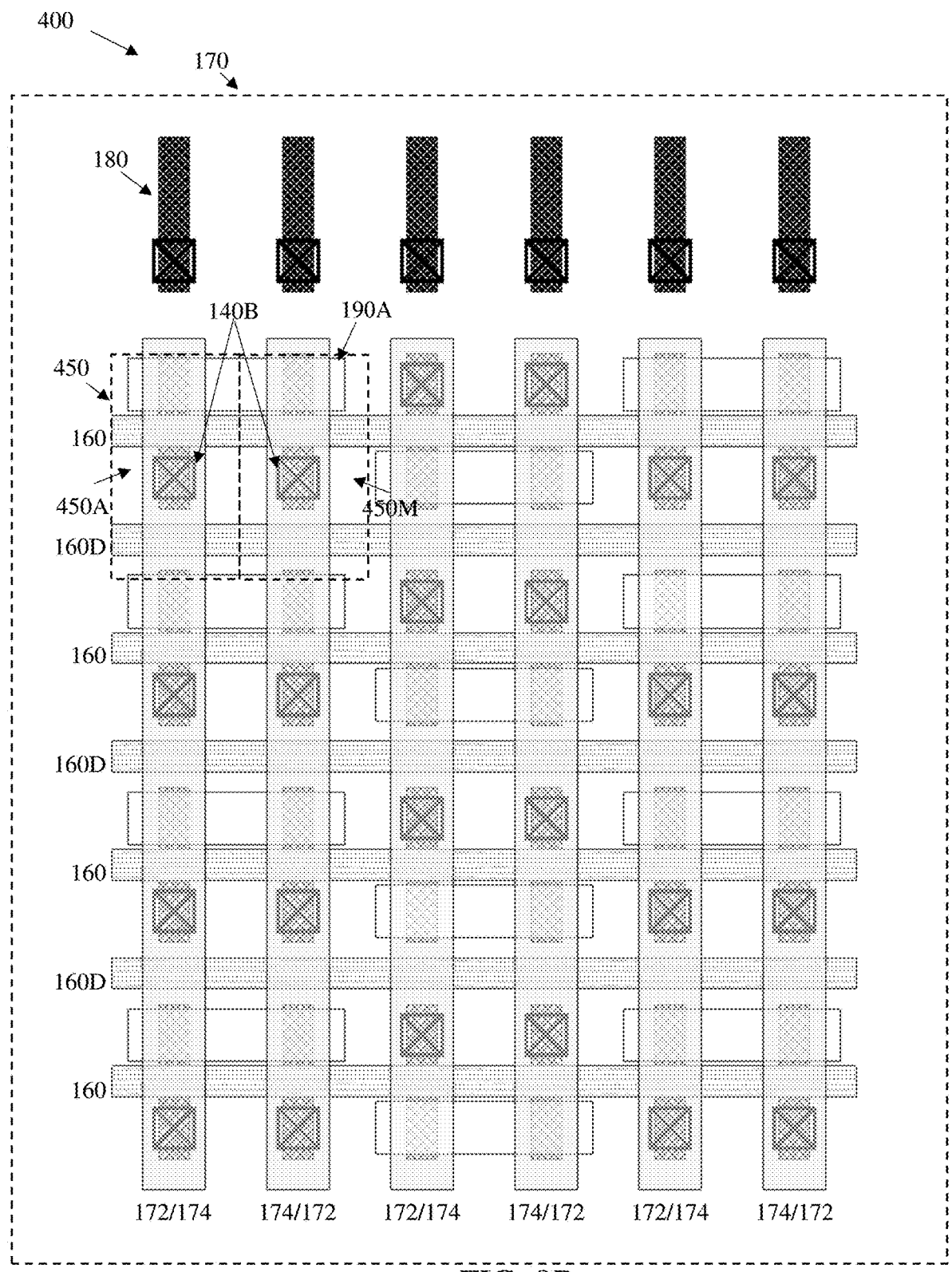

FIGS. 9A and 9B illustrate layout views of memory array 400 from memory array 100 of FIG. 7, illustrating examples on how electrical contact to the source line region 16 and bit line region 18 are formed for two-transistor unit memory cell 450 according to another embodiment of the present invention. This embodiment is similar to that of FIGS. 8A-8B, except that the connections 190A between the memory devices 450M and the access devices 450A are made in a staggered fashion. The CONT-A 140A layer can be used to form connection to a DIFF region such as the drain region 18 of the memory device 450M and a DIFF region such as the source region 16 of the access device 450A through a conductive METAL1 layer 190A, for example metal layers as illustrated in FIG. 9A. Next, as illustrated in FIG. 9B, the drain region 18 of the access device 450A and the source region 16 of the memory device 450M can then be connected to another conductive layer 172/174, 174/172 (for example METAL2 layer) through a VIA layer 140B, where a conductive layer 172 and conductive layer 174 are interchangeably source line and bit line of the memory array 400.

The exemplary memory array 400 illustrated in FIGS. 8A-9B comprises the interchangeable source line 172 and the bit line 174, where the source line 172 and the bit line 174 are arranged in parallel.

Figure 10A:
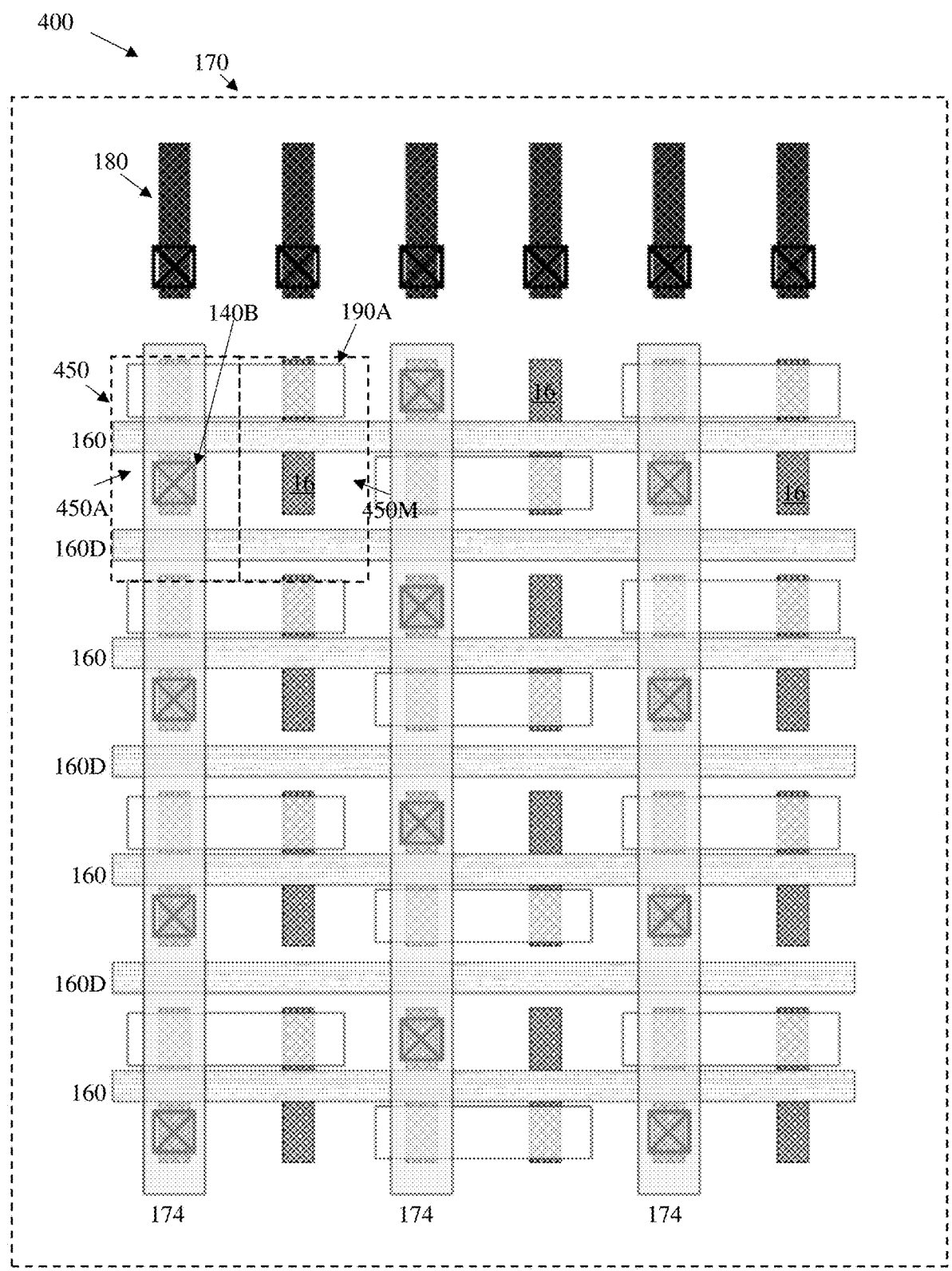
FIGS. 10A and 10B schematically illustrate a layout view of a memory array illustrated in FIG. 6B according to another embodiment of the present invention.
Figure 10B:
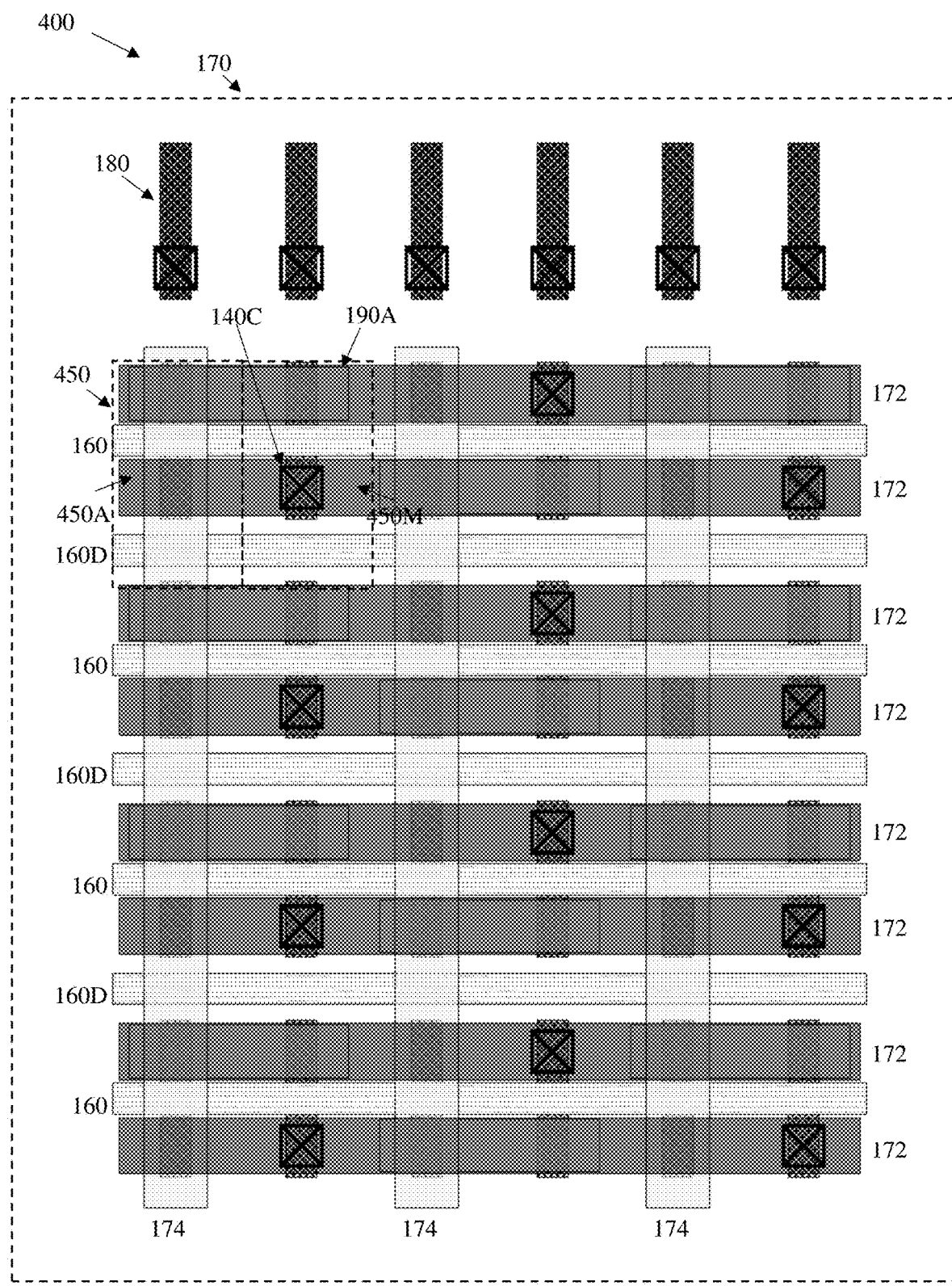

FIGS. 10A and 10B illustrate layout views of memory array 400 from memory array 100 of FIG. 7, illustrating examples on how electrical contact to the source line region 16 and bit line region 18 are formed for two-transistor unit memory cell 450 according to another embodiment of the present invention. This embodiment is similar to the FIGS. 8A-9B except that the source line 172 and the bit line 174 are arranged in orthogonal directions to one another. The CONT-A 140A layer can be used to form connection to a DIFF region such as the drain region 18 of the memory device 450M and a DIFF region such as the source region 16 of the access device 450A through a conductive METAL1 layer 190A, for example metal layers, as illustrated in FIG. 10A. Next, the drain region 18 of the access device 450A can then be connected to another conductive layer 174 for bit line (for example METAL2 layer) through a VIA layer 140B. Next, as illustrated in FIG. 10B, the source region 16 of the memory device 450M can be connected to another conductive layer 172 for source line (for example METAL3 layer) through a VIA layer 140C.

The exemplary memory cell 450 illustrated in FIGS. 8A-10B comprises two transistors (450M and 450A) having the same conductivity type, for example two n-channel transistors connected in series, where both the memory device 450M and the access device 450A are transistors located within a buried well layer 170. However, due to the independent voltage controllable buried well layer 170 connected to respective buried well layer taps 180, the memory devices 450M and the access device 450A may have different buried well layer 170 voltages. The buried well layer taps 180 connecting the buried well connected to the memory devices 450M may have positive bias to form floating body in the memory device 450M whereas the buried well layer taps 180 connecting the buried well connected to the access devices 450A may have zero or slight negative bias such as −0.1V to form non-floating body in the access device 450A.

The exemplary memory cell 450 illustrated in FIGS. 8A-10B comprises a word line 160 common for the memory device 450M and the access device 450A. In another embodiment of the present invention, the memory cell array is configured for a unit memory cell consisting of two transistors, a memory cell word line for the floating body memory transistor and an access select word line for the non-floating body access transistor through independent buried well biasing scheme based on the dual depth insulating layer technology.

Figure 11A:
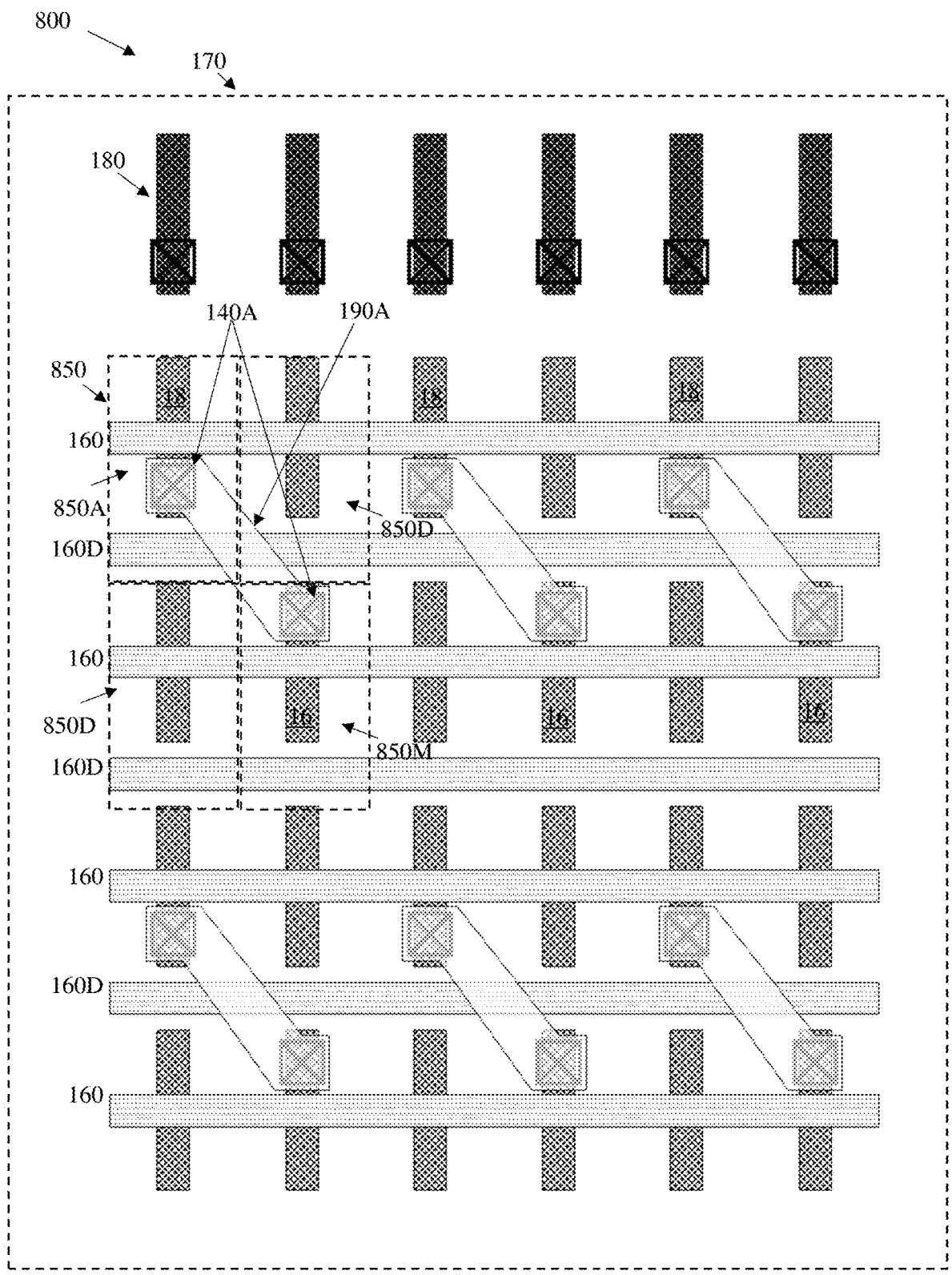
FIGS. 11A and 11B schematically illustrate a layout view of a memory array illustrated in FIG. 6B according to another embodiment of the present invention.
Figure 11B:
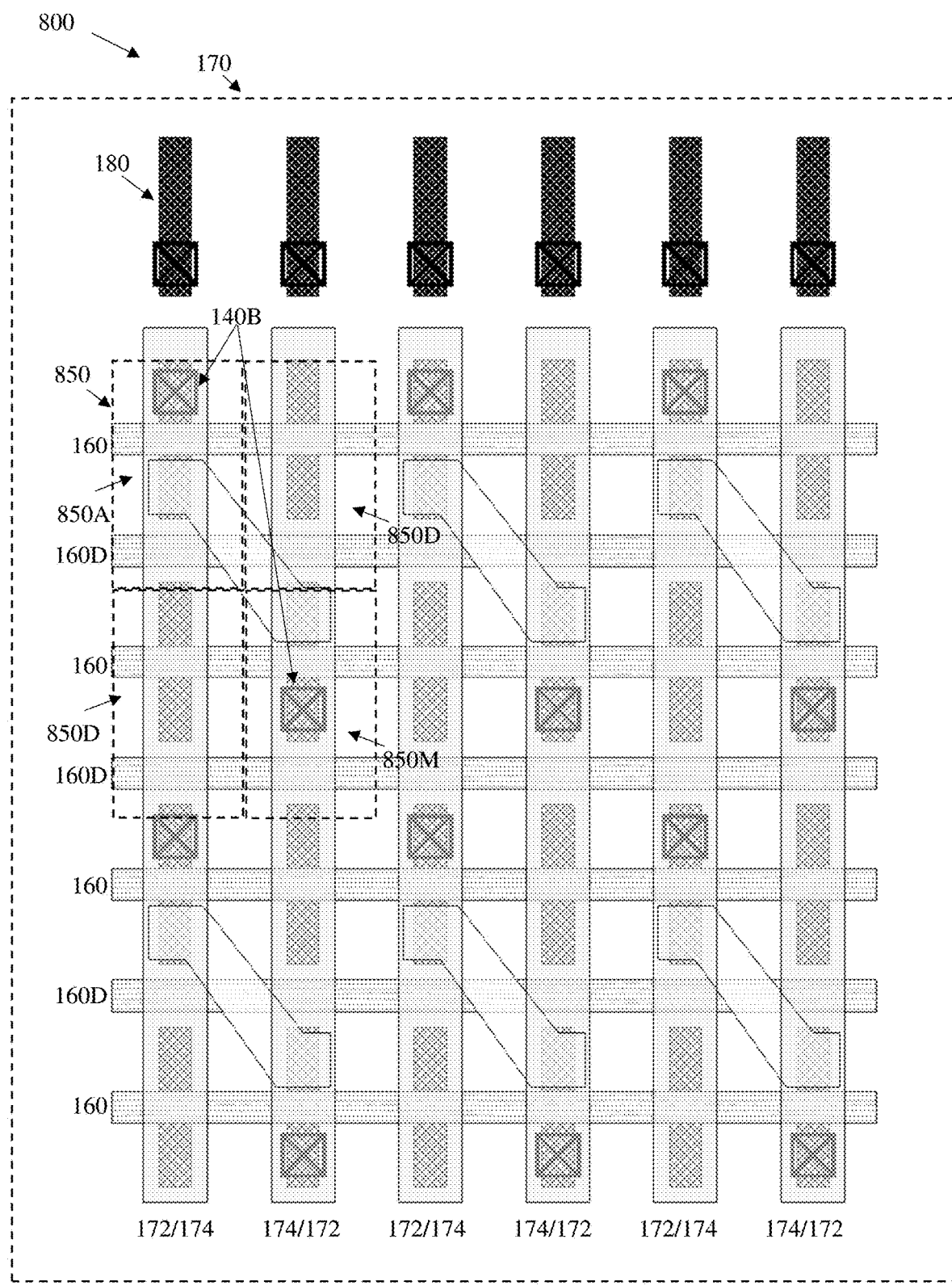

FIGS. 11A and 11B illustrate layout views of memory array 800 from memory array 100 of FIG. 7, illustrating examples on how electrical contact to the source line region 16 and bit line region 18 are formed for a four-transistor unit memory cell 850. The four-transistor unit memory cell 850 comprises a memory device 850M and an access device 850A, which are connected in series, and two dummy devices 850D, which are left unconnected to any terminals. All the memory devices 850M, the access devices 850A, and the dummy devices 850D are transistors found over the buried layer 170. The CONT-A 140A layer can be used to form connection to a DIFF region such as the drain region 18 of the memory device 850M and a DIFF region such as the source region 16 of the access device 850A through a conductive METAL1 layer 190A, for example metal layers. Next, as illustrated in FIG. 11B, the drain region 18 of the access device 850A and the source region 16 of the memory device 850M can then be connected to another conductive layer 172/174, 174/172 (for example METAL2 layer) through a VIA layer 140B, where a conductive layer 172 and conductive layer 174 are interchangeably source line and bit line of the memory array 800.

The exemplary memory array 800 illustrated in FIGS. 11A-11B comprises the interchangeable source line 172 and the bit line 174, where the source line 172 and the bit line 174 are arranged in parallel.

Figure 12A:
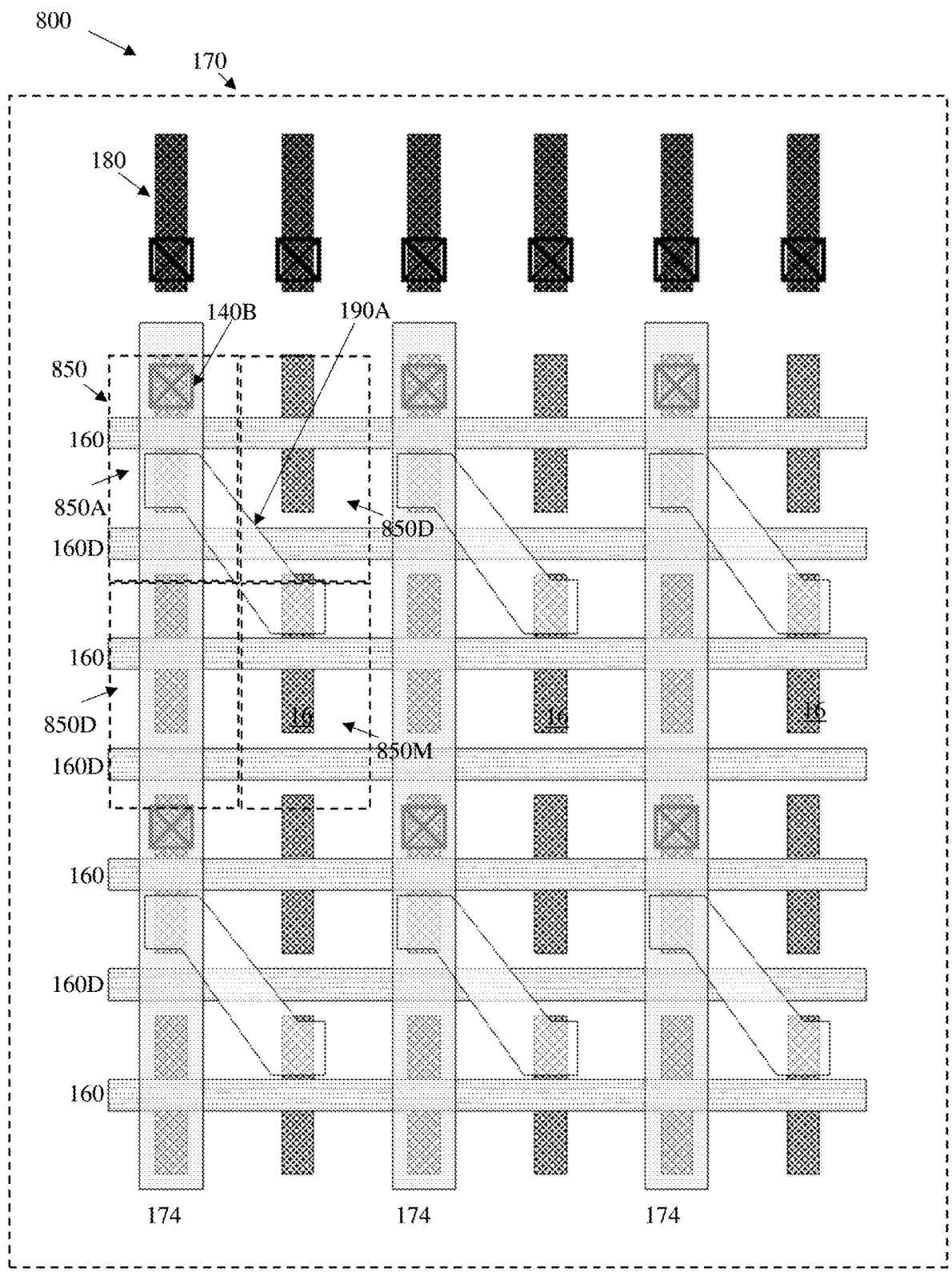
FIGS. 12A and 12B schematically illustrate a layout view of a memory array illustrated in FIG. 6B according to another embodiment of the present invention.
Figure 12B:
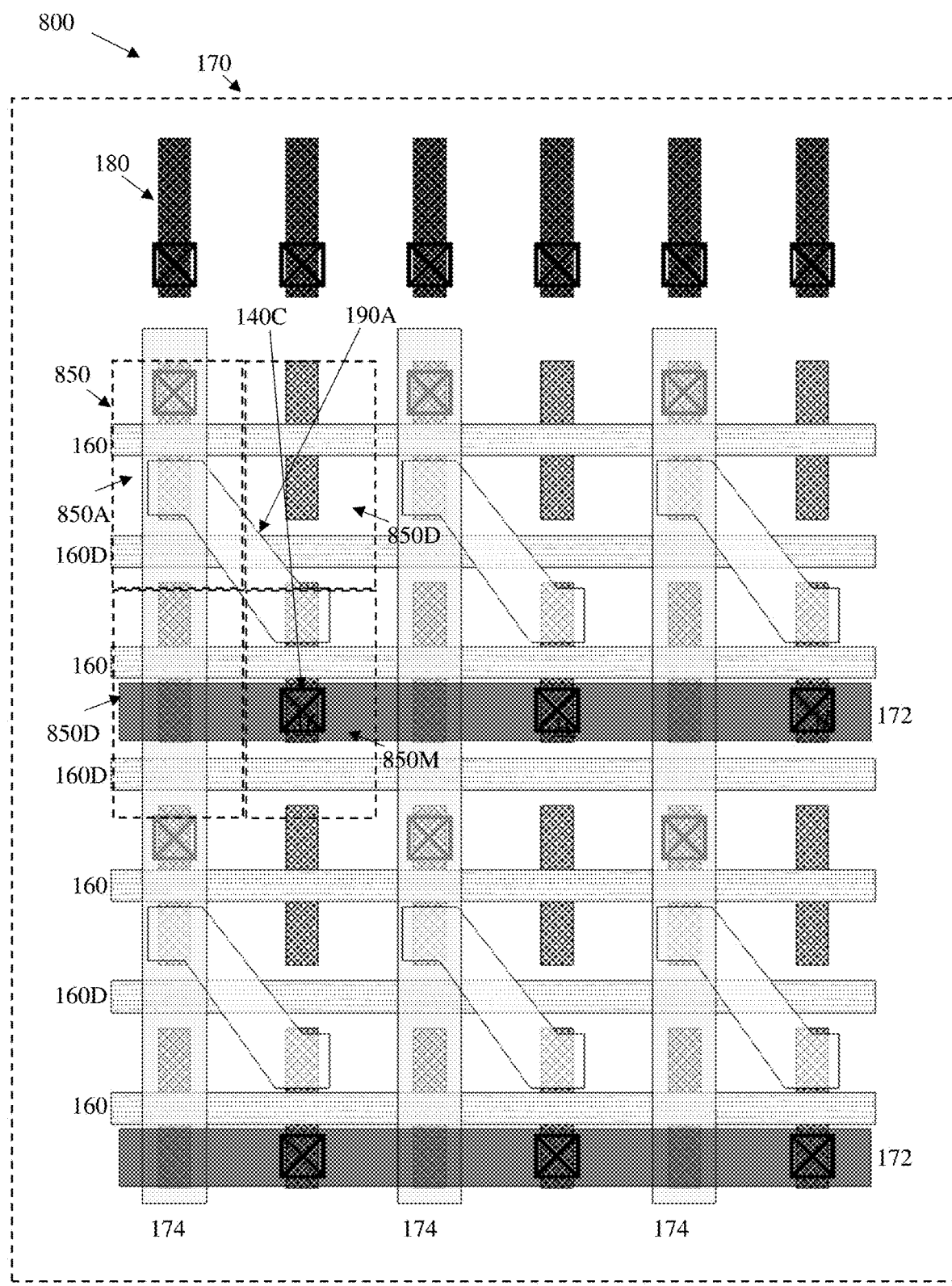

FIGS. 12A and 12B illustrate layout views of memory array 800 from memory array 100 of FIG. 7, illustrating examples on how electrical contact to the source line region 16 and bit line region 18 are formed for a four-transistor unit memory cell 850 according to another embodiment of the present invention. This embodiment is similar to that of FIGS. 11A-11B except that the source line 172 and the bit line 174 are arranged in orthogonal directions to one another. The CONT-A 140A layer can be used to form connection to a DIFF region such as the drain region 18 of the memory device 850M and a DIFF region such as the source region 16 of the access device 850A through a conductive METAL1 layer 190A, for example metal layers as illustrated in FIG. 12A. Next, the drain region 18 of the access device 850A can then be connected to another conductive layer 174 for bit line (for example METAL2 layer) through a VIA layer 140B. Next, as illustrated in FIG. 12B, the source region 16 of the memory device 850M can be connected to another conductive layer 172 for source line (for example METAL3 layer) through a VIA layer 140C.

The exemplary memory cell 850 illustrated in FIGS. 11A-12B comprises four transistors (850M, 850A, and 850D) having the same conductivity type, for example two n-channel transistors connected in series, where all the memory devices 850M, the access devices 850A, and the dummy devices 850D are transistors located over the buried well layer 170 (or within a buried well layer 170 in the layout views shown in FIGS. 11A-12B). However, due to the independent voltage controllable buried well layer 170 connected to respective buried well layer taps 180, the memory devices 850M and the access devices 850A may have different buried well layer 170 voltages. The buried well layer taps 180 connecting the buried well connected to the memory devices 850M may have positive bias to form floating body in the memory device 850M whereas the buried well layer taps 180 connecting the buried well connected to the access devices 850A may have zero or slight negative bias such as −0.1V to form non-floating body in the access device 850A.

Figure 13:
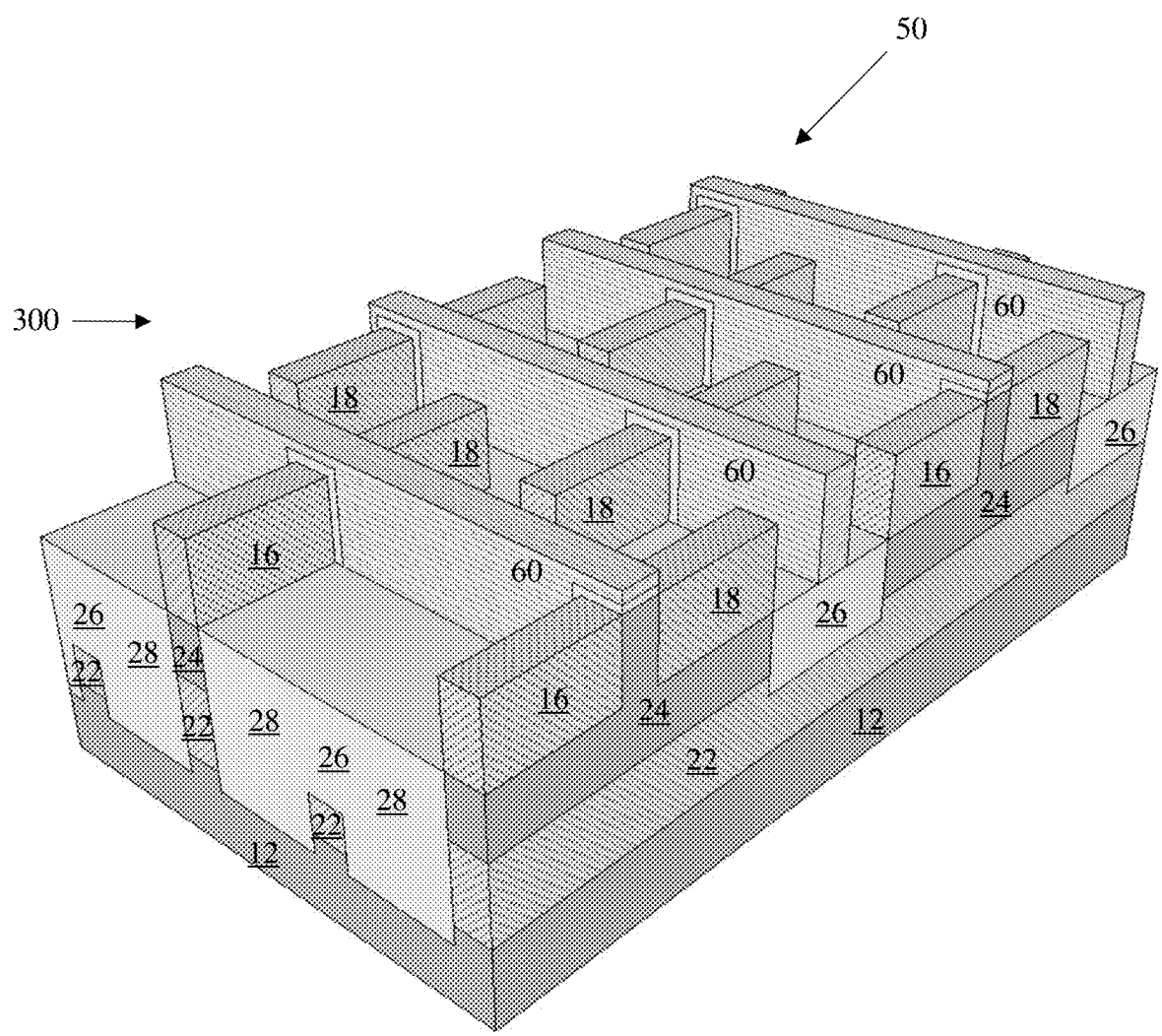
FIG. 13 is schematic, three-dimensional view of a memory cell array having a fin structure according to an embodiment of the present invention.

FIG. 13 illustrates a schematic three-dimensional view of a memory cell array 300 according to another embodiment of the present invention. The memory cell 50 having a fin structure is an example of a fin type device shown in FIGS. 4A and 4B. The fin structures are arranged in a staggered manner, such that the fins of adjacent cells are offset and do not align with one another, as shown in FIG. 13. Fin structures of any of the other memory cells described herein may also be arranged in the staggered manner shown in FIG. 13. The memory cell 50 may include dual depth insulating layers; insulating layer 26 like shallow trench isolation (STI) and insulating layer 28 like deep trench isolation (DTI). Insulating layers 26 insulate memory cell 50 from adjacent memory cell 50. The bottom of insulating layer 26 resides inside the buried region 22 allowing buried region 22 to be continuous as shown in FIG. 13. The bottom of the insulating layer 28 resides below the buried layer 22. As a result, the buried layer 22 becomes continuous along the channel length direction but electrically decoupled along the gate 60 direction so that each buried layer along the channel length direction may have independent bias.

Figure 14:
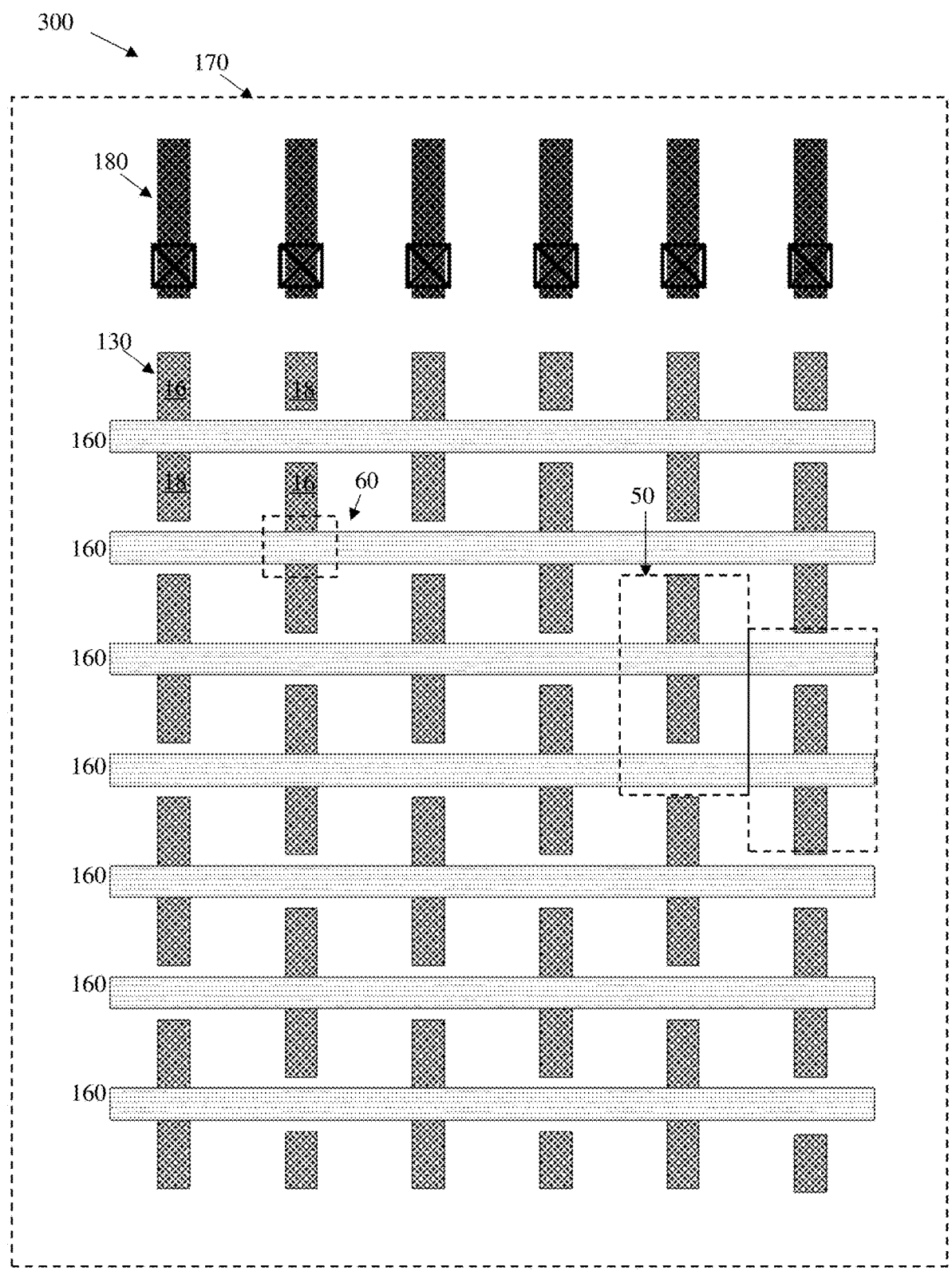
FIG. 14 schematically illustrates a layout view of a memory array illustrated in FIG. 13 according to an embodiment of the present invention.

FIG. 14 illustrates a layout view of memory array 300 according to another embodiment of the present invention. The memory array 300 is located within the buried well region 170 layer. The DIFF layers 130 define the active regions of the memory cell (regions between the insulating layers 26 and 28 shown in the cross-sectional view in FIG. 4A). Alternatively, the DIFF layers 130 may define the fin of the memory cell 50. The DIFF layers 130 are arranged in staggered manner, so that they do not align along the direction in which the POLY 160 extend. Consequently, the POLY layers 160 in memory array 300 only form gates 60 in the area where they overlap or intersect with DIFF layer 130. The DIFF layers 130 may be formed by two step processes. A mandrel layer is a long line pattern, where the layers in between the mandrel layers define the insulating layer 28 such as deep trench isolation. Then, a fin cut layer follows, where the layer in between the fin cut layers define the insulating layer 26 such as shallow trench isolation. The POLY layers 160 define the gate region 60 shown in the cross-sectional view of FIG. 4A. The unit cell of the memory cell 50 comprises two POLY160 regions; one POLY region160 to define the transistor region, for example the memory transistor, fully overlapping with a DIFF layer 130 and another POLY region 160 to define another transistor region, for example the access transistor, fully overlapping with another DIFF layer 130. The overlap between POLY 160 and DIFF 130 layers form the channel region of the memory transistor and access transistor, for example the region beneath gate region 60 and dielectric layer 62, between the source line region 16 and bit line region 18 shown in FIG. 2. The memory array 300 may include a buried well layer tap 180. The buried well layer tap 180 is formed on DIFF 130 layer while it may be doped by a second conductivity type, such as n-type, the same as a buried layer region 22. The buried well layer taps 180 are formed about the perimeter of the memory array 300 or the memory sub-array 300 such as at the top or bottom of the array. Each of the buried well layer taps 180 connects to its own buried layer 22 portion and the buried layer 22 voltages are independently controlled through respective buried well layer taps 180.

Figure 15A:
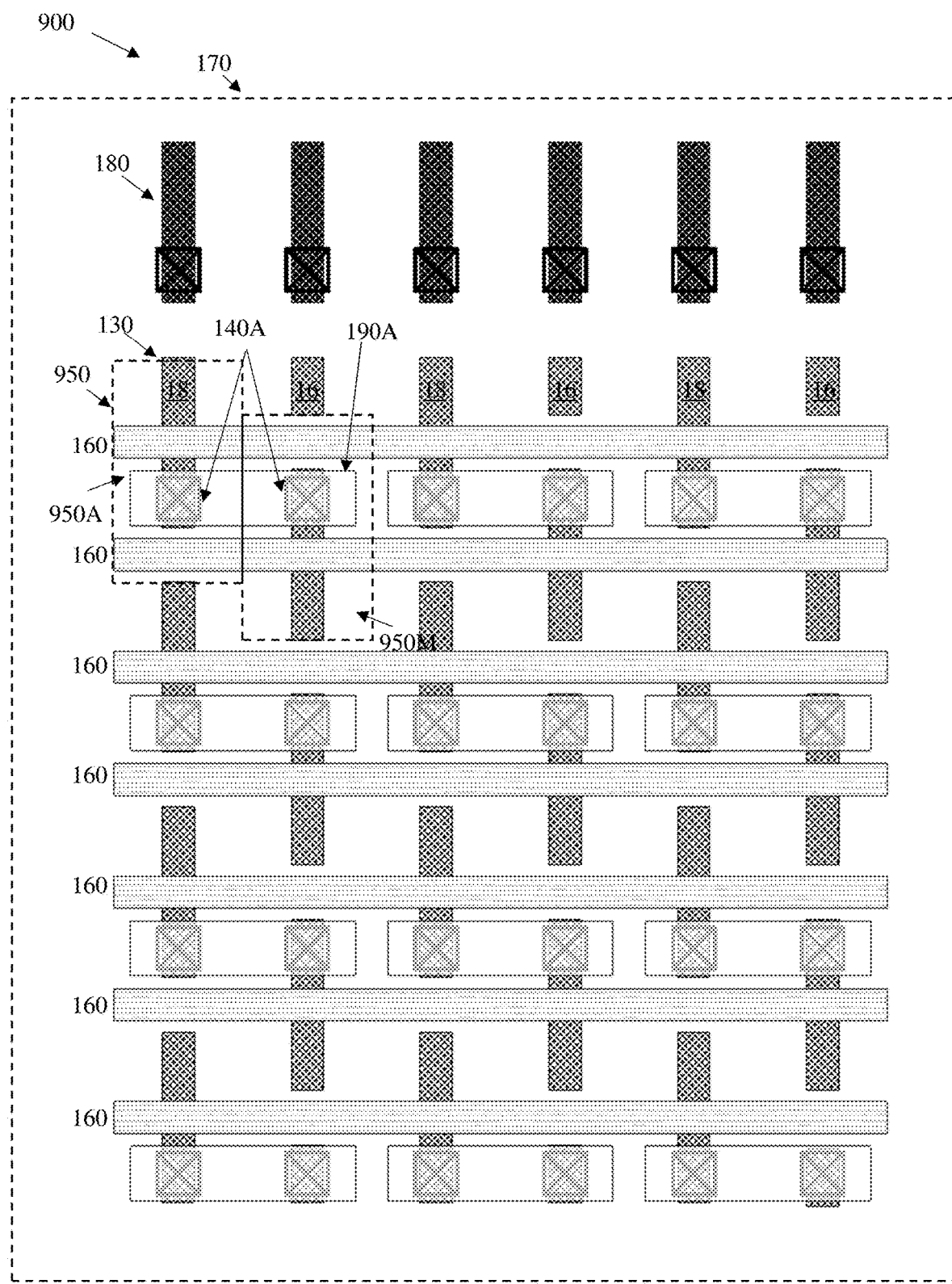
FIGS. 15A and 15B schematically illustrate a layout view of a memory array illustrated in FIG. 13 according to another embodiment of the present invention.
Figure 15B:
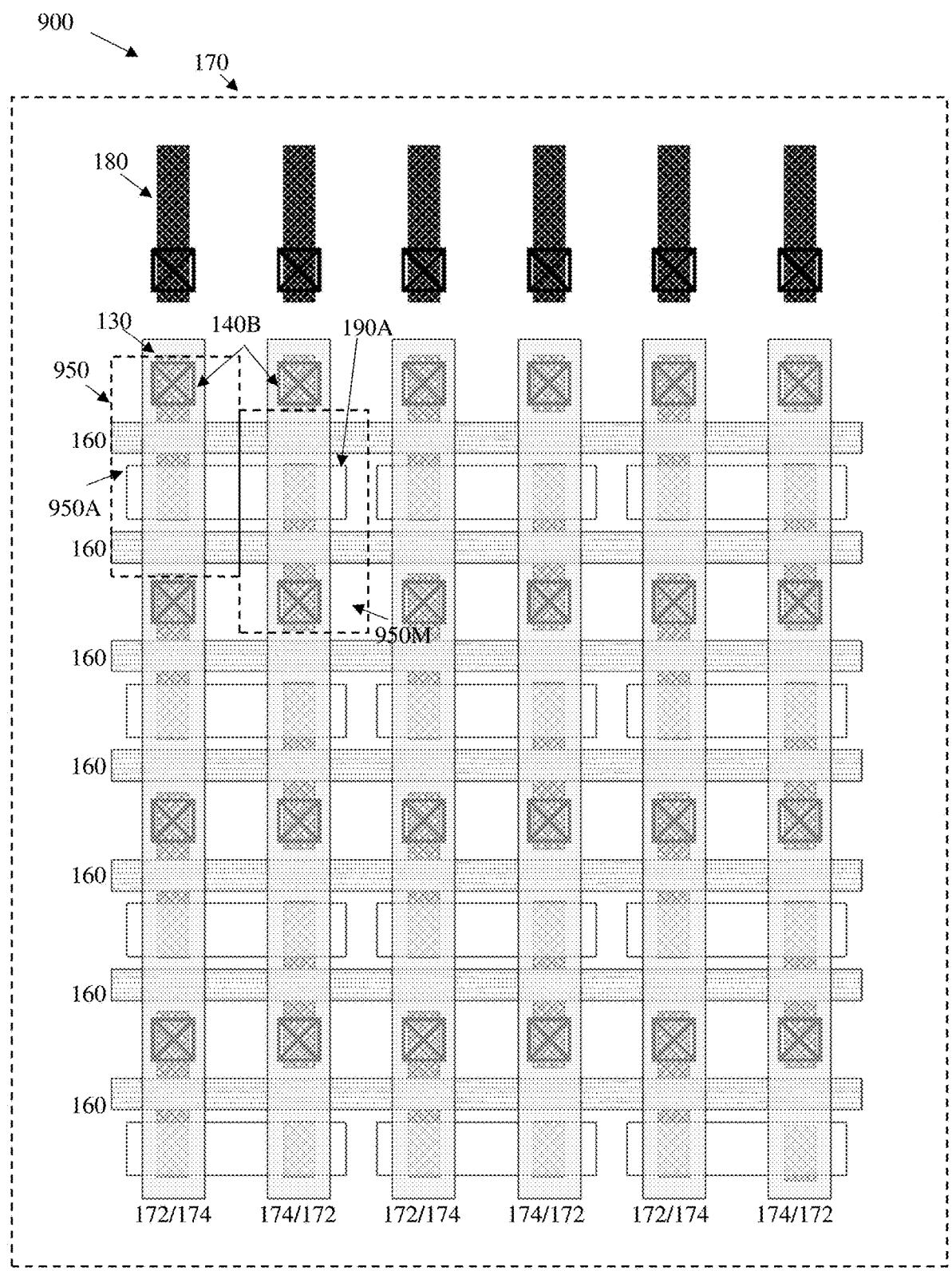

FIGS. 15A and 15B illustrate layout views of memory array 900 from memory array 300 of FIG. 14, illustrating examples on how electrical contact to the source line region 16 and bit line region 18 are formed for two-transistor unit memory cell 950. The two-transistor unit memory cell 950 comprises memory device 950M and access device 950A, which are connected in series, and has been described for example in U.S. application Ser. No. 14/380,779, "Memory Cell Comprising First and Second Transistors and Methods of Operating" ("Widjaja-4"), which is hereby incorporated herein, in its entireties, by reference thereto. Both the memory device 950M and the access device 950A are transistors formed over the buried layer 170 (or within the buried layer 170 in the layout views illustrated in FIGS. 15A-15B). The CONT-A 140A layer can be used to form connection to a DIFF region such as the drain region 18 of the memory device 950M and a DIFF region such as the source region 16 of the access device 950A through a conductive METAL1 layer 190A, for example metal layers. Next, as illustrated in FIG. 15B, the drain region 18 of the access device 950A and the source region 16 of the memory device 950M can then be connected to another conductive layer 172/174, 174/172 (for example METAL2 layer) through a VIA layer 140B, where a conductive layer 172 and conductive layer 174 are interchangeably source line and bit line of the memory array 900.

Figure 16A:
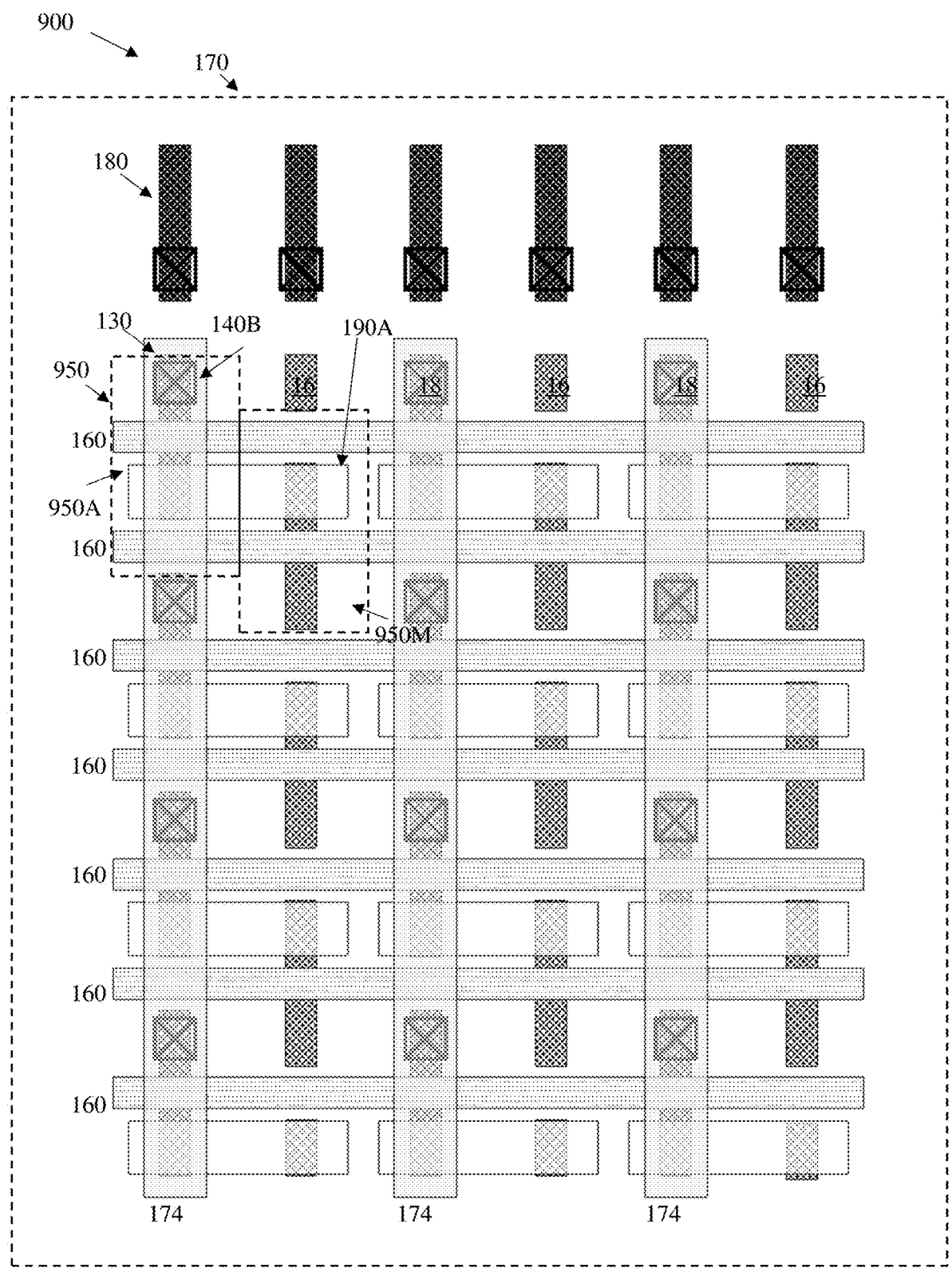
FIGS. 16A and 16B schematically illustrate a layout view of a memory array illustrated in FIG. 13 according to another embodiment of the present invention.
Figure 16B:
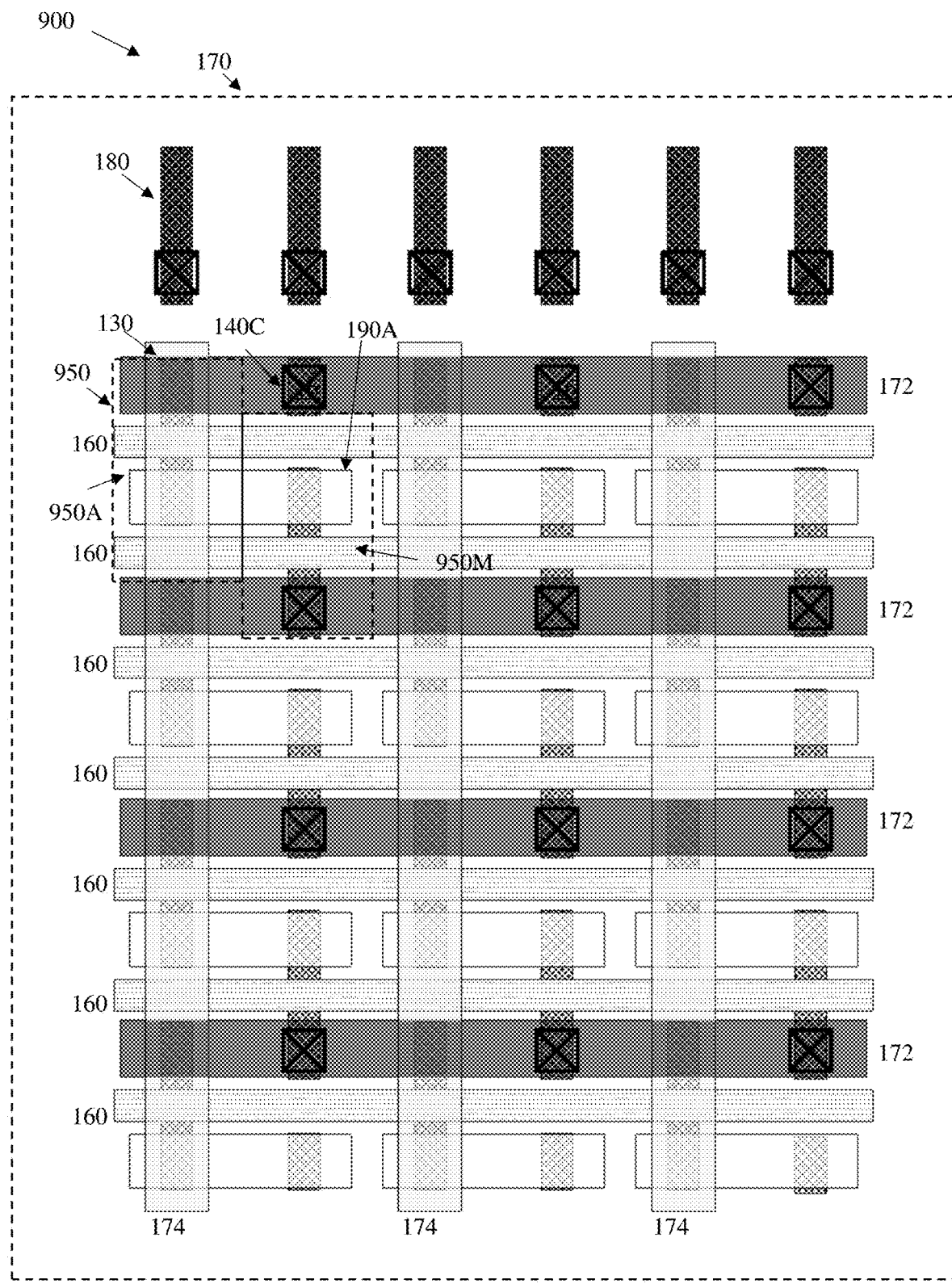

FIGS. 16A and 16B illustrate layout views of memory array 900 from memory array 300 of FIG. 14, illustrating examples on how electrical contact to the source line region 16 and bit line region 18 are formed for two-transistor unit memory cell 950 according to another embodiment of the present invention. This embodiment is similar to the embodiment of FIGS. 15A-15B except that the source line 172 and the bit line 174 are arranged in orthogonal direction to one another. The CONT-A 140A layer can be used to form connection to a DIFF region such as the drain region 18 of the memory device 950M and a DIFF region such as the source region 16 of the access device 950A through a conductive METAL1 layer 190A, for example metal layers as illustrated in FIG. 16A. Next, the drain region 18 of the access device 950A can then be connected to another conductive layer 174 for bit line (for example METAL2 layer) through a VIA layer 140B. Next, as illustrated in FIG. 16B, the source region 16 of the memory device 950M can be connected to another conductive layer 172 for source line (for example METAL3 layer) through a VIA layer 140C.

The exemplary memory cell 950 illustrated in FIGS. 15A-16B comprises two transistors (950M and 950A) having the same conductivity type, for example two n-channel transistors connected in series, where both the memory device 950M and the access device 950A are transistors located within a buried well layer 170 as illustrated in the layout views in FIGS. 15A-16B. However, due to the independent voltage controllable buried well layer 170 connected to respective buried well layer taps 180, the memory device 950M and the access device 950A may have different buried well layer 170 voltages. The buried well layer taps 180 connecting the buried well connected to the memory devices 950M may have positive bias to form floating body in the memory devices 950M whereas the buried well layer taps 180 connecting the buried well connected to the access devices 950A may have zero or slight negative bias such as −0.1V to form non-floating body in the access devices 950A.

Figure 17:
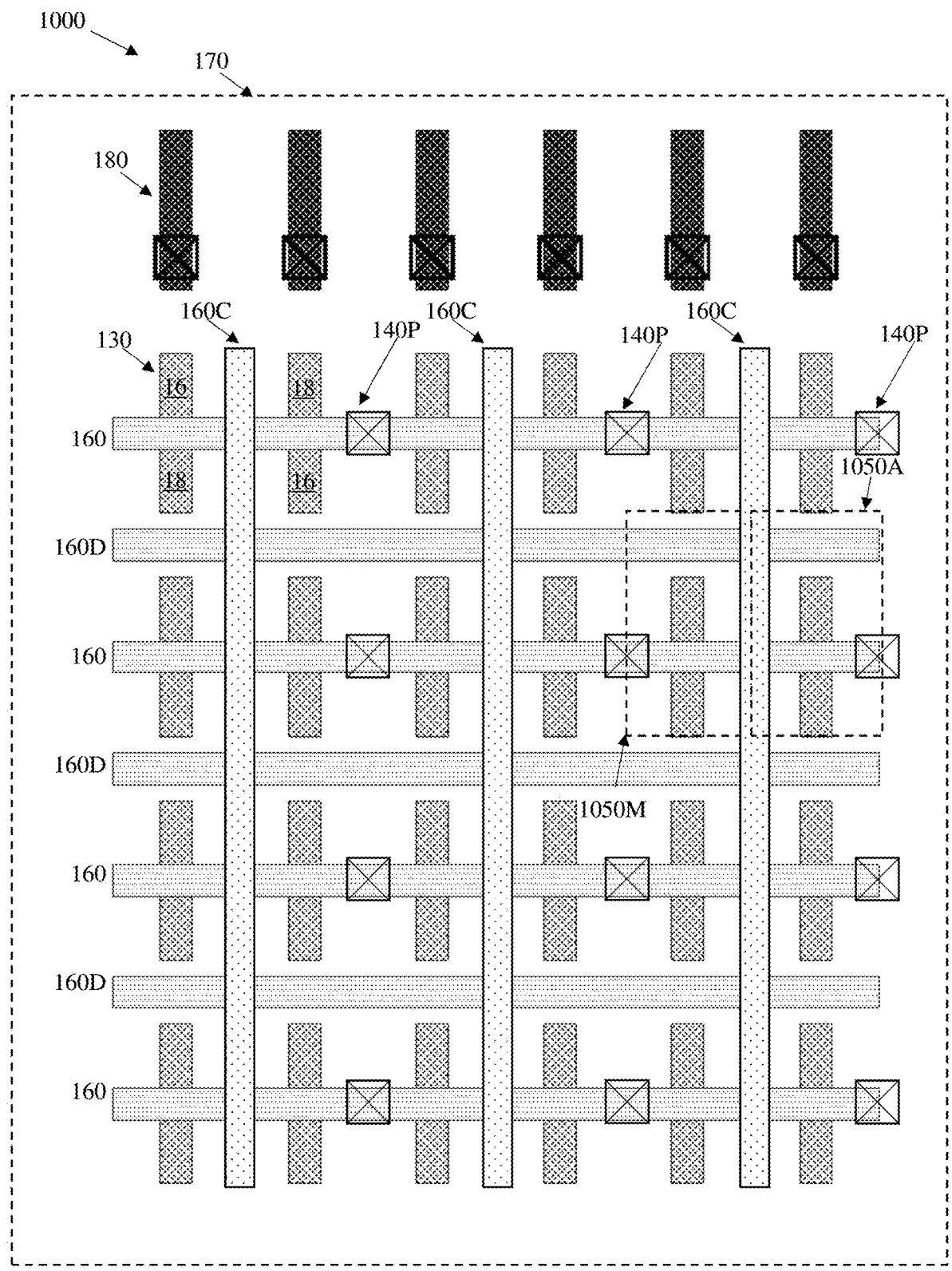
FIG. 17 schematically illustrates a layout view of a memory array according to another embodiment of the present invention.

FIG. 17 illustrates memory array 1000 according to another embodiment of the present invention. In memory array 1000, the gate regions of the memory cell 1050M and access device 1050A are separated, for example, using a POLYCUT layer 160C. A CONT-P 140P layer can then be used to form a connection to the gate region of the memory device 1050M and access device 1050A, which then can be electrically connected through a conductive layer, for example METAL1 layer (not illustrated).

Figure 18:
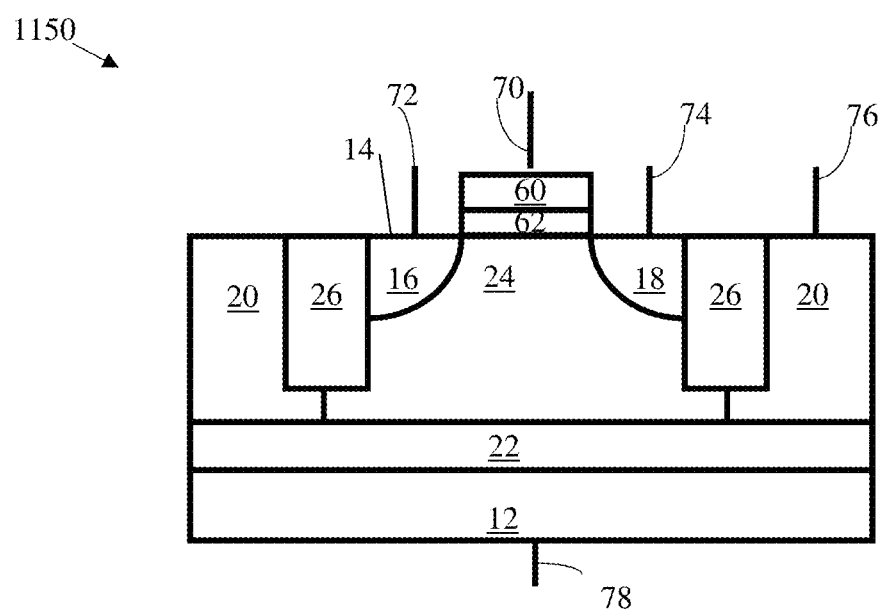
FIG. 18 is a schematic, cross-sectional illustration of a memory cell according to an embodiment of the present invention.

FIG. 18 illustrates a memory cell 1150 according to an embodiment of the present invention. The buried layer region 22 of memory cell 1150 is located below the insulating region 26. The floating body region 24 of memory cell 1150, in addition to being bounded by 16, 62, 18, 26 and 22, is also bounded by adjacent well region 20 of a second conductivity type, such as n-type, for example. The floating body region 24 of the memory cell 1150 may be bounded by adjacent well region 20 of the second conductivity type by four sides of the floating body region 24 or two sides along channel length direction (i.e. the direction along the regions 16 and 18, along the drawing plane) or two sides perpendicular to the channel length direction of the floating body region 24 (i.e. perpendicular to the direction defined by regions 16 and 18, into the drawing plane).

The operation of memory cell 1150 is similar to that of memory cell 50, as described for example in Widjaja-1, Widjaja-2, and Widjaja-3. The back bias applied to the buried layer region 22 (through BW terminal 76 via well region 20) may be higher for memory cell 1150 than that of memory cell 50 as the base region of the vertical bipolar device formed by source/drain regions 16 and 18, floating body region 24, and buried layer 22 is wider for memory cell 1150 than that of memory cell 50.

Figure 19:
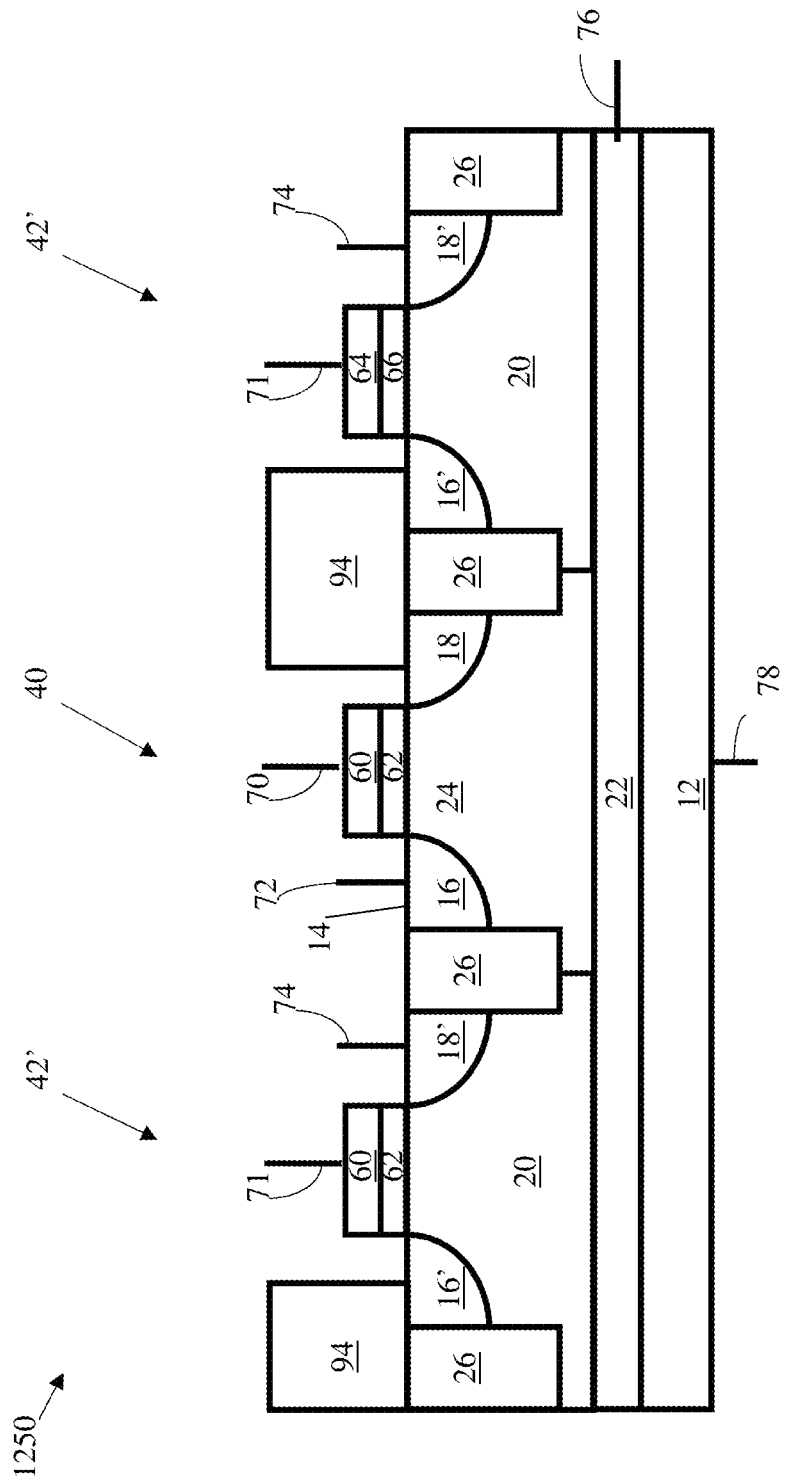
FIG. 19 is a schematic, cross-sectional illustration of a memory cell having a memory device and an access transistor having different conductivity types according to an embodiment of the present invention.

FIG. 19 illustrates a memory cell 1250 according to another embodiment of the present invention. Memory cell 1250 comprises memory device 40 and access transistor 42'. FIG. 19 also illustrates a portion of another memory cell 1250 where only the access transistor 42' is shown. Thus the floating body region 24 of memory cell 1250 is bounded in part by adjacent well region 20 of the access transistor 42' and by adjacent well region 20 of access transistor 42' of another adjacent memory cell 1250. The memory device 40 comprises floating body region 24 having more than one stable state. Similar to memory cell 1150, the memory device 40 of memory cell 1250 comprises a buried layer region 22 located below the insulating region 26.

Access transistor 42' has a different conductivity type from memory device 40. For example, memory device 40 may be an n-type transistor and access transistor 42' may be a p-type transistor. Access transistor 42' comprises a well region 20 of the second conductivity type, for example n-type, source region 16' and drain region 18' of the first conductivity type, such as p-type. The well region 20 of the second conductivity type is electrically connected to the buried well region 22, and is therefore not floating. The floating body region 24 of the memory device 40 is bounded in part by the well region 20 of the access transistor 42'.

Access transistor 42' also comprises a gate 64 positioned in between the source region 16' and the drain region 18'. The gate 64 is insulated from the well region 20 by an insulating layer 66. Insulating layer 66 may be made of silicon oxide and/or other dielectric materials, including high-K dielectric materials, such as, but not limited to, tantalum peroxide, titanium oxide, zirconium oxide, hafnium oxide, and/or aluminum oxide. The gate 64 may be made of, for example, polysilicon material or metal gate electrode, such as tungsten, tantalum, titanium and their nitrides.

The operation of memory cell 1250 having a memory device and an access transistor has been described for example in U.S. Patent Application Publication No. 2015/0023105, "Memory Cell Comprising First and Second Transistors and Method of Operating", which is hereby incorporated herein, in its entirety, by reference thereto.

Figure 20:
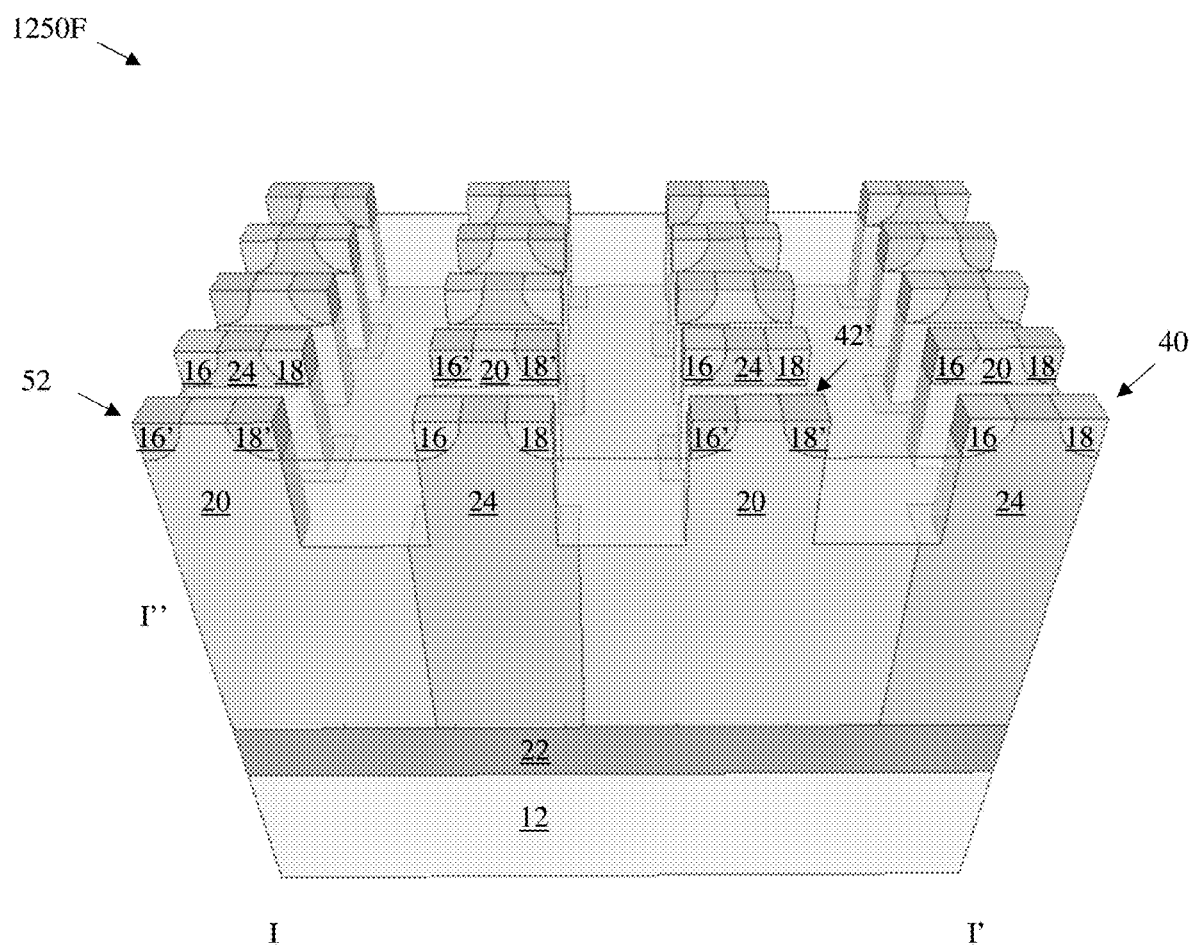
FIG. 20 is a schematic, three-dimensional view of a memory cell having a fin structure according to an embodiment of the present invention.

In another embodiment according the present invention, memory cells 1150 and 1250 may also be formed in a three-dimensional fin structure. FIG. 20 shows memory cell 1250F formed in a fin structure 52. FIG. 20 also illustrates memory cells 1250F where memory device 40 and access transistor 42' are arranged in alternating pattern both in the I-I' direction (along the drawing plane) and in the I-I" direction (perpendicular to the drawing plane, i.e., into the page of the drawing). In another embodiment according to the present invention, the memory device 40 and access transistor 42' may be arranged alternatingly only in one direction, for example the I-I' direction (along the drawing plane), where rows along the I-I" direction (into the drawing plane) will consist of all memory devices 40 or all access transistors 42'.

Figure 21A:
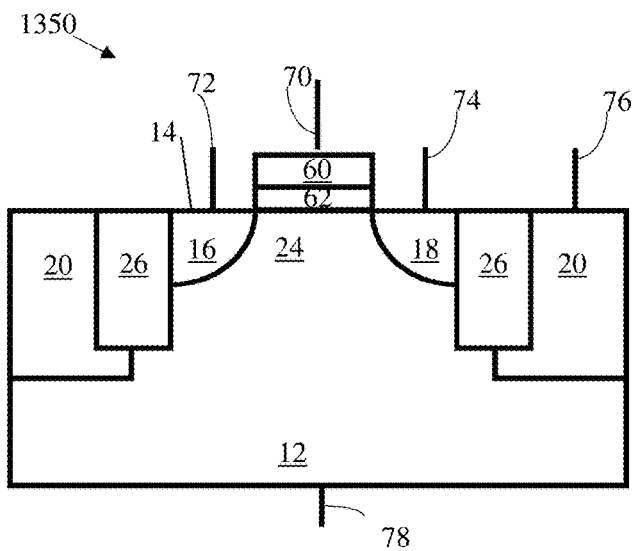
FIGS. 21A-21B are schematic, cross-sectional illustrations of a memory cell according to another embodiment of the present invention.
Figure 21B:
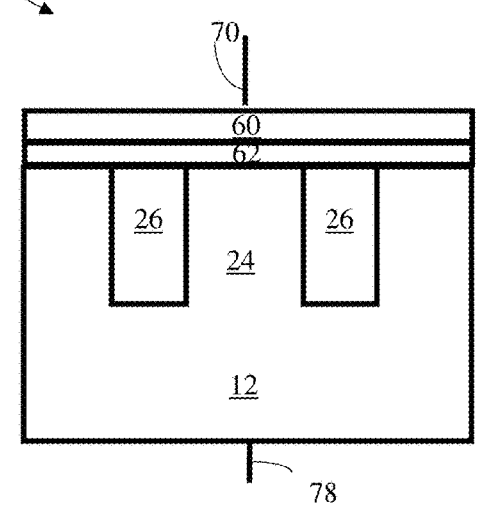

FIGS. 21A-21B illustrate memory cell 1350 according to another embodiment of the present invention. The body region 24 of memory cell 1350 is also bounded by well region 20 of a second conductivity type, such as n-type, for example. The well region 20 may be formed at only two sides along gate width direction. However, the body region 24 of memory cell 1350 is not physically bounded at the bottom by a buried layer region. As illustrated in FIGS. 21A-21B, in the absence of voltage bias applied to the memory cell 1350, the body region 24 of memory cell 1350 is electrically connected to the substrate region 12.

Figure 22A:
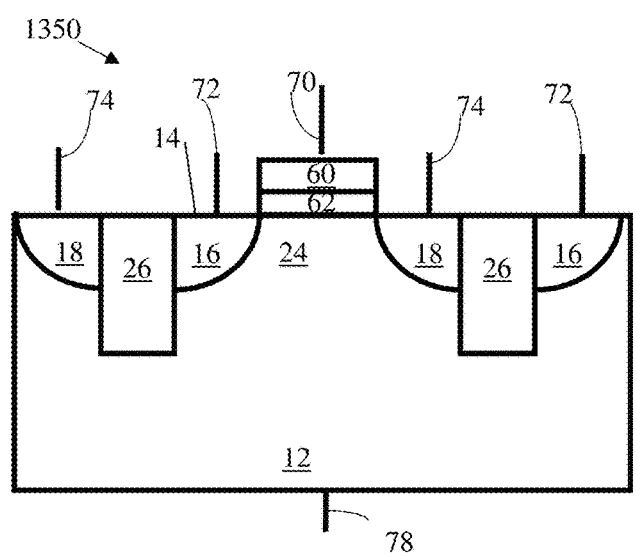
FIGS. 22A-22B are schematic, cross-sectional illustrations of a memory cell according to another embodiment of the present invention.
Figure 22B:
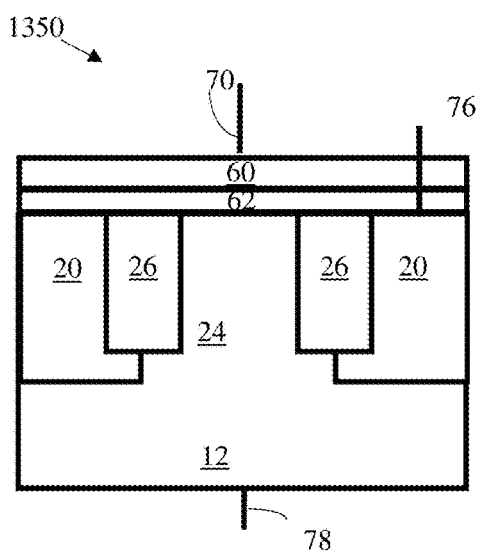
Figure 23A:
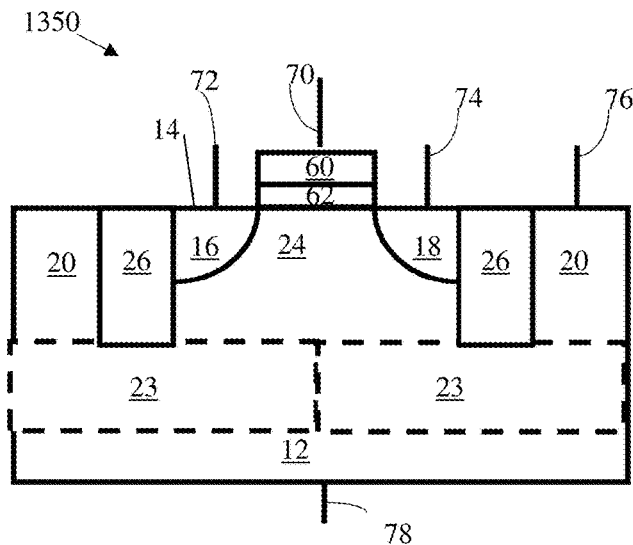
FIGS. 23A-23B schematically illustrate a depletion region that is formed as a result of a bias condition applied to a memory cell according to an embodiment of the present invention.
Figure 23B:
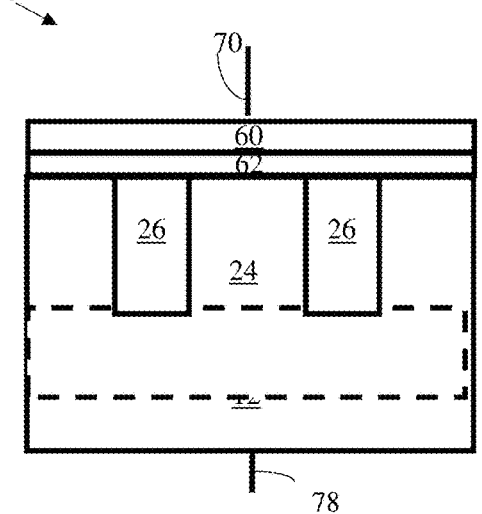
Figure 24A:
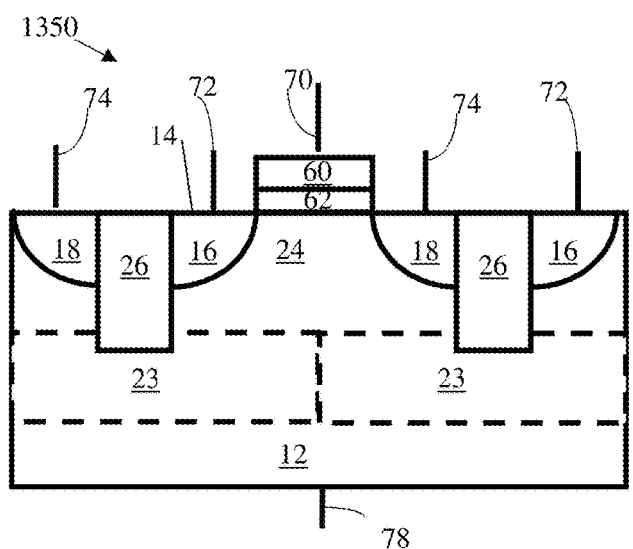
FIGS. 24A-24B schematically illustrate a depletion region that is formed as a result of a bias condition applied to a memory cell according to another embodiment of the present invention.
Figure 24B:
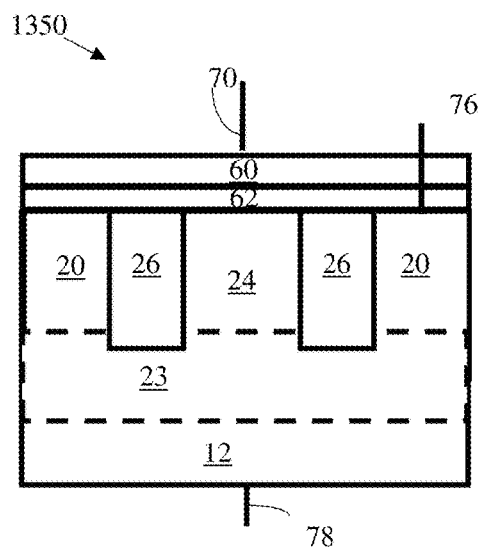

FIGS. 22A-22B illustrate memory cell 1350 according to another embodiment of the present invention. The body region 24 of memory celll 350 is also bounded in part by well region 20 of a second conductivity type, such as n-type, for example. The well region 20 may be formed at only two sides along gate length direction, as illustrated in FIG. 22B. However, the body region 24 of memory cell 1350 is not physically bounded at the bottom by a buried layer region. As illustrated in FIGS. 22A-22B, in the absence of voltage bias applied to the memory cell 1350, the body region 24 of memory cell 1350 is electrically connected to the substrate region 12.

As illustrated in FIGS. 23A-24B, upon application of a back bias to the well region 20 (through terminal 76), a depletion region 23 (enclosed in dashed lines) is formed in the junction of the body region 24 and the well region 20. It should be understood that the shape of depletion region boundary shown in FIGS. 23A-24B are for illustration purpose only. Rather, it should be understood that it conceptually illustrates the depletion boundaries from left and right well regions 20 merge and result in the body 24 to be floating. Depletion region 23 may extend into the body region 24 due to the reverse biased p-n junctions, and form an isolation for the body region 24. Therefore, the body region 24 of the memory cell 1350 is now floating and is now isolated from that of adjacent memory cells 1350. The body region 24 now forms a potential well which can store charge. The operation of memory cell 1350 where a depletion region forms an isolation of the body region 24 has been described for example in U.S. Pat. No. 9,029,922, "Memory Device Comprising of an Electrically Floating Body Transistor", which is hereby incorporated herein, in its entirety, by reference thereto. It is further noted that although an example of the formation of a depletion region is described with reference to FIGS. 23A-24B, that a depletion region can be formed in any of the previously described embodiments, as well as any embodiments described hereafter, by application of back bias to the semiconductor memory cell, be it through a back bias region and/or one or more well regions. In all of the embodiments described in the present invention, the depletion regions may be formed by the well regions 20 adjacent to the floating body region 24 on opposite sides of the floating body region 24. Furthermore, the depletion region may also be formed through an application of a back bias to the a buried well region 22 formed below the insulating layer 26, where the buried well region 22 is not contacting the insulating layer 26.

Figure 25:
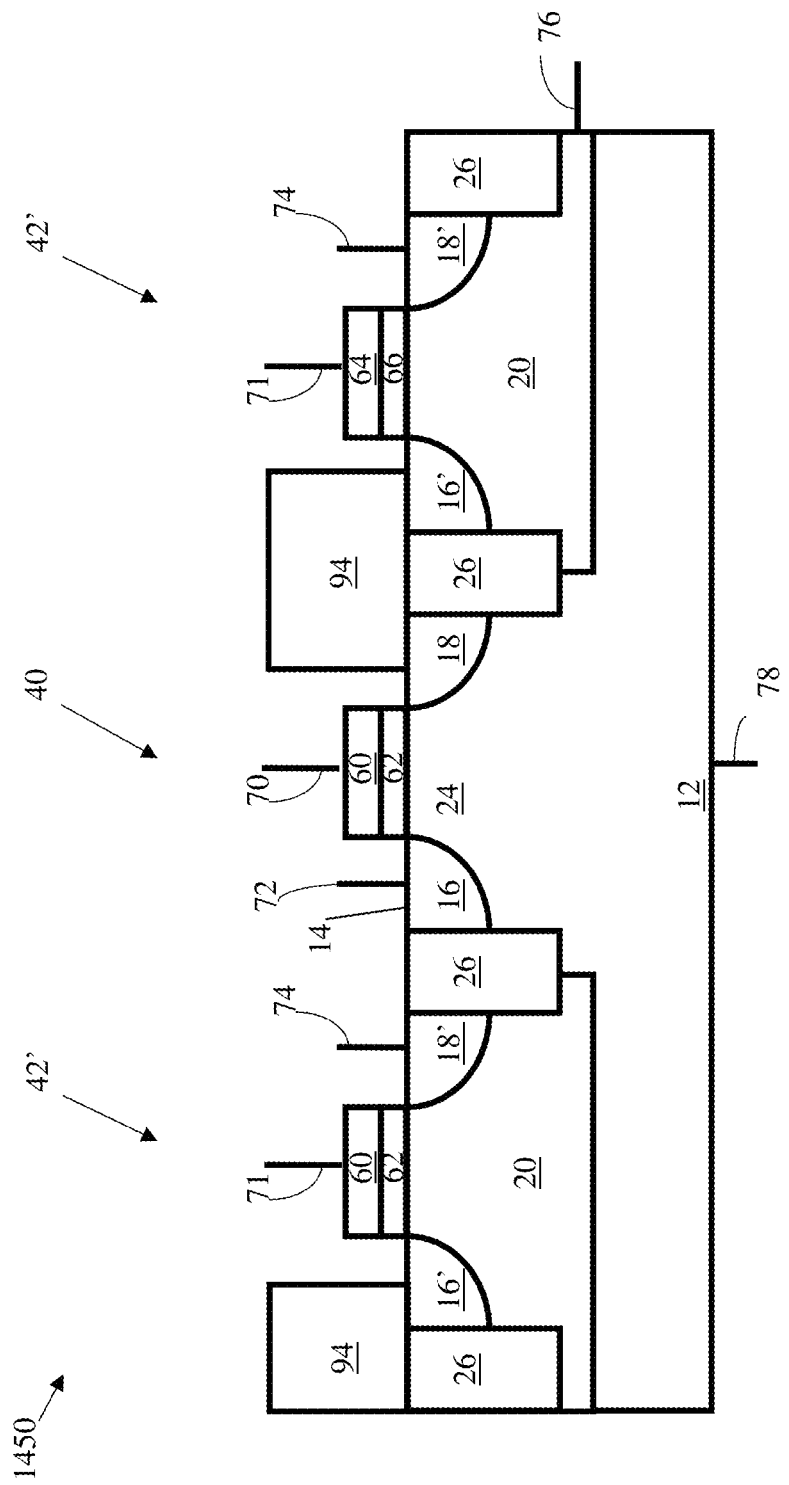
FIG. 25 is a schematic, cross-sectional illustration of a memory cell having a memory device and an access transistor having different conductivity types according to another embodiment of the present invention.

FIG. 25 illustrates memory cell 1450 according to another embodiment of the present invention. Memory cell 1450 comprises a memory device 40 and an access transistor 42' having different conductivity types. FIG. 25 also illustrates a portion of another memory cell 1450 where only the access transistor 42' is shown. The body region 24 of memory cell 1450 is bounded in part by well region 20 of a second conductivity type, such as n-type, for example. However, the body region 24 of memory cell 1450 is not bounded at the bottom by a buried layer region. As illustrated in FIG. 25, in the absence of voltage bias applied to the memory cell 1450, the body region 24 of memory cell 1350 is electrically connected to the substrate region 12.

Figure 26:
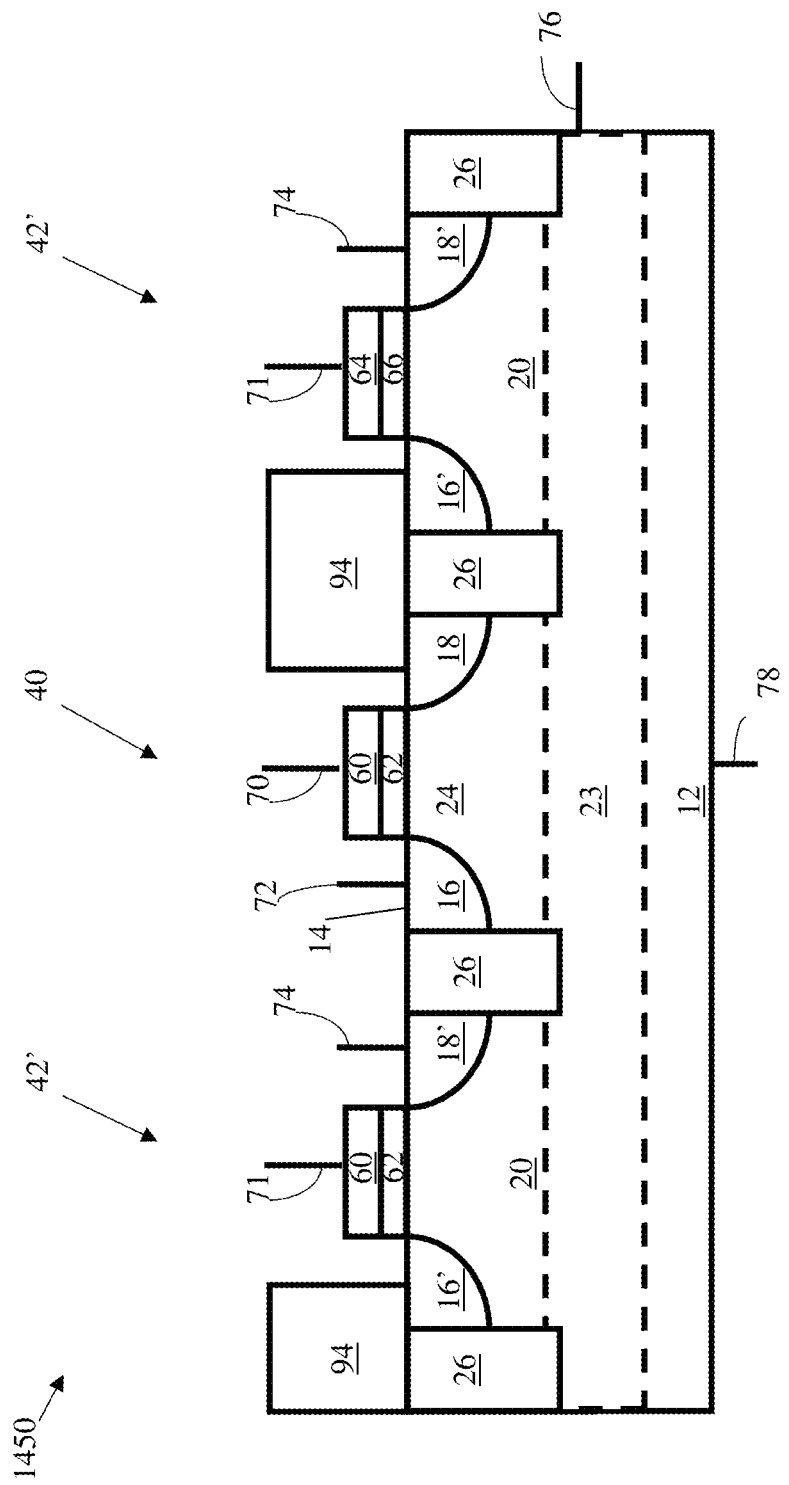
FIG. 26 schematically illustrates a depletion region that is formed as a result of a bias condition applied to a memory cell according to another embodiment of the present invention.

As illustrated in FIG. 26, upon application of a back bias to the well region 20 (through terminal 76), a depletion region 23 (enclosed in dashed lines) is formed in the junction of the body region 24 and the well region 20. Depletion region 23 may extend into the body region 24 due to the reverse biased p-n junctions, and form an isolation for the body region 24. Therefore, the body region 24 of the memory cell 1450 is now floating and is now isolated from that of adjacent memory cells 1450. The body region 24 now forms a potential well which can store charge.

Figure 27:
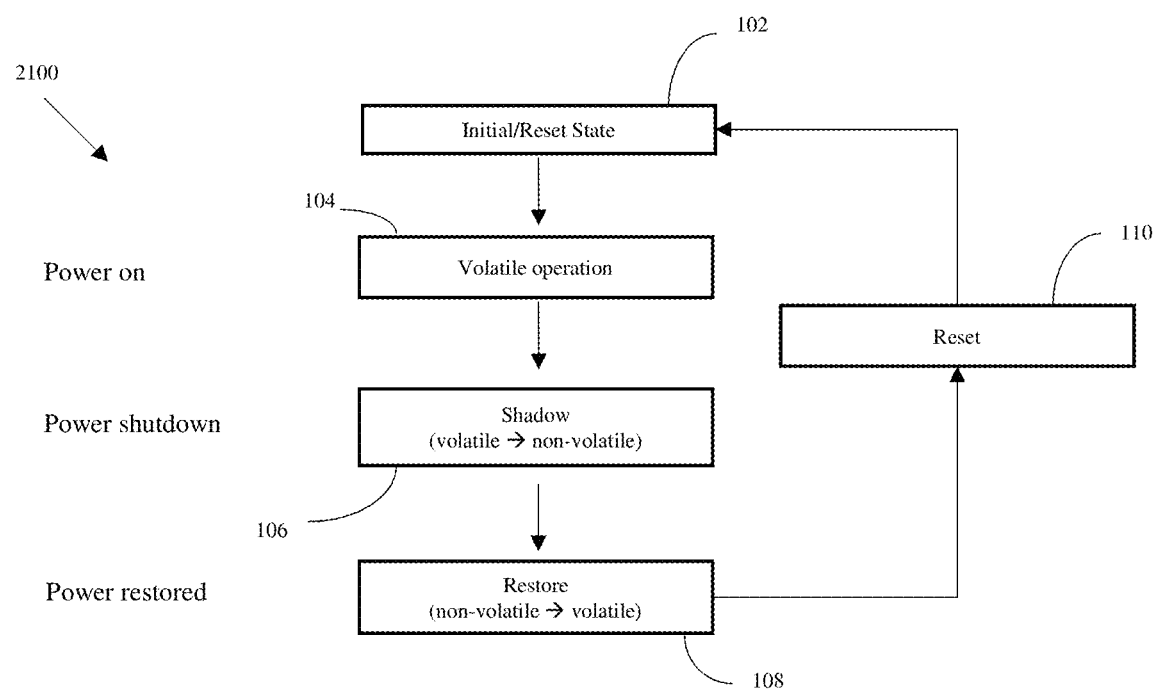
FIG. 27 is a flowchart illustrating operation of a memory device according to an embodiment of the present invention.

FIG. 27 is a flowchart 2100 illustrating operation of a memory device according to the present invention. At event 102, when power is first applied to the memory device, the memory device is placed in an initial state, in a volatile operational mode and the nonvolatile memory is set to a predetermined state. At event 104 the memory device operates in the same manner as a volatile memory, for example as an SRAM or DRAM memory cell. However, during power shutdown, or when power is inadvertently lost, or any other event that discontinues or upsets power to the memory device, the content of the volatile memory is loaded into non-volatile memory at event 106, during a process which is referred to here as "shadowing" (event 106), and the data held in volatile memory is lost. Shadowing can also be performed during backup operations, which may be performed at regular intervals during volatile operation 104 periods, and/or at any time that a user manually instructs a backup. During a backup operation, the content of the volatile memory is copied to the non-volatile memory while power is maintained to the volatile memory so that the content of the volatile memory also remains in volatile memory. Alternatively, because the volatile memory operation consumes more power than the non-volatile storage of the contents of the volatile memory, the device can be configured to perform the shadowing process anytime the device has been idle for at least a predetermined period of time, thereby transferring the contents of the volatile memory into non-volatile memory and conserving power. As one example, the predetermined time period can be about thirty seconds, but of course, the invention is not limited to this time period, as the device could be programmed with virtually any predetermined time period.

After the content of the volatile memory has been moved during a shadowing operation to nonvolatile memory, the shutdown of the memory device occurs, as power is no longer supplied to the volatile memory. At this time, the memory device retains the stored data in the nonvolatile memory. Upon restoring power at event 108, the content of the nonvolatile memory is restored by transferring the content of the non-volatile memory to the volatile memory in a process referred to herein as the "restore" process, after which, upon resetting the memory device at event 110, the memory device may be reset to the initial state (event 102) and again operates in a volatile mode, like an SRAM or DRAM memory device, event 104.

Figure 28:
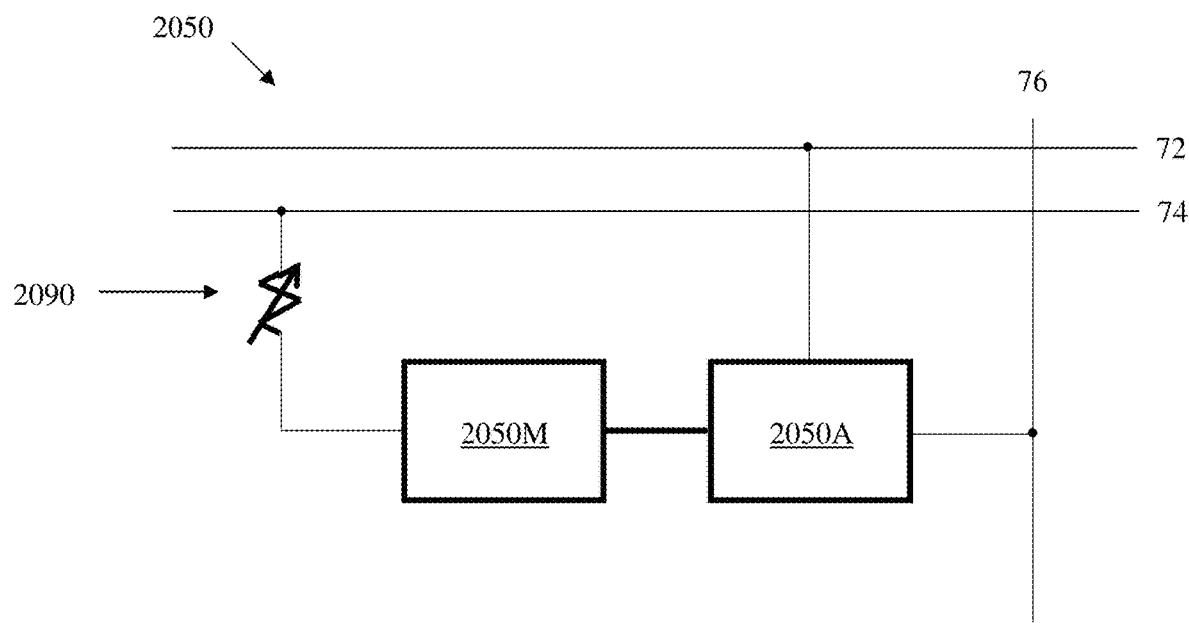
FIG. 28 schematically illustrates a memory cell which comprises a memory device and an access device that are connected in series, and a resistive change element connected in series to the memory device, according to an embodiment of the present invention.

FIG. 28 shows an illustrative, non-exclusive example of a memory cell 2050, according to an embodiment of the present invention. Cell 2050 comprises access device 2050A and memory device 2050M connected in series, as described for example in Widjaja-4, which is hereby incorporated herein, in its entirety, by reference thereto, as well as memory cells 450, 850, 300, 950, 1250, 1250F, 1450 according to the embodiment of the present invention; and a resistive change element 2090 connected in series to memory device 2050M. Memory device 2050M functions to store the state of the memory cell 2050 in a volatile memory operation mode, and is accessed through the access device 2050A, while resistive change element 2090 functions to store the state of the memory cell 2050 in a non-volatile memory operation mode.

Figure 29:
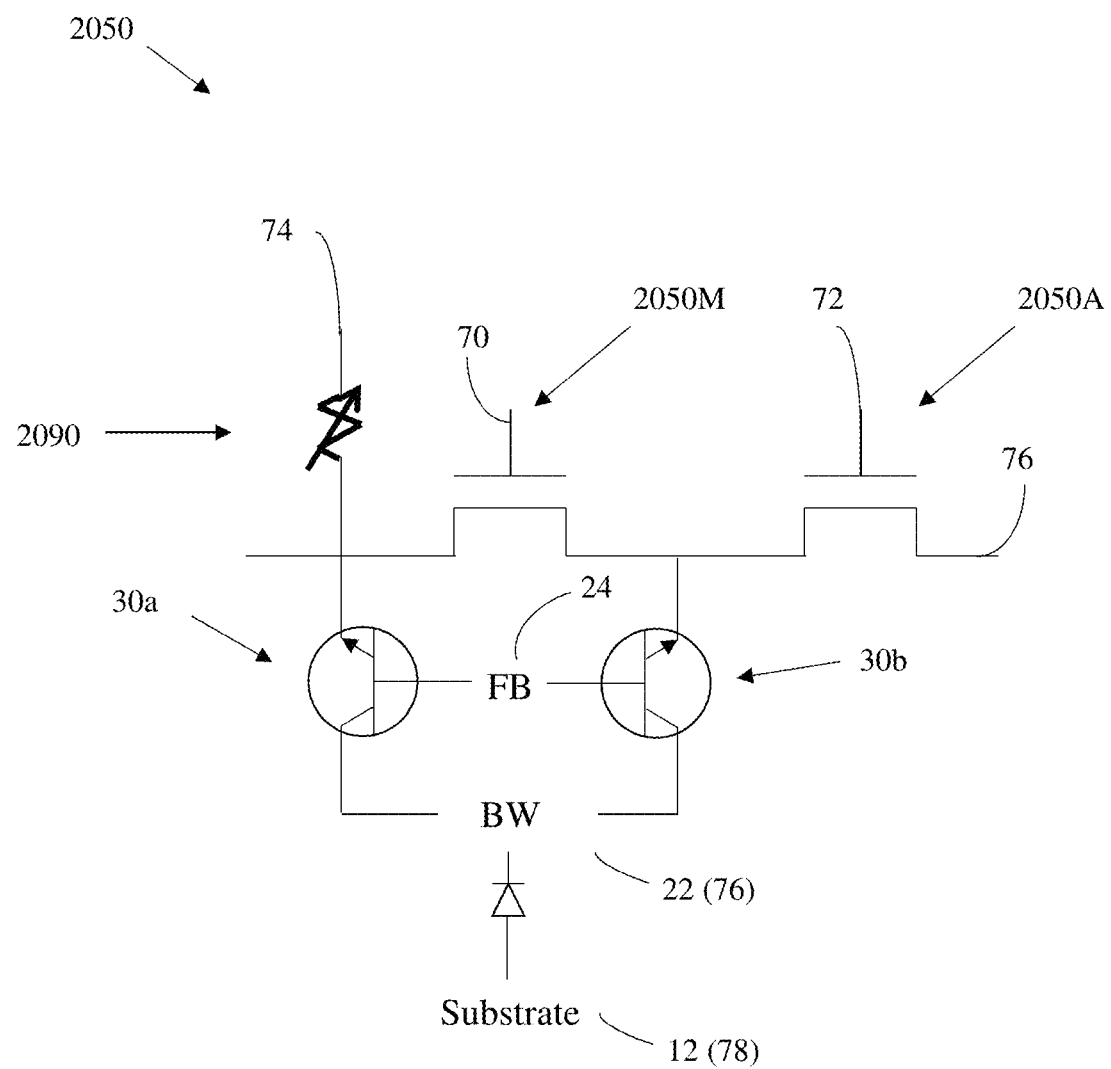
FIG. 29 schematically illustrates an equivalent circuit representation of the memory cell of FIG. 28, where the memory device is a bi-stable floating body device, according to an embodiment of the present invention.

FIG. 29 illustrates an equivalent circuit representation of memory cell 2050 according to an embodiment of the present invention where the memory device 2050M is a bi-stable floating body device, for example as described in Widjaja-1, Widjaja-2, and Widjaja-3, as well as memory cell 50, 1150, 1350 according to the embodiment of the present invention, and where access device 2050A is a metal-oxide-semiconductor (MOS) transistor.

Figure 30:
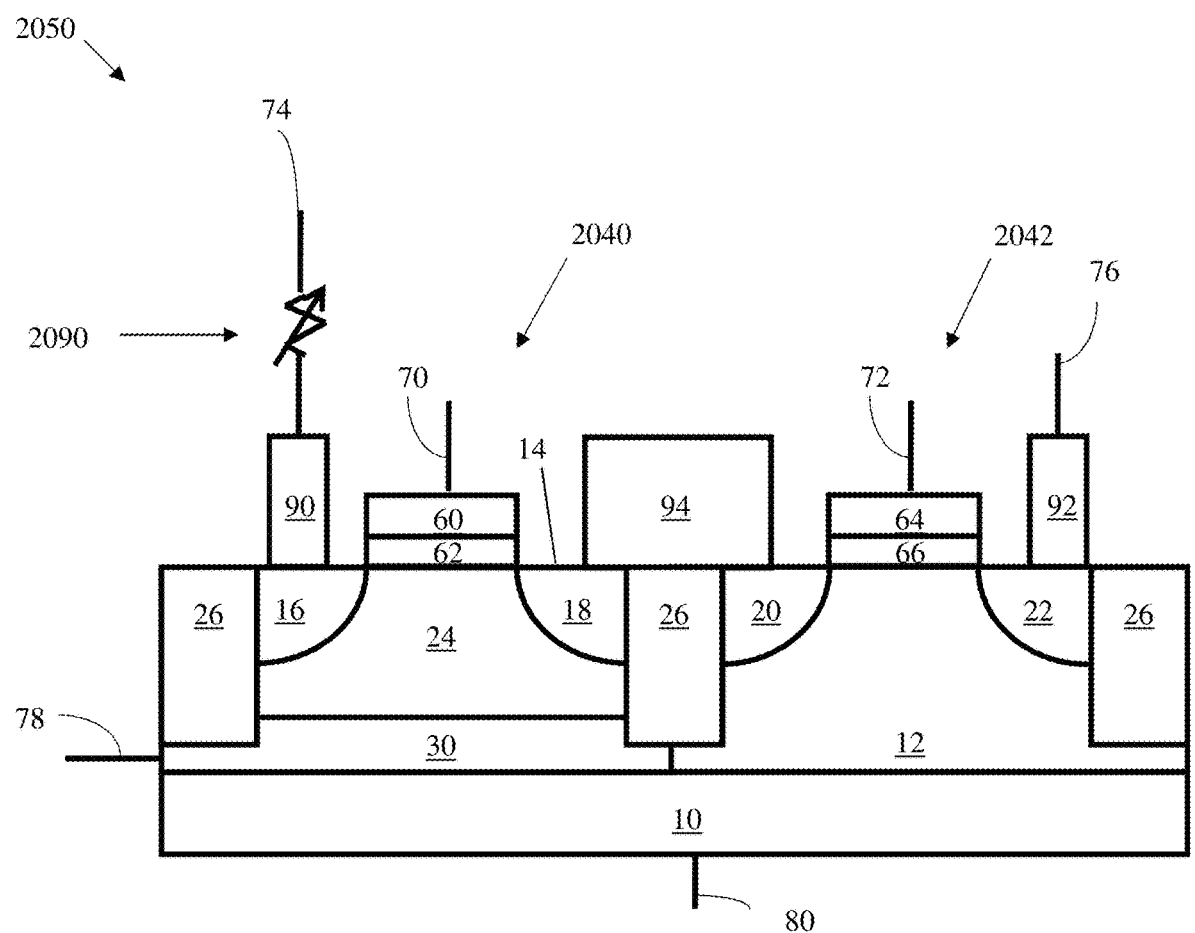
FIG. 30 is a schematic illustration of a memory cell according to an embodiment of the present invention.

A schematic cross-sectional view of a memory cell 2050 according to an embodiment of the present invention is shown in FIG. 30. Memory cell 2050 comprises two transistors: memory device 2050M having transistor 2040 having an electrically floating body 24 and access device 2050A having access transistor 2042. Memory cell 2050 includes a substrate 10 of a first conductivity type such as p-type, for example. Substrate 10 is typically made of silicon, but may also comprise, for example, germanium, silicon germanium, gallium arsenide, carbon nanotubes, or other semiconductor materials. In some embodiments of the invention, substrate 10 can be the bulk material of the semiconductor wafer. In other embodiments, substrate 10 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate 10 will usually be drawn as the semiconductor bulk material as it is in FIG. 30.

Floating body transistor 2040 also comprises a buried layer region 30 of a second conductivity type, such as n-type, for example; a floating body region 24 of the first conductivity type, such as p-type, for example; and source/drain regions 16 and 18 of the second conductivity type, such as n-type, for example.

Buried layer 30 may be formed by an ion implantation process on the material of substrate 10. Alternatively, buried layer 30 can be grown epitaxially on top of substrate 10.

The floating body region 24 of the first conductivity type is bounded on top by surface 14, source line region 16, drain region 18, and insulating layer 62, on the sides by insulating layer 26, and on the bottom by buried layer 30. Floating body 24 may be the portion of the original substrate 10 above buried layer 30 if buried layer 30 is implanted. Alternatively, floating body 24 may be epitaxially grown. Depending on how buried layer 30 and floating body 24 are formed, floating body 24 may have the same doping as substrate 10 in some embodiments or a different doping, if desired in other embodiments.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Insulating layers 26 (like, for example, shallow trench isolation (STI)), may be made of silicon oxide, for example, though other insulating materials may be used. Insulating layers 26 insulate floating body transistor 2040 from adjacent floating body transistor 2040 and adjacent access transistor 2042. The bottom of insulating layer 26 may reside inside the buried region 30 allowing buried region 30 to be continuous as shown in FIG. 30. Alternatively, the bottom of insulating layer 26 may reside below the buried region 30. This requires a shallower insulating layer 28, which insulates the floating body region 24, but allows the buried layer 30 to be continuous in the perpendicular direction of the cross-sectional view shown in FIG. 30. For simplicity, only memory cell 2050 with continuous buried region 30 in all directions will be shown from hereon.

Access transistor 2042 comprises a well region 12 of the first conductivity type, such as p-type, source region 20 and bit line region 22 of the second conductivity type, such as n-type. The well region 12 of the first conductivity type is electrically connected to the substrate region 10, and is therefore not floating. A gate 64 is positioned in between the source region 20 and the bit line region 22. The gate 64 is insulated from the well region 12 by an insulating layer 66. Insulating layer 66 may be made of silicon oxide and/or other dielectric materials, including high-K dielectric materials, such as, but not limited to, tantalum peroxide, titanium oxide, zirconium oxide, hafnium oxide, and/or aluminum oxide. The gate 64 may be made of, for example, polysilicon material or metal gate electrode, such as tungsten, tantalum, titanium and their nitrides.

The drain region 18 of the floating body transistor 2040 is connected to the source region 20 of the access transistor 2042 through a conductive element 94. Conductive element 90 connects the source line region 16 of the floating body transistor 2040 (which may be referred to as the source line region 16 of the memory device 50 interchangeably) to the resistive change element 2090, which in turn is connected to the source line (SL) terminal 74. Conductive element 92 connects the bit line region 22 of the access transistor 2042 (which may be referred to as the bit line region 22 of the memory device 2050 interchangeably) to the bit line (BL) terminal 76. The conductive elements 90, 92, and 94 may be formed of, but not limited to, tungsten or silicided silicon.

A resistance change memory element 2090 is positioned above one of the region 16 having second conductivity type and connected to SL terminal 74. The resistance change memory element 2090 is shown as a variable resistor, and may be formed from phase change memory such as chalcogenide, unipolar resistive memory element, conductive bridging memory, metal oxide memory, bipolar resistive memory element, such as transition metal oxides, ferroelectric, ferromagnetic materials, magnetoresistive, and spin-transfer torque magnetic materials.

Figure 31:
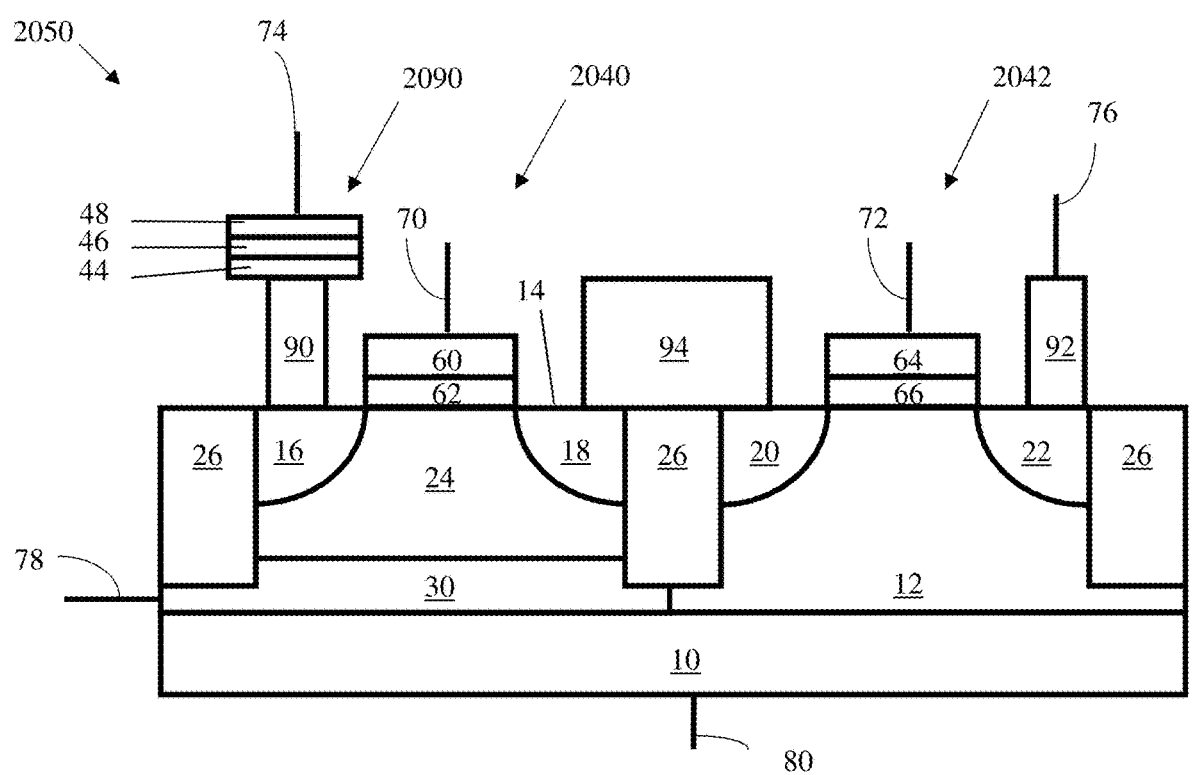
FIG. 31 is a schematic illustration of a memory cell according to another embodiment of the present invention.

A non-limiting embodiment of the memory cell 2050 is shown in FIG. 31. The resistance change memory element 2090 in this embodiment includes a bottom electrode 44, a resistance change material 46 and a top electrode 48. Resistance change memory element 2090 is connected to the second conductivity region 16 on the substrate 12 through a conductive element 90. The resistance change material 46 may be connected to an address line (such as SL terminal 74 in FIG. 31) through electrode 48 formed from a conductive material. The conductive element 90 may comprise tungsten or silicided silicon materials. Electrodes 44, 48 may be formed from one or more conductive materials, including, but not limited to titanium nitride, titanium aluminum nitride, or titanium silicon nitride. Resistance change material 46 is a material in which properties, such as electrical resistance, can be modified using electrical signals.

For the case of phase change memory elements, the resistivity depends on the crystalline phase of the material, while for the metal oxide materials, the resistivity typically depends on the presence or absence of conductive filaments. A crystalline phase of a phase change type resistive change material exhibits a low resistivity (e.g., ~1 kΩ) state and an amorphous phase of that material exhibits a high resistivity state (e.g., >100 kΩ). Examples of phase change material include alloys containing elements from Column VI of the periodic table, such as GeSbTe alloys. Examples of metal-insulator-metal resistance change materials include a variety of oxides such as Nb2O5, Al2O3, Ta2O5, TiO2, and NiO and perovskite metal oxides, such as SrZrO3, (Pr,Ca)MnO3 and SrTiO3:Cr.

Resistive change material 46 may also be formed by bipolar resistive memory element, such as transition metal oxides, ferroelectric, ferromagnetic materials, magnetoresistive, and/or spin-transfer torque magnetic materials. The resistivity state of a bipolar resistive memory element depends on the polarity of the potential difference or current flow across the bipolar resistive memory element.

The resistive change memory element 2090 is electrically connected to the floating body transistor 2040 which comprises the first region 16, the floating body region 24, the second region 18, and the gate electrode 60. The separation distance between the volatile memory (i.e. the floating body transistor 2040) and the non-volatile memory (i.e. the resistive change memory element 2090) can be small, for example from about 90 nm to about 1 µm, preferably from about 90 nm to about 500 nm, more preferably from about 90 nm to about 100 nm if the resistive change element 2090 is located between the surface 14 and the bottom-most (or first) metal layer for a 28-nm technology, or less than 1 um if the resistive change element 2090 is located below the fourth metal layer for a 28-nm technology process, or less than 10 um, depending on for example which metal layer the addressable line (e.g. source line 74) is implemented at, as well as the process technology node.

In addition to the SL terminal 74 and BL terminal 76, memory cell 2050 also includes word line 1 (WL1) terminal 70, which is electrically connected to the gate 60 of the floating body transistor 2040, word line 2 (WL2) terminal 72, which is electrically connected to the gate 64 of the access transistor 2042, buried well (BW) terminal 78, which is electrically connected to the buried well region 30 of the floating body transistor 2040, and substrate (SUB) terminal 80, which is connected to the substrate region 10.

Figure 32:
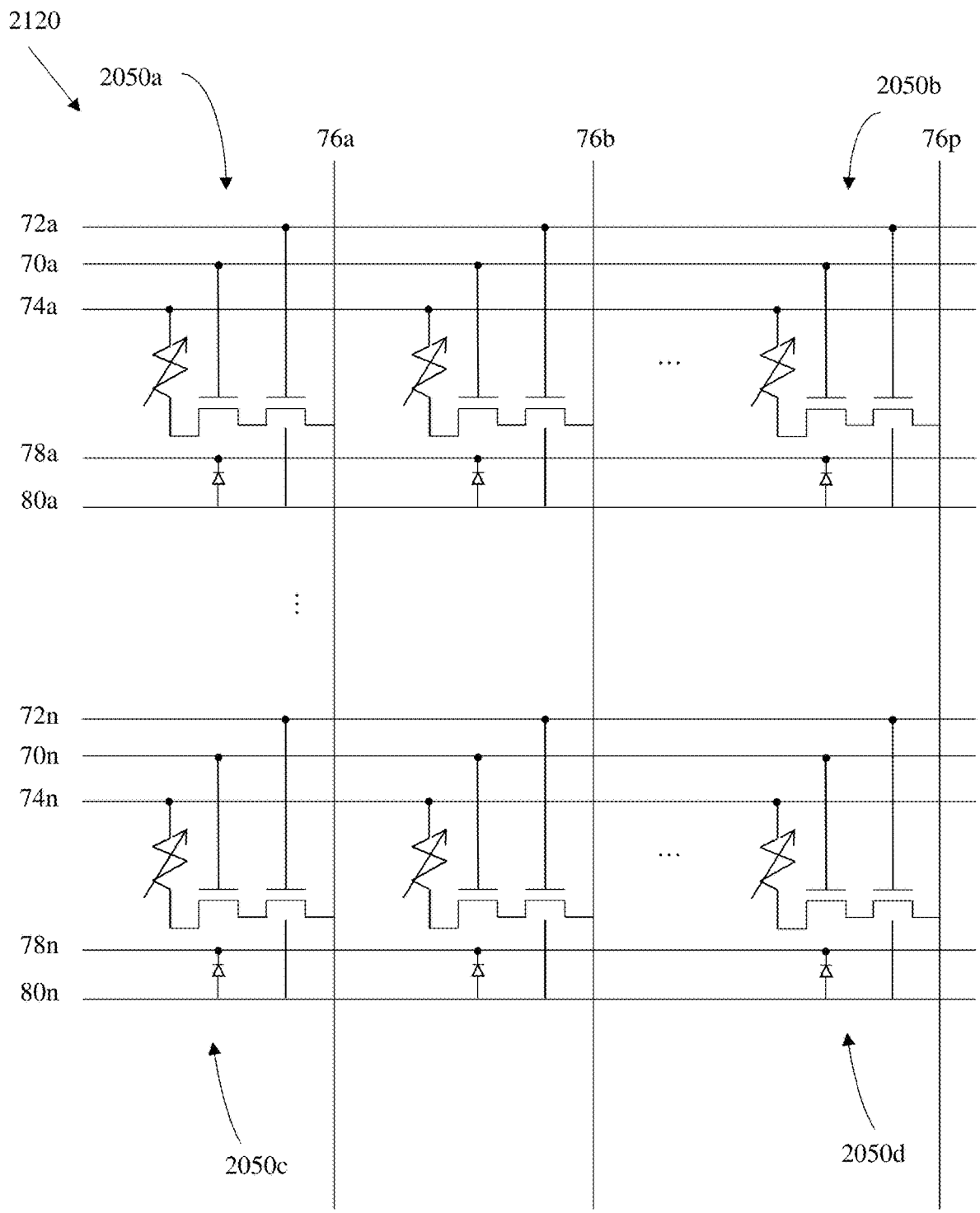
FIG. 32 schematically illustrates multiple cells of the type shown in FIG. 29 joined to make a memory array, according to an embodiment of the present invention.

A memory array 2120 comprising a plurality of the memory cells 2050 arranged in a rows and columns is illustrated in FIG. 32 (as an exemplary implementation of memory cell 2050 shown in FIG. 28). FIG. 32 shows four exemplary instances of memory cells 2050 being labeled as 2050a, 2050b, 2050c, and 2050d. In many, but not all, of the figures where exemplary array 2120 appears, representative memory cell 2050a will be representative of a "selected" memory cell 2050 when the operation being described has one (or more in some embodiments) selected memory cells 2050. In such figures, representative memory cell 2050b will be representative of an unselected memory cell 2050 sharing the same row as selected representative memory cell 2050a, representative memory cell 2050c will be representative of an unselected memory cell 2050 sharing the same column as selected representative memory cell 2050a, and representative memory cell 2050d will be representative of a memory cell 2050 sharing neither a row or a column with selected representative memory cell 2050a.

For simplicity, most of the descriptions that follow will use a MOS transistor as an example of the access device 2050A. However, it should be understood that the operations of the memory cells 2050 using a bipolar transistor as the access device 2050A follows the same principles. For simplicity, most of the description that follow will use a phase change memory element as an example of the resistive change element 2090. However, it should be noted that the operations of the memory cells 2050 using other resistive memory element follows the same principles.

Present in FIG. 32 are WL1 terminals 70a through 70n, WL2 terminals 72a through 72n, SL terminals 74a through 74n, BW terminals 78a through 78n, SUB terminals 80a through 80n, and BL terminals 76a through 76p, where the subscript "a" refers to the integer 1, and subscripts "n" and "p" refers to integers greater than "1" and wherein all integers between 1 and n and between 1 and p are included, but not shown, so as to simplify the drawing. Each of the WL1, WL2, SL, and BW terminals are shown associated with a single row of memory cells 2050 and each of the BL terminals 76 is associated with a single column of memory cells 2050. Persons of ordinary skill in the art will appreciate that many other organizations and layouts of memory array 2120 are possible, for example, only one common SUB terminal 80 is present throughout a segment of the memory array 2120 or throughout the entire memory array 2120. Similarly, other terminals may be segmented or buffered, while control circuits such as word decoders, column decoders, segmentation devices, sense amplifiers, write amplifiers, etc., may be arrayed around array 2120 or inserted between sub-arrays of array 2120. Thus the exemplary embodiments, features, design options, etc., described are not limiting in any way.

When power is applied to memory cell 2050, cell 2050 is in volatile mode operation and operates like a bi-stable floating body device during performance of operations such as: holding, read, write logic-1 and write logic-0, as described for example in U.S. Patent Application Publication No. 2010/00246284 to Widjaja et al., titled "Semiconductor Memory Having Floating Body Transistor and Method of Operating", U.S. Patent Application Publication No. 2010/0034041, "Method of Operating Semiconductor Memory Device with Floating Body Transistor Using Silicon Controlled Rectifier Principle", U.S. Patent Application Publication No. 2012/0217549, "Asymmetric Semiconductor Memory Device Having Electrically Floating Body Transistor", and U.S. patent application Ser. No. 13/746,523, "Memory Device Having Electrically Floating Body", each of which is incorporated herein, in its entirety, by reference thereto. In one embodiment, the non-volatile memory element 2090 is initialized to have a low resistivity state.

Figure 33:
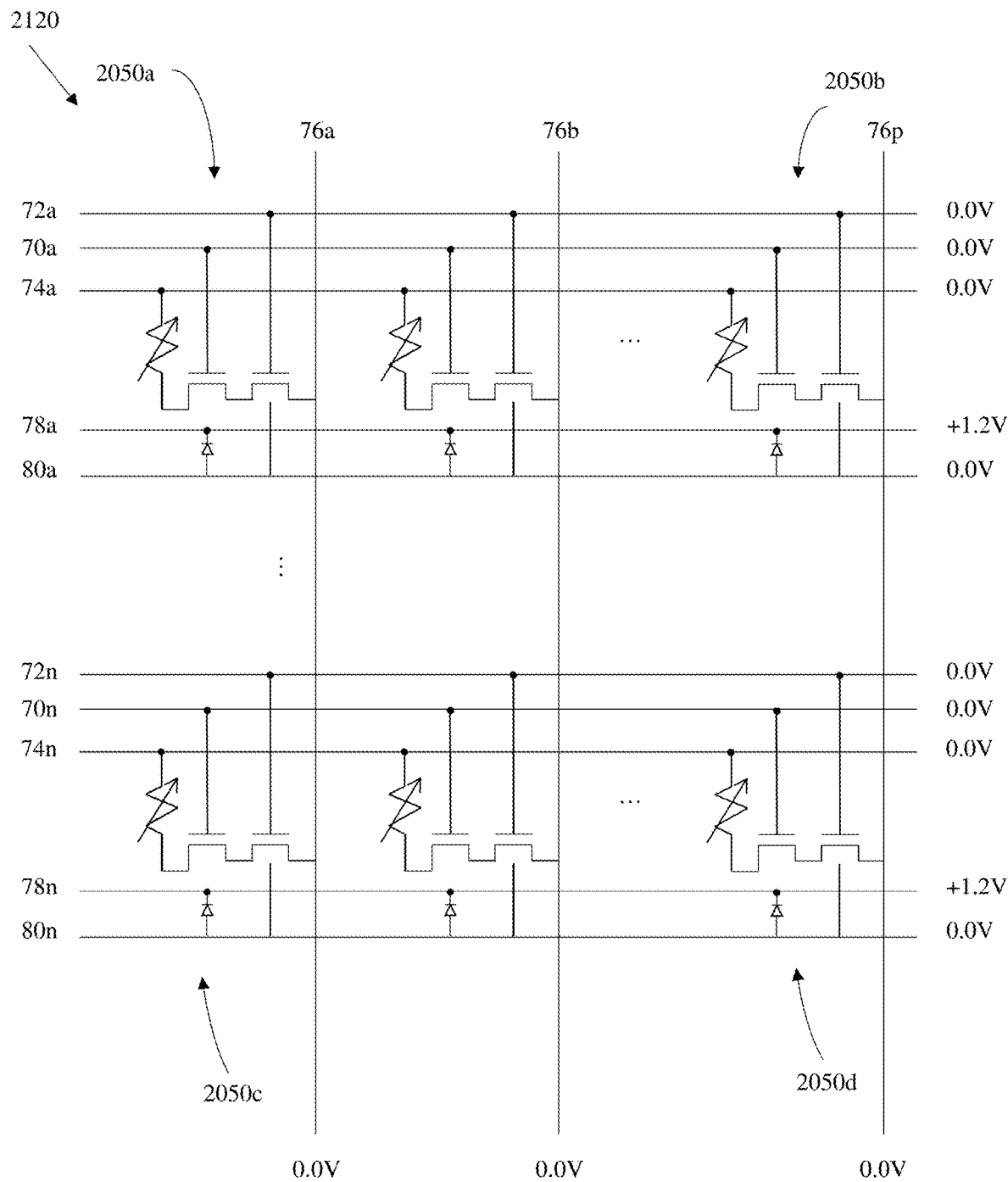
FIG. 33 schematically illustrates performance of a holding operation on a memory array according to an embodiment of the present invention.
Figure 34:
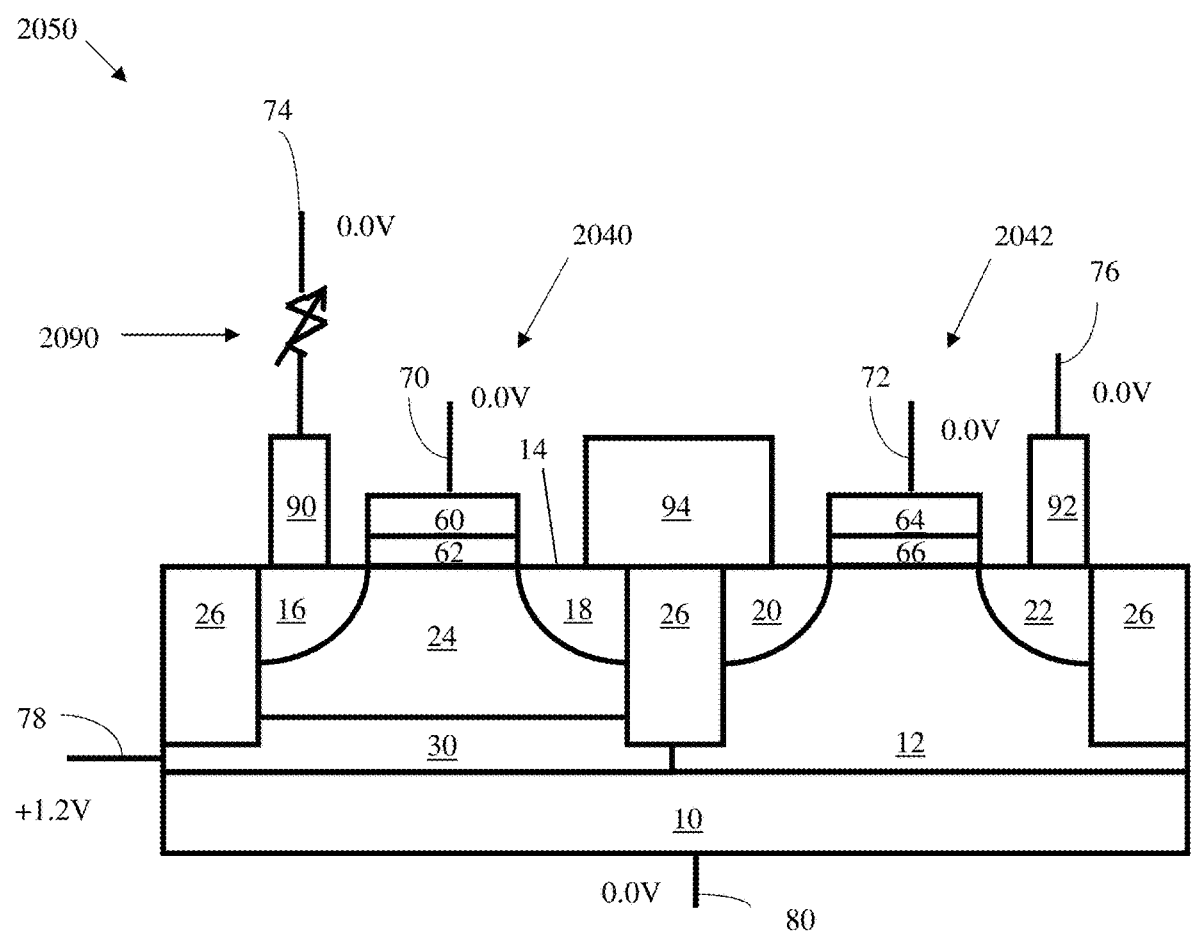
FIG. 34 illustrates and bias conditions applied on the terminals of a selected memory cell according to an embodiment of the present invention.

FIGS. 33 and 34 illustrate a holding operation being performed on memory array 2120 and on a selected memory cell 2050, respectively. The holding operation is performed by applying a positive back bias to the BW terminal 78, zero or low negative bias on the WL1 terminal 70 and WL2 terminal 72 to turn-off the channel regions of the floating body transistor 2040 and the access transistor 2042, and zero bias on the SL terminal 74, SUB terminal 80, and BL terminal 76. The positive back bias applied to the buried layer region 30 connected to the BW terminal 78 will maintain the state of the memory cell 2050 that it is connected to by maintaining the charge stored in the floating body region 24 of the corresponding floating body transistor 2040.

In one embodiment the bias conditions for the holding operation for memory cell 2050 are: 0.0 volts is applied to WL1 terminal 70, WL2 terminal 72, SL terminal 74, BL terminal 76, and SUB terminal 78, and a positive voltage like, for example, +1.2 volts is applied to BW terminal 78. In other embodiments, different voltages may be applied to the various terminals of memory cell 2050 as a matter of design choice and the exemplary voltages described are not limiting in any way.

Figure 35:
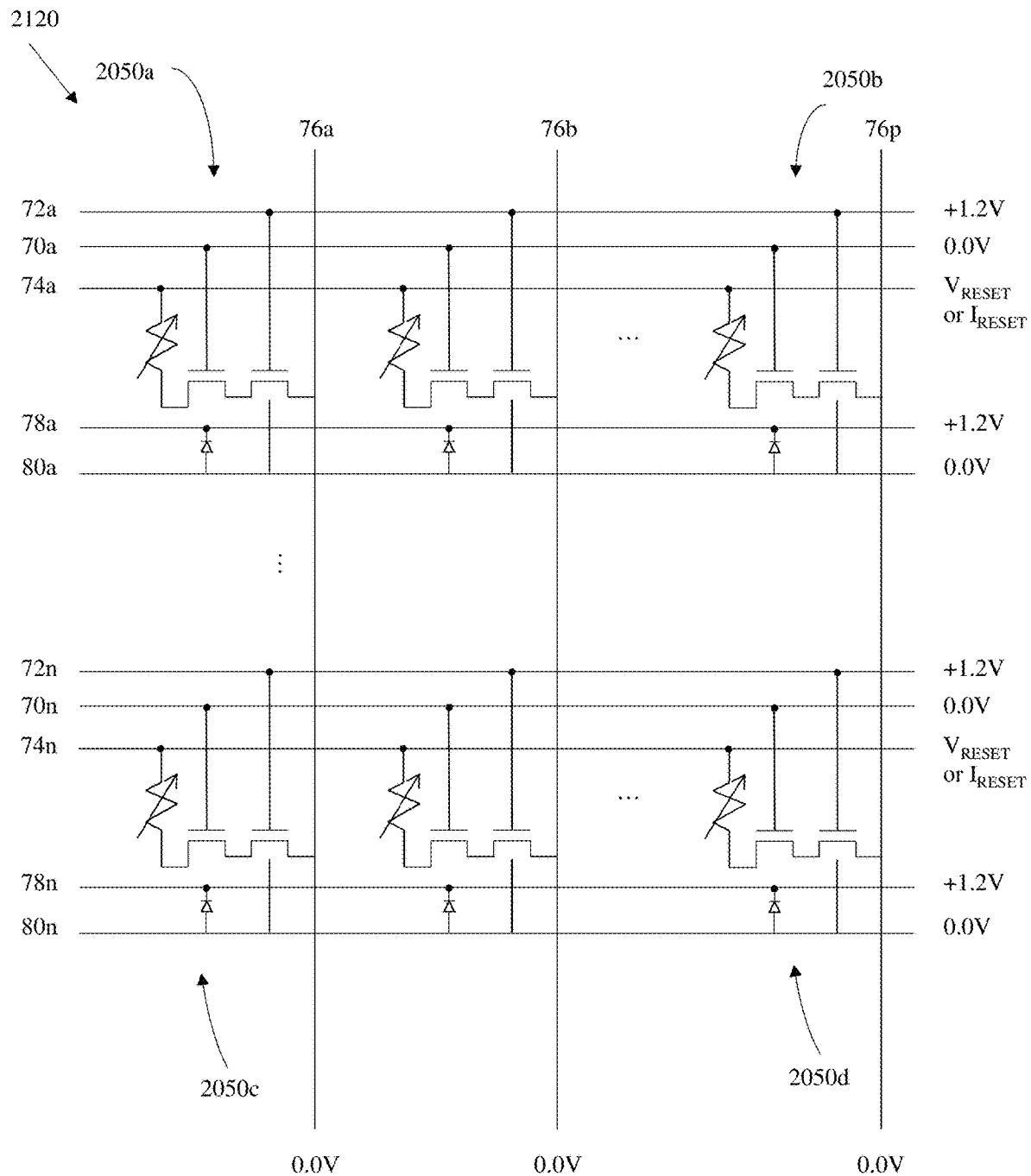
FIG. 35 schematically illustrates performance of a shadowing operation on a memory array according to an embodiment of the present invention.

When power down is detected, e.g., when a user turns off the power to cell 2050, or the power is inadvertently interrupted, or for any other reason, power is at least temporarily discontinued to cell 2050, data stored in the floating body region 24 is transferred to the resistance change memory 2090. This operation is referred to as "shadowing" and is described with reference to FIGS. 35, 36A, and 36B. The "shadowing" operation will be described using a phase change memory element as an example of the resistive change element 2090. However, it should be noted that the operations of the memory cells 2050 using other resistive memory element follows the same principles.

To perform a shadowing process, a positive voltage $V_{RESET}$ is applied to SL terminal 74 and a substantially neutral voltage is applied to BL terminal 76. A neutral voltage or slightly positive voltage is applied to WL1 terminal 70, a positive voltage is applied to WL2 terminal 72, a positive voltage is applied to BW terminal 78, and a substantially neutral voltage is applied to SUB terminal 80. These voltage levels can be driven by the appropriate circuitry controlling the memory cell array when the power shutdown is expected (such as during standby operation or when entering power savings mode) or from external capacitors in the event of abrupt and sudden power interruption.

Figure 36A:
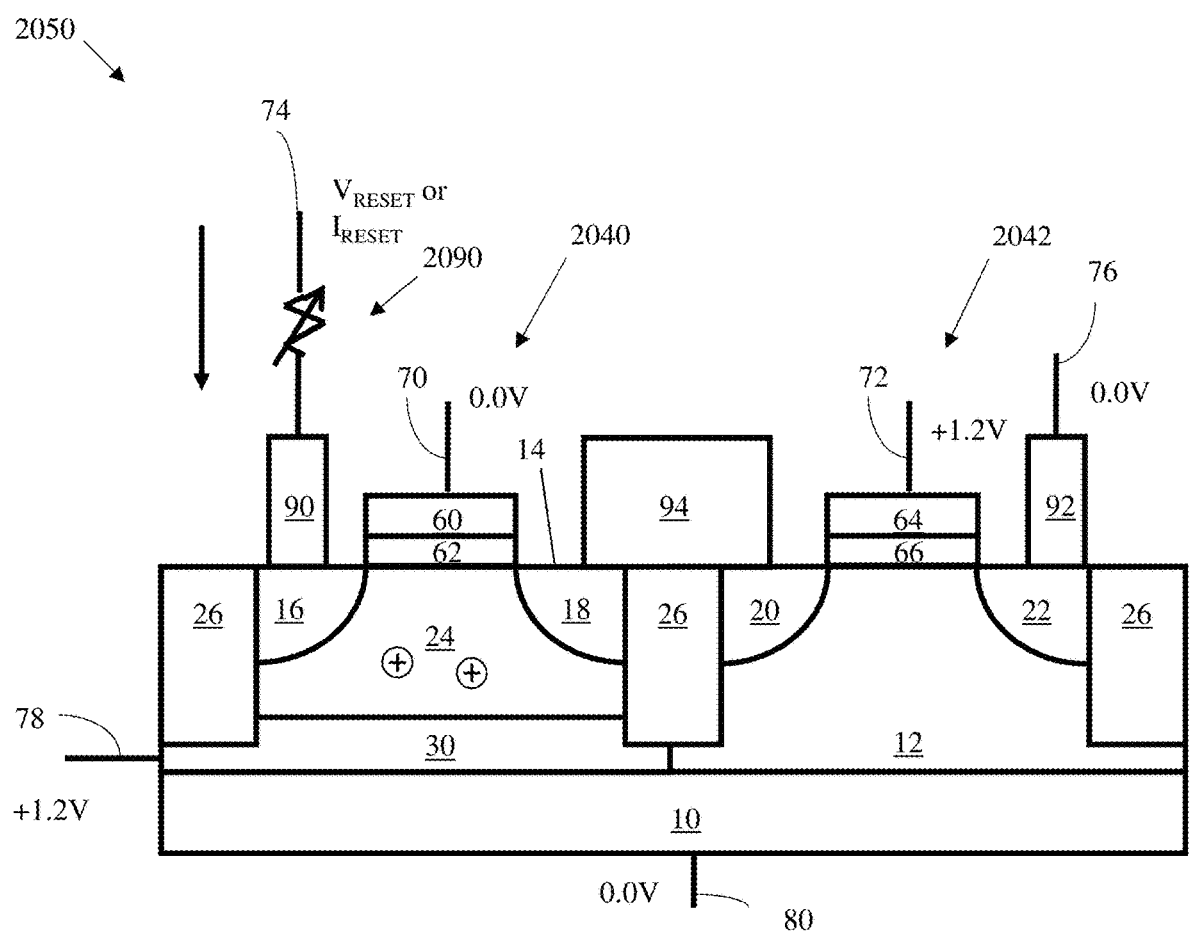
FIGS. 36A-36B show bias conditions applied on the terminals of a selected memory cell according to an embodiment of the present invention.

When the floating body has a positive potential, the bipolar transistor formed by the source line region 16, floating body 24, and drain region 18 will be turned on (FIG. 36A). The positive voltage applied to SL terminal 74 is controlled (e.g., varied to maintain a constant current $I_{RESET}$) such that the electrical current flowing through the resistance change memory 2090 is sufficient to change the state of the materials from a low resistivity state to a high resistivity state. In the case of phase change materials, this involves the change of the crystallinity of the chalcogenide materials from crystalline state to amorphous state, while in metal oxide materials, this typically involves the annihilation of conductive filaments. Accordingly, the non-volatile resistance change material will be in a high resistivity state when the volatile memory of cell 2050 is in state "1" (i.e. floating body 24 is positively charged).

Figure 36B:
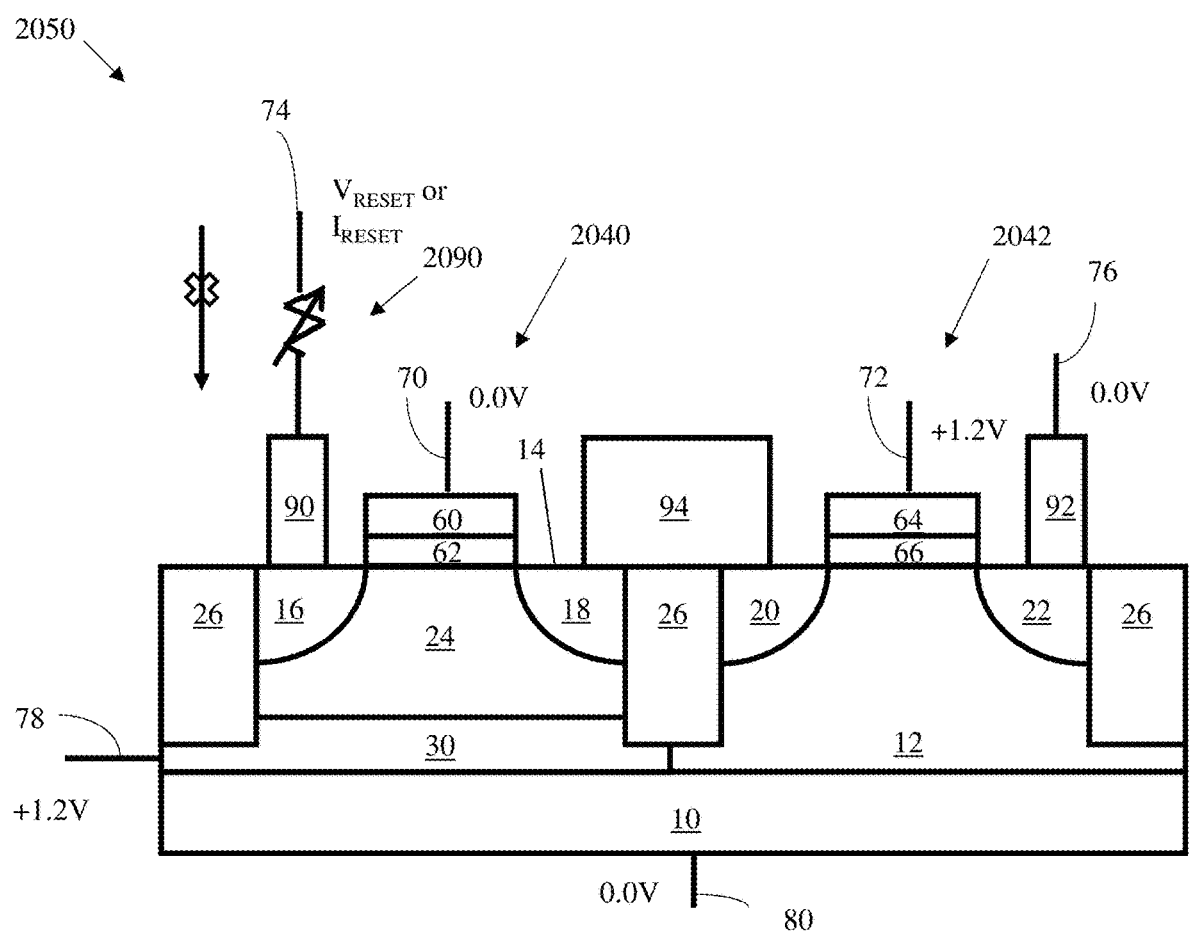
Figure 37:
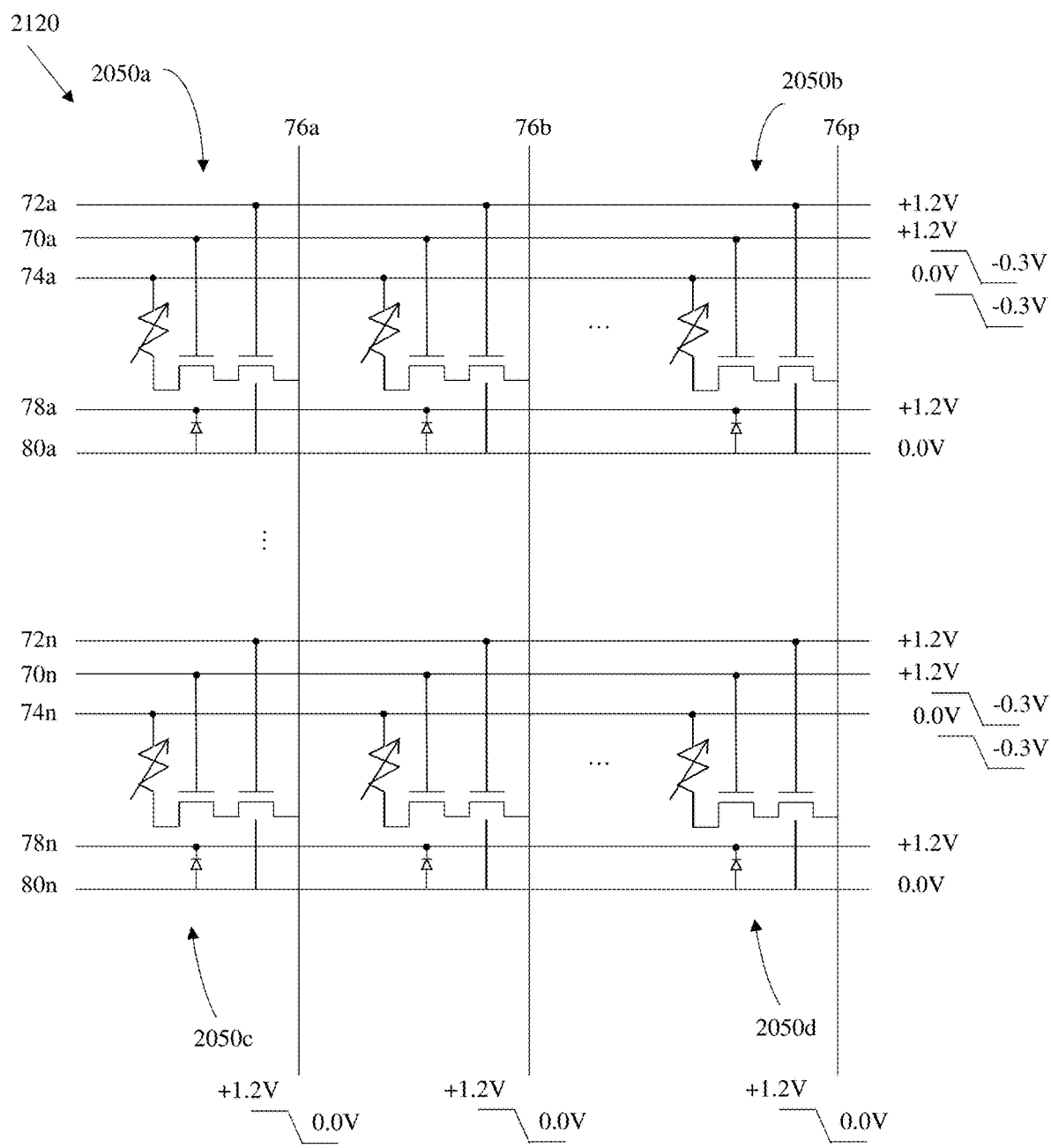
FIG. 37 schematically illustrates performance of a restore operation on a memory array according to an embodiment of the present invention.
Figure 38A:
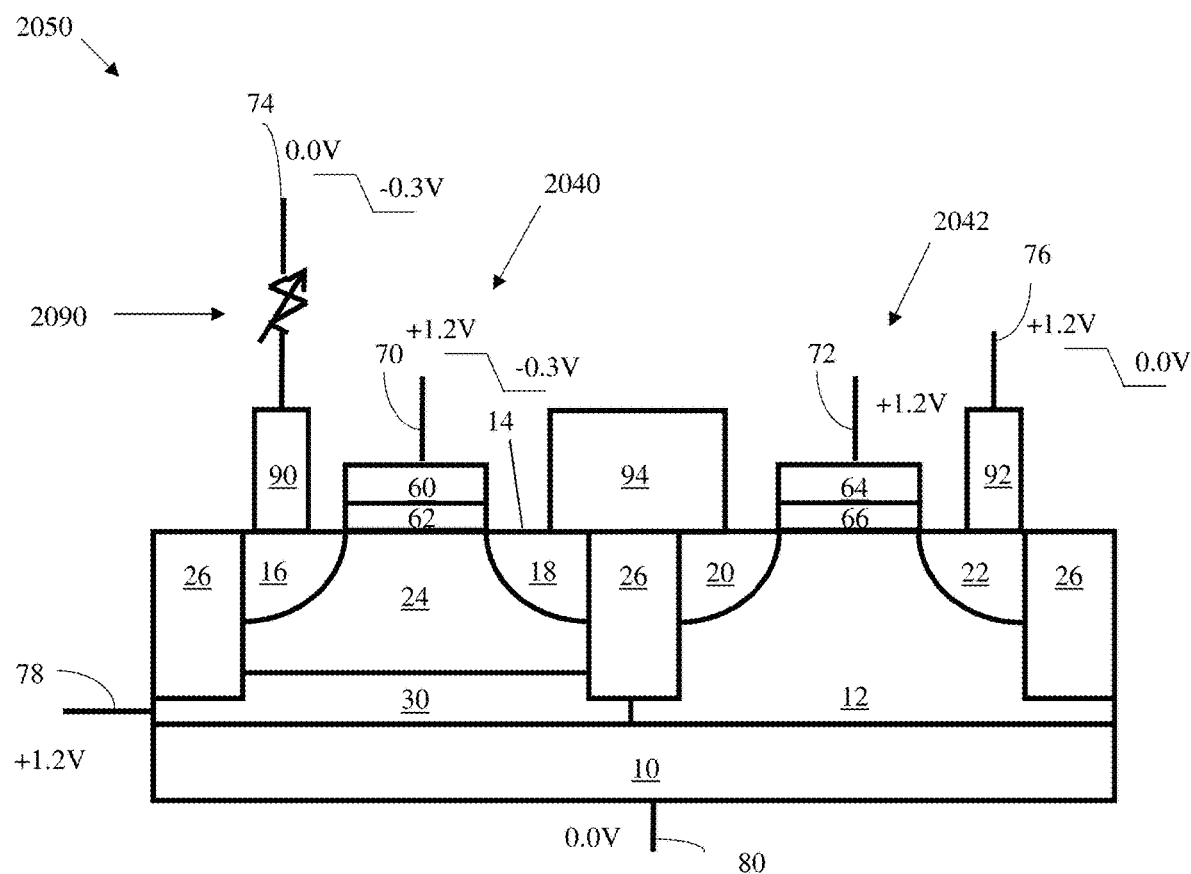
FIGS. 38A-38C show bias conditions applied on the terminals of a selected memory cell according to an embodiment of the present invention.
Figure 38B:
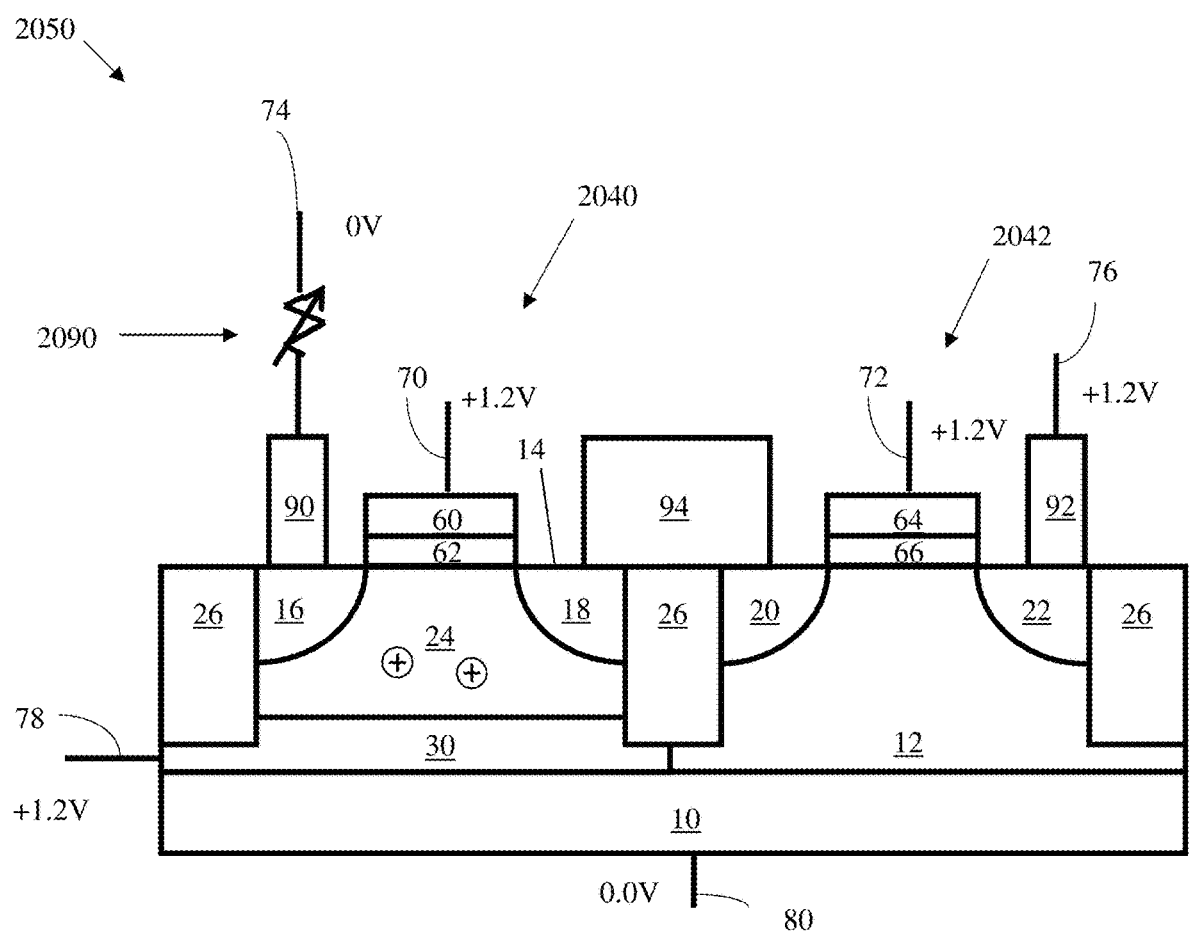
Figure 38C:
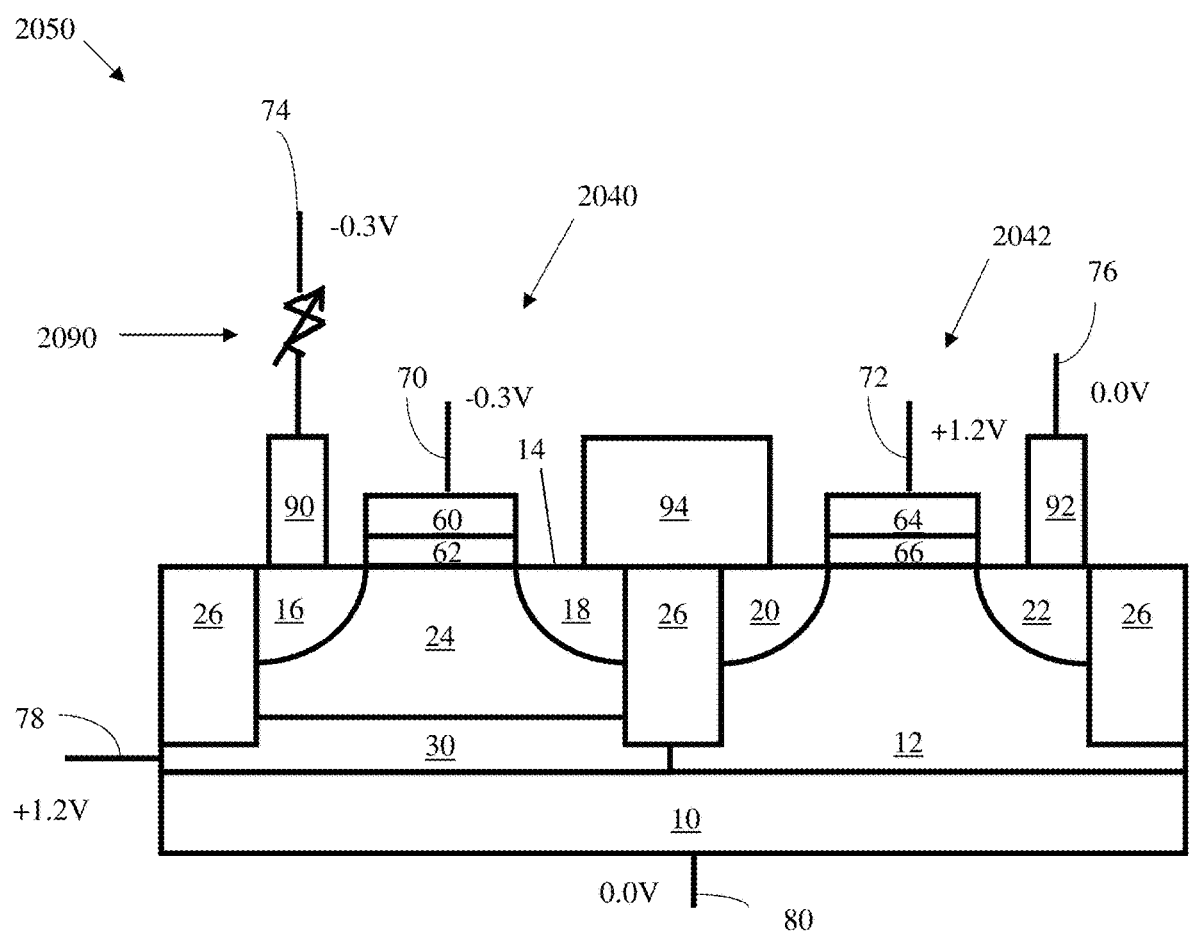

When the floating body is neutral or negatively charged, the bipolar transistor formed by the source line region 16, floating body 24, and drain region 18 will be turned off (FIG. 36B). Therefore, when voltages are applied as described above, no electrical current will flow through the resistance change memory 2090 and it will retain its low resistivity state. Accordingly, the non-volatile resistance change material will be in a low resistivity state when the volatile memory of cell 2050 is in state '0' (i.e. floating body is neutral or negatively charged).

In one particular non-limiting example of this embodiment, about 0.0 volts is applied to BL terminal 76, a constant current of about 700 µA is applied to SL terminal 74, about 0.0 volts is applied to WL1 terminal 70, about +1.2 volts is applied to WL2 terminal 72, about +1.2 volts is applied to BW terminal 78, and about 0.0 volts is applied to SUB terminal 80. However, these voltage and current levels may vary, while maintaining the relative relationships between the charges applied, as described above. For example, a positive voltage may be applied to WL1 terminal 70 to increase the current flow through the floating body transistor 2040. To change the non-volatile phase change memory from low resistivity state to high resistivity state, a current level between 600 µA and 1 mA can be used. Lower current will be needed as the phase change material is scaled to smaller geometry. The current levels employed in metal oxide systems vary greatly depending on the materials used, ranging from tens of microamperes to tens of milliamperes.

Note that this process occurs non-algorithmically, as the state of the floating body 24 does not have to be read, interpreted, or otherwise measured to determine what state to write the non-volatile resistance change memory 2090 to. Rather, the shadowing process occurs automatically, driven by electrical potential differences. Accordingly, this process is orders of magnitude faster than one that requires algorithmic intervention.

When power is restored to cell 2050, the state of the cell 2050 as stored on the non-volatile resistance change memory 2090 is restored into floating body region 24. The restore operation (data restoration from non-volatile memory to volatile memory) is described with reference to FIGS. 37, 38A-38C. In one embodiment, to perform the restore operation, a 2-phase waveform is applied to WL1 terminal 70, SL terminal 74, and BL terminal 76, a positive voltage is applied to WL2 terminal 72, a positive voltage is applied to BW terminal 78, and about zero voltage is applied to SUB terminal 80.

During the first phase of the restore operation (FIG. 38B), a positive voltage is applied to WL1 terminal 70, a positive voltage is applied to the BL terminal 76, and about zero voltage is applied to the SL terminal 74. In one particular non-limiting example of this embodiment, about +1.2 volts is applied to WL1 terminal 70, about +1.2 volts is applied to WL2 terminal 72, about +1.2 volts is applied to BL terminal 76, about 0.0 volts is applied to SL terminal 74, about +1.2 volts is applied to BW terminal 78, and about 0.0 volts is applied to SUB terminal 80. As a result, all of floating body transistor 2040 in the memory array 2120 will be written to state "1". Note that this process occurs non-algorithmically, as all the memory cells 2050 connected to the WL1 terminal 70, WL2 terminal 72, BL terminal 76, SL terminal 74, BW terminal 78, and SUB terminal 80 where this bias condition is applied to will be written to state "1".

In the second phase of the restore operation (FIG. 38C), a negative voltage is applied to WL1 terminal 70, a negative voltage is applied to SL terminal 74, and about zero voltage is applied to BL terminal 76. In one particular non-limiting example of this embodiment, about −0.3 volts is applied to WL1 terminal 70, about +1.2 volts is applied to WL2 terminal 72, about 0.0 volts is applied to BL terminal 76, about −0.3 volts is applied to SL terminal 74, about +1.2 volts is applied to BW terminal 78, and about 0.0 volts is applied to SUB terminal 80.

If the resistance change memory 2090 is in a low resistivity state, the negative voltage applied to the SL terminal 74 will evacuate holes in the floating body 24 because the p-n junction formed by the floating body 24 and the source line region 16 is forward-biased. Consequently, the volatile memory state of memory cell 2050 will be restored to state "0" upon completion of the restore operation, restoring the state that the memory cell 2050 held prior to the shadowing operation. If the resistance change memory 2090 is in a high resistivity state, no current flows through the resistance change memory 2090, hence the positive charge in the floating body region 24 will not be evacuated. As a result, the memory cell 2050 will remain in state "1" (as a result of the first phase of the restore operation), which restores the volatile state of memory cell 2050 prior to the shadowing operation.

Note that at the conclusion of the restore operation, the volatile state of memory cells 2050 prior to the shadowing operation is restored. Note also that this process occurs non-algorithmically, as the state of the non-volatile resistance change memory 2090 does not have to be read, interpreted, or otherwise measured to determine what state to restore the floating body 24 to. Rather, the restoration process occurs automatically, driven by resistivity state differences. Accordingly, this process is orders of magnitude faster than one that requires algorithmic intervention.

Figure 39:
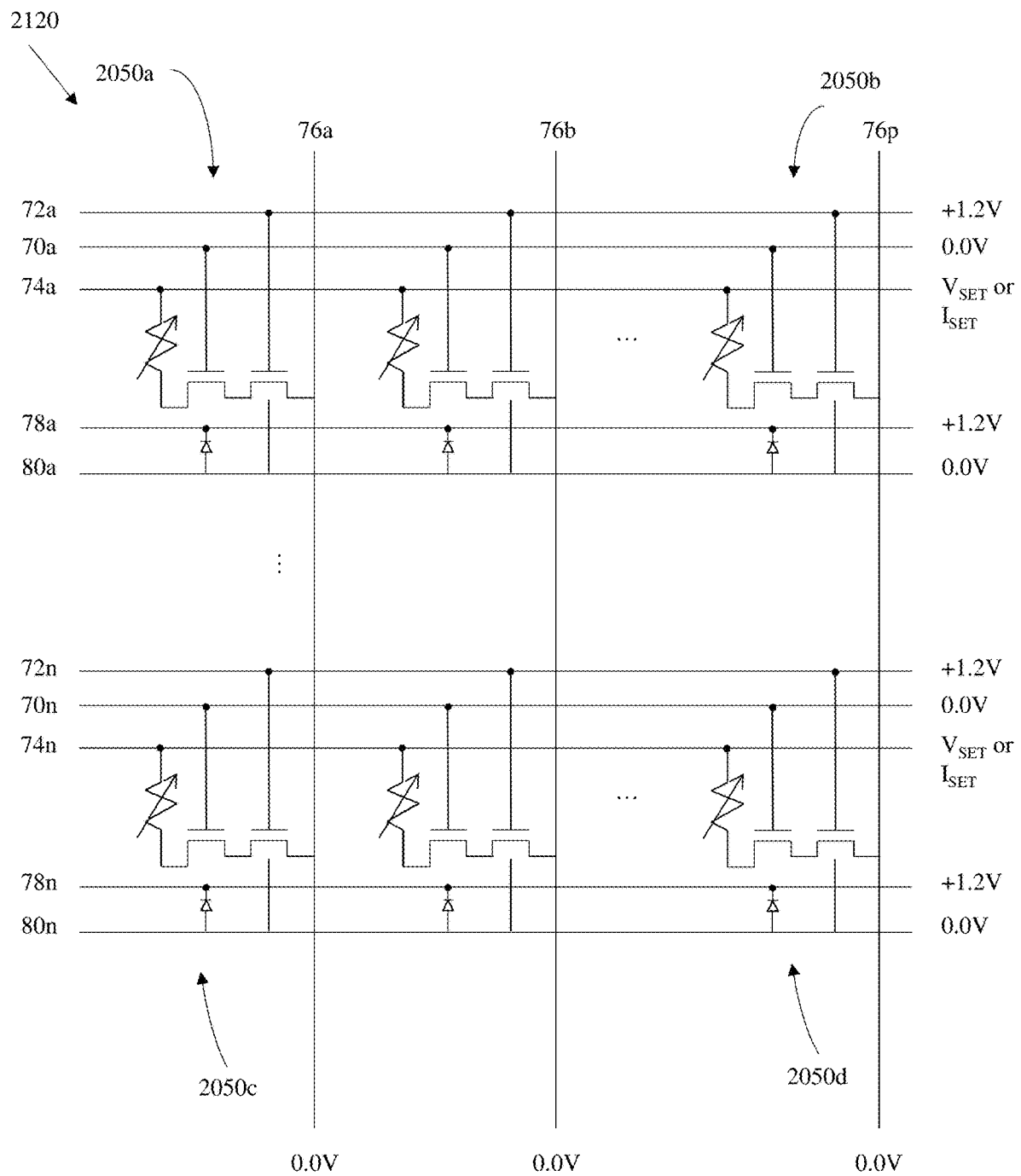
FIG. 39 schematically illustrates performance of a reset operation on a memory array according to an embodiment of the present invention.
Figure 40A:
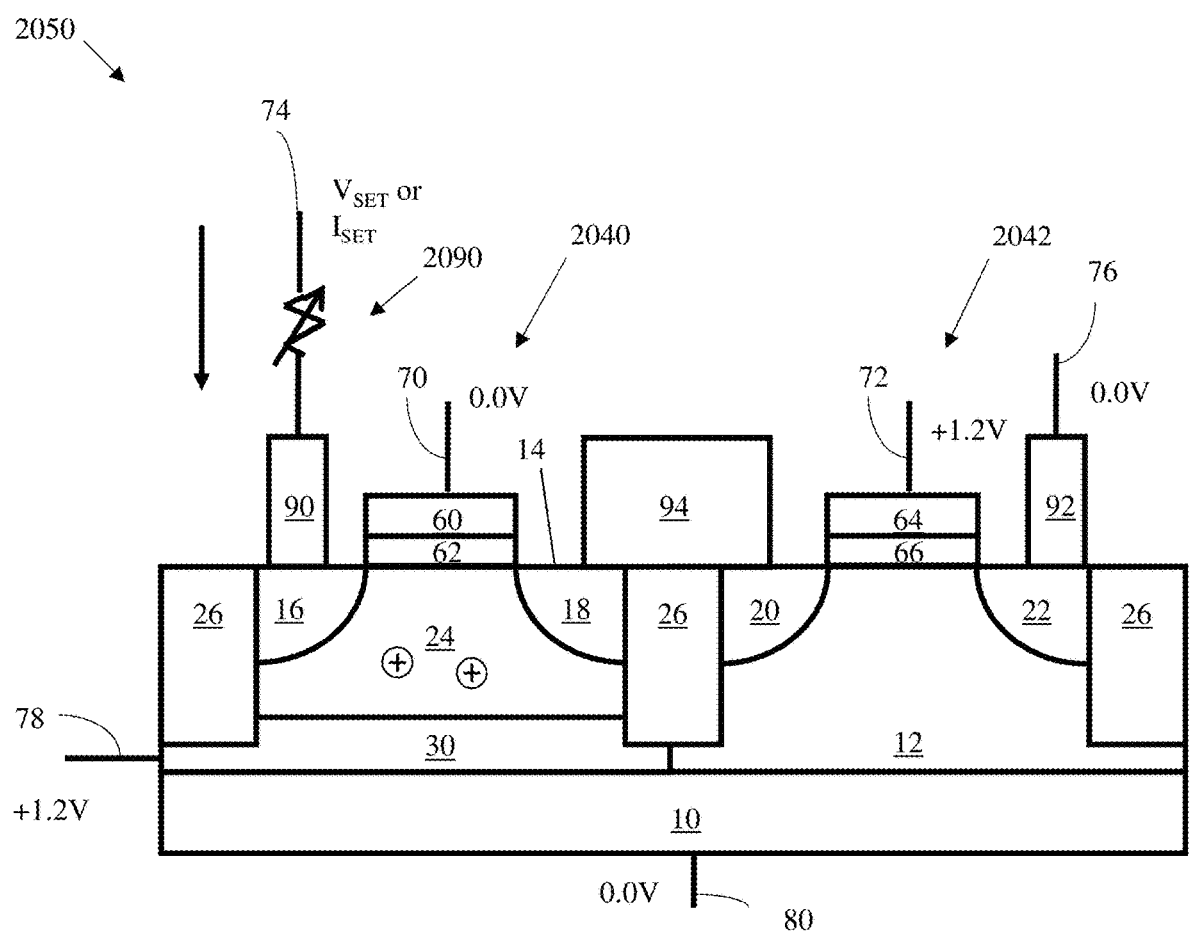
FIGS. 40A-40B show bias conditions applied on the terminals of a selected memory cell according to an embodiment of the present invention.
Figure 40B:
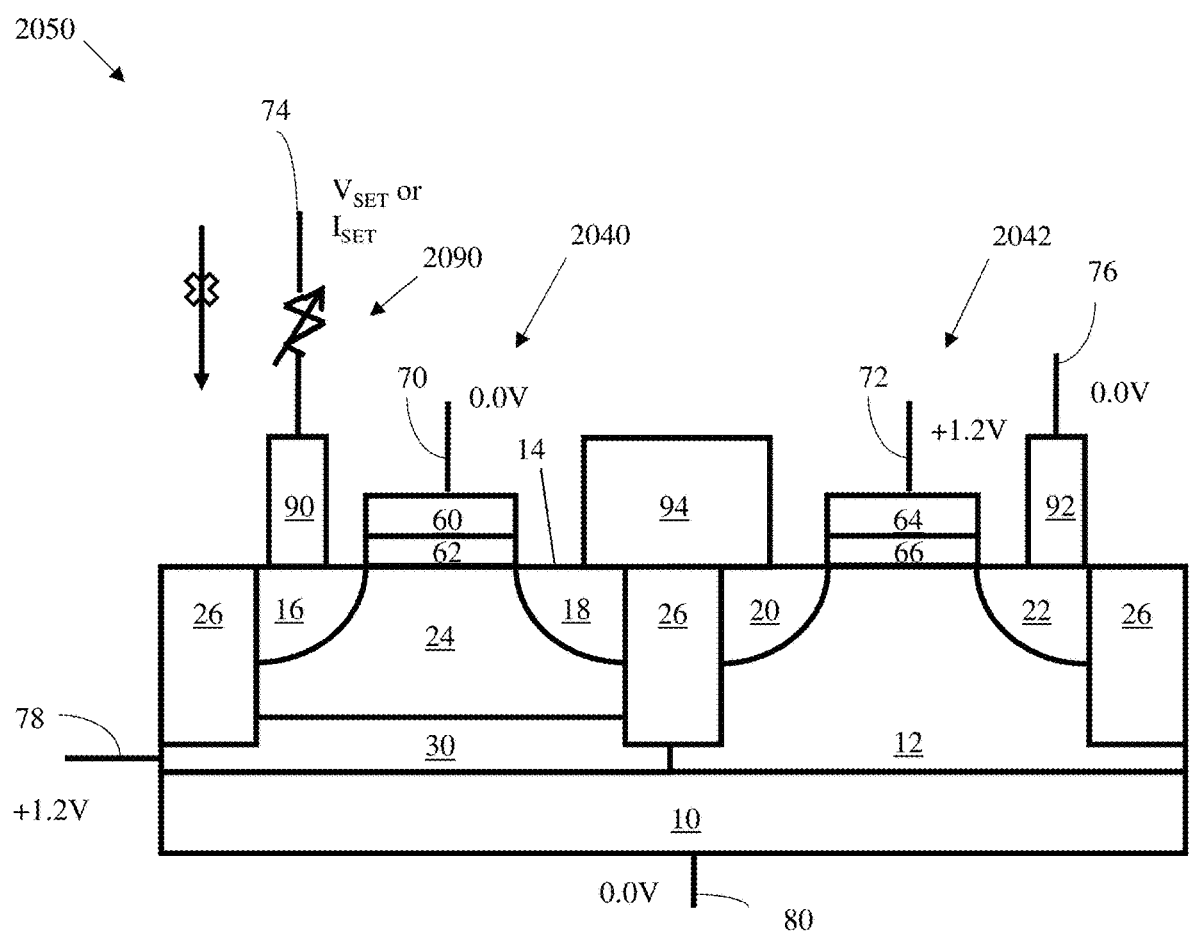

After restoring the memory cell(s) 2050, the resistance change memory(ies) 2090 is/are reset to a predetermined state, e.g., a low resistivity state as illustrated in FIGS. 39, 40A, and 40B, so that each resistance change memory 2090 has a known state prior to performing another shadowing operation.

To perform a reset process, a positive voltage $V_{SET}$ is applied to SL terminal 74 and a substantially neutral voltage is applied to BL terminal 76. A neutral voltage or slightly positive voltage is applied WL1 terminal 70, a positive voltage is applied to WL2 terminal 72, a positive voltage is applied to BW terminal 78, and a substantially neutral voltage is applied to SUB terminal 80.

When the floating body has a positive potential, the bipolar transistor formed pby the source line region 16, floating body 24, and drain region 18 will be turned on (FIG. 40A). The positive voltage applied to SL terminal 74 is controlled (e.g., varied to maintain a constant current $I_{SET}$) such that the electrical current flowing through the resistance change memory 2090 is sufficient to change the state of the materials from a high resistivity state to a low resistivity state. The voltage applied to terminal 74 initially has to exceed a threshold value (sometimes referred to as 'dynamic threshold voltage') to ensure that all resistance change memory materials (including ones in high resistivity state) are conducting. In the case of phase change materials, this involves the change of the crystallinity of the chalcogenide materials from amorphous state to crystalline state, while in metal oxide materials, this typically involves the formation of conductive filaments.

When the floating body is neutral or negatively charged, the bipolar transistor formed by the source line region 16, floating body 24, and drain region 18 will be turned off (FIG. 40B). Therefore, when voltages are applied as described above, no electrical current will flow through the resistance change memory 2090 and it will retain its low resistivity state. Accordingly, the non-volatile resistance change material will be in a low resistivity state when the volatile memory of cell 2050 is in state '0" (i.e. floating body is neutral or negatively charged).

Accordingly, all the non-volatile resistance change memory 2090 will be in a low resistivity state upon completion of the reset operation.

In one particular non-limiting example of this embodiment, about 0.0 volts is applied to BL terminal 76, a constant current of about 400 μA is applied to SL terminal 74, about 0.0 volts is applied to WL1 terminal 70, about +1.2 volts is applied to WL2 terminal 72, about +1.2 volts is applied to BW terminal 78, and about 0.0 volts is applied to SUB terminal 80. However, these voltage and current levels may vary, while maintaining the relative relationships between the charges applied, as described above. For example, a positive voltage may be applied to WL1 terminal 70 to increase the current flow through the floating body transistor 40. The dynamic threshold voltage of a phase change non-volatile memory is typically greater than 1.0 volts, upon which the high resistivity phase change materials will become conducting. The current level required to change phase change memory materials to low resistivity state typically range between 100 μA to 600 μA. For the case of metal oxide systems, the threshold voltage and the current level vary depending on the materials. Lower current will be needed as the phase change material is scaled to smaller geometry.

Note that this process occurs non-algorithmically, as the state of the floating body 24 does not have to be read, interpreted, or otherwise measured to determine what state to write the non-volatile resistance change memory 2090 to. Rather, the reset process occurs automatically, driven by electrical potential differences. Accordingly, this process is orders of magnitude faster than one that requires algorithmic intervention.

In another embodiment according to the present invention, resistive change element 2090 is formed by bipolar resistive memory element. In one embodiment, the non-volatile bipolar resistive memory element 2090 is initialized to have a low resistivity state.

To perform a shadowing operation, a positive $V_{RESET}$ is applied to SL terminal 74, about zero voltage is applied to BL terminal 76. A neutral voltage or slightly positive voltage is applied WL1 terminal 70, a positive voltage is applied to WL2 terminal 72, a positive voltage is applied to BW terminal 78, and a substantially neutral voltage is applied to SUB terminal 80. This is similar to the shadowing operation illustrated in FIGS. 35, 36A, and 36B.

When the memory cell 2050 is in a state "1", current will flow through the memory cell 2050 from the SL terminal 74 to the BL terminal 76 and pass through resistance change memory element 2090 from the top electrode 48 to the bottom electrode 44. The current flow through the memory element 46 is sufficient to switch the state of the resistance change memory 2090 from a low resistivity state to a high resistivity state. Accordingly, the non-volatile resistance change memory 2090 will be in a high resistivity state when the volatile memory of cell 2050 is in a state "1" (i.e. floating body 24 is positively charged).

When the memory cell 2050 is in a state "0", no (or low) current will flow through the memory cell 2050 because of the higher threshold voltage of the memory cell 2050. Consequently, no (or low) current will flow through the resistance change memory element 46, and the resistance change memory 2090 will remain in a low resistivity state. Accordingly, the non-volatile resistance change memory 2090 will be in a low resistivity state when the volatile memory of cell 2050 is in a logic-0 state (i.e. floating body region 24 is neutral).

In one particular non-limiting example of this embodiment, about +1.2 volts is applied to SL terminal 74, about 0.0 volts is applied to WL terminal 70, about 0.0 volts is applied to BL terminal 74, about +1.2 volts is applied to BW terminal 76, and about 0.0 volts is applied to substrate terminal 78. These voltage and current levels may vary, while maintaining the relative relationships between the charges applied as described above, for example, the $V_{RESET}$ applied to SL terminal 74 is more positive than the voltage applied to the BL terminal 76. For example, a positive voltage may be applied to WL1 terminal 70 to increase the current flow through the floating body transistor 2040.

To perform a reset operation, a negative $V_{SET}$ is applied to SL terminal 74, about zero voltage is applied to BL terminal 76. A neutral voltage or slightly positive voltage is applied WL1 terminal 70, a positive voltage is applied to WL2 terminal 72, a positive voltage is applied to BW terminal 78, and a substantially neutral voltage is applied to SUB terminal 80. This is similar to the reset operation illustrated in FIGS. 39, 40A, and 40B.

When the memory cell 2050 is in a logic-1 state, current will flow through the memory cell 2050 from the BL terminal 76 to the SL terminal 74 and pass through resistance change memory element 46 from the bottom electrode 44 to the top electrode 48. The current flow through the memory element 46 is sufficient to switch the state of the resistance change memory 2090 from a high resistivity state to a low resistivity state. Accordingly, the non-volatile resistance change memory 2090 will be in a low resistivity state when the volatile memory of cell 2050 is in a logic-1 state (i.e. floating body 24 is positively charged). Note that the current flow (or voltage difference between the top electrode and bottom electrode of the resistance change memory 2090) direction during the reset operation is the opposite of that during the shadowing operation. The floating body transistor 2040 allows for current flow in both directions, depending on the mode of operations of the memory cell 2050.

When the memory cell 2050 is in a logic-0 state, no (or low) current will flow through the memory cell 2050 because of the higher threshold voltage of the memory cell 2050. Consequently, no (or low) current will flow through the resistance change memory element 46 and the resistance change memory 2090 will remain in a low resistivity state. Accordingly, the non-volatile resistance change memory 2090 will be in a low resistivity state when the volatile memory of cell 2050 is in a logic-0 state (i.e. floating body region 24 is neutral).

In one particular non-limiting example of this embodiment, about −1.2 volts is applied to SL terminal 74, about 0.0 volts is applied to WL terminal 70, about 0.0 volts is applied to BL terminal 74, about +1.2 volts is applied to BW terminal 76, and about 0.0 volts is applied to substrate terminal 78. These voltage and current levels may vary, while maintaining the relative relationships between the charges applied as described above, for example, the $V_{SET}$ applied to SL terminal 74 is more negative (at a lower potential) than the voltage applied to the BL terminal 76. Alternatively, a positive $V_{SET}$ may be applied to the BL terminal 76 and about zero voltage is applied to SL terminal 74. For example, a positive voltage may be applied to WL1 terminal 70 to increase the current flow through the floating body transistor 2040.

Figure 41:
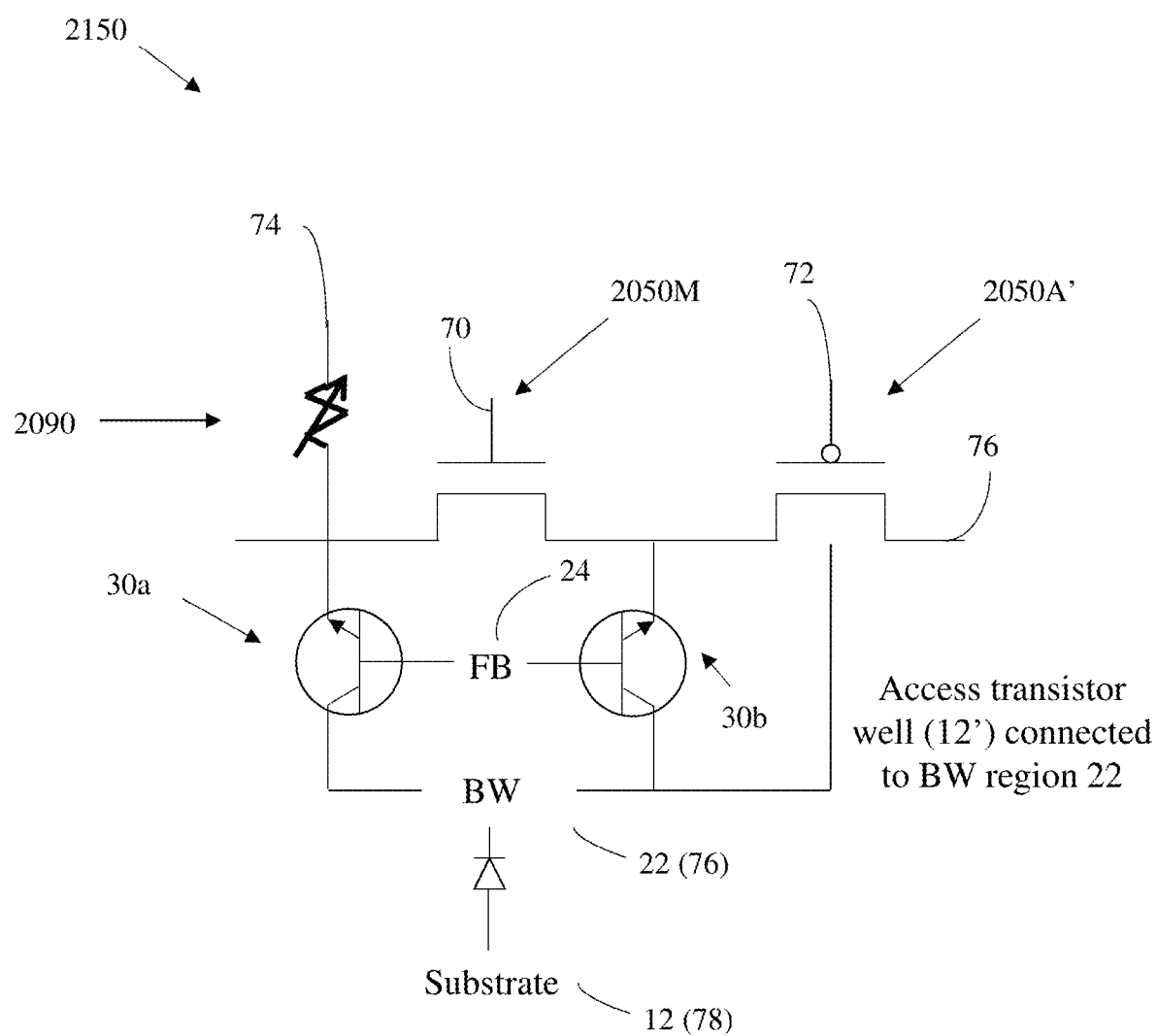
FIG. 41 schematically illustrates an equivalent circuit representation of the memory cell of FIGS. 40A-40B, according to an embodiment of the present invention.
Figure 42:
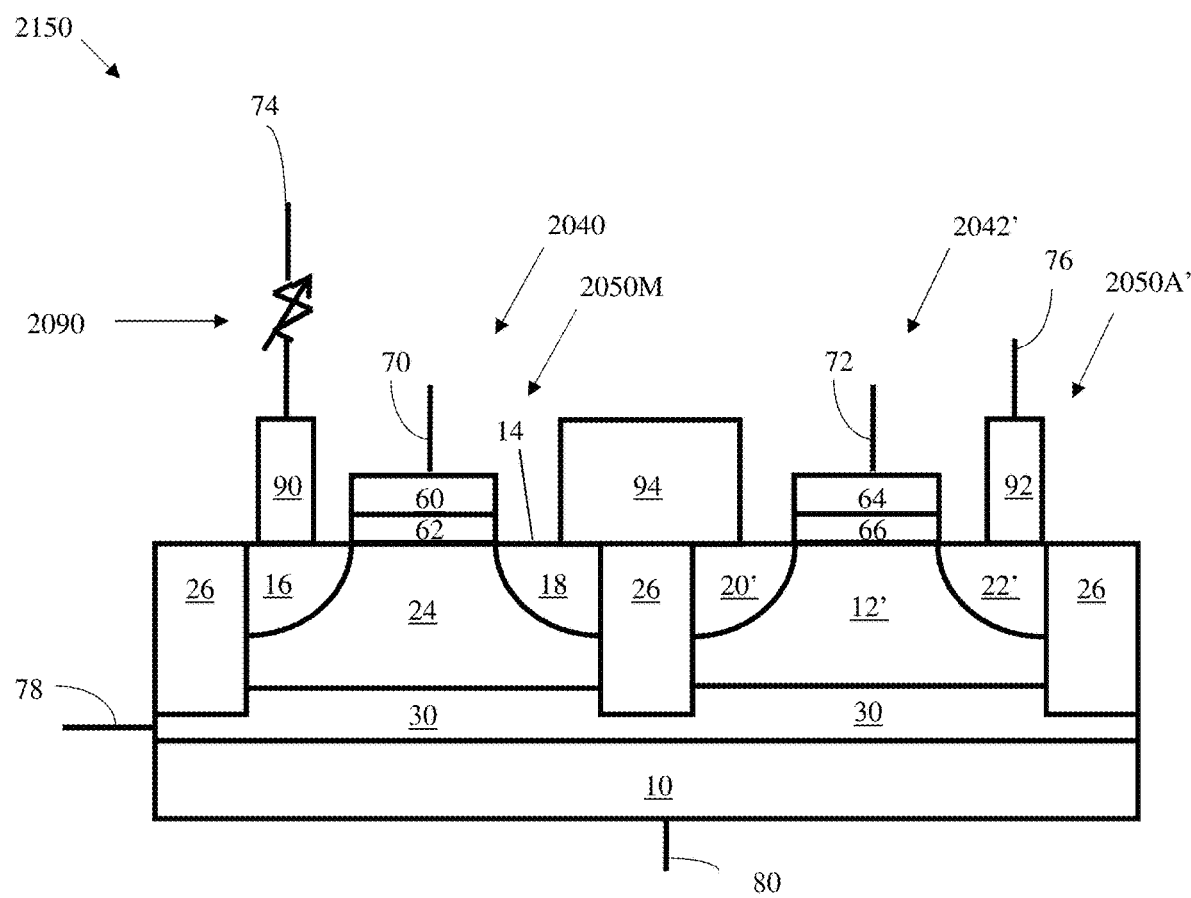
FIG. 42 schematically illustrates a memory cell which comprises a memory device and an access device having different conductivity type that are connected in series, and a resistive change element connected in series to the memory device, according to another embodiment of the present invention.

FIGS. 41 and 42 illustrate memory cell 2150 according to another embodiment of the present invention. Cell 2150 comprises access device 2050A' and memory device 2050M connected in series, where the access device 2050A' and memory device 2050M are transistors having different conductivity type; and a resistive change element 2090 connected in series to memory device 2050M. For example, the memory device 2050M is an n-type transistor and the access device 2050A' is a p-type transistor. As illustrated in FIG. 42, access transistor 2042' comprises a well region 12' of the second conductivity type, such as n-type, source region 20' and bit line region 22' of the first conductivity type, such as p-type. The well region 12' of the second conductivity type is electrically connected to the buried well region 30, and is therefore not floating. When power is applied to memory cell 2150, cell 2150 is in volatile mode operation and operates like a bi-stable floating body device. The volatile mode operations such as: holding, read, write logic-1 and write logic-0 operations, have been described for example in Widjaja-1.

When power down is detected, e.g., when a user turns off the power to cell 2150, or the power is inadvertently interrupted, or for any other reason, power is at least temporarily discontinued to cell 2150, a shadowing operation can be performed to transfer data stored in the floating body region 24 to the resistance change memory 2090. When power is restored to cell 2150, the state of the cell 2150 as stored on the non-volatile resistance change memory 2090 is restored into floating body region 24, followed by a reset operation to reset the non-volatile resistance change memory 2090 to the initial state.

Figure 43:
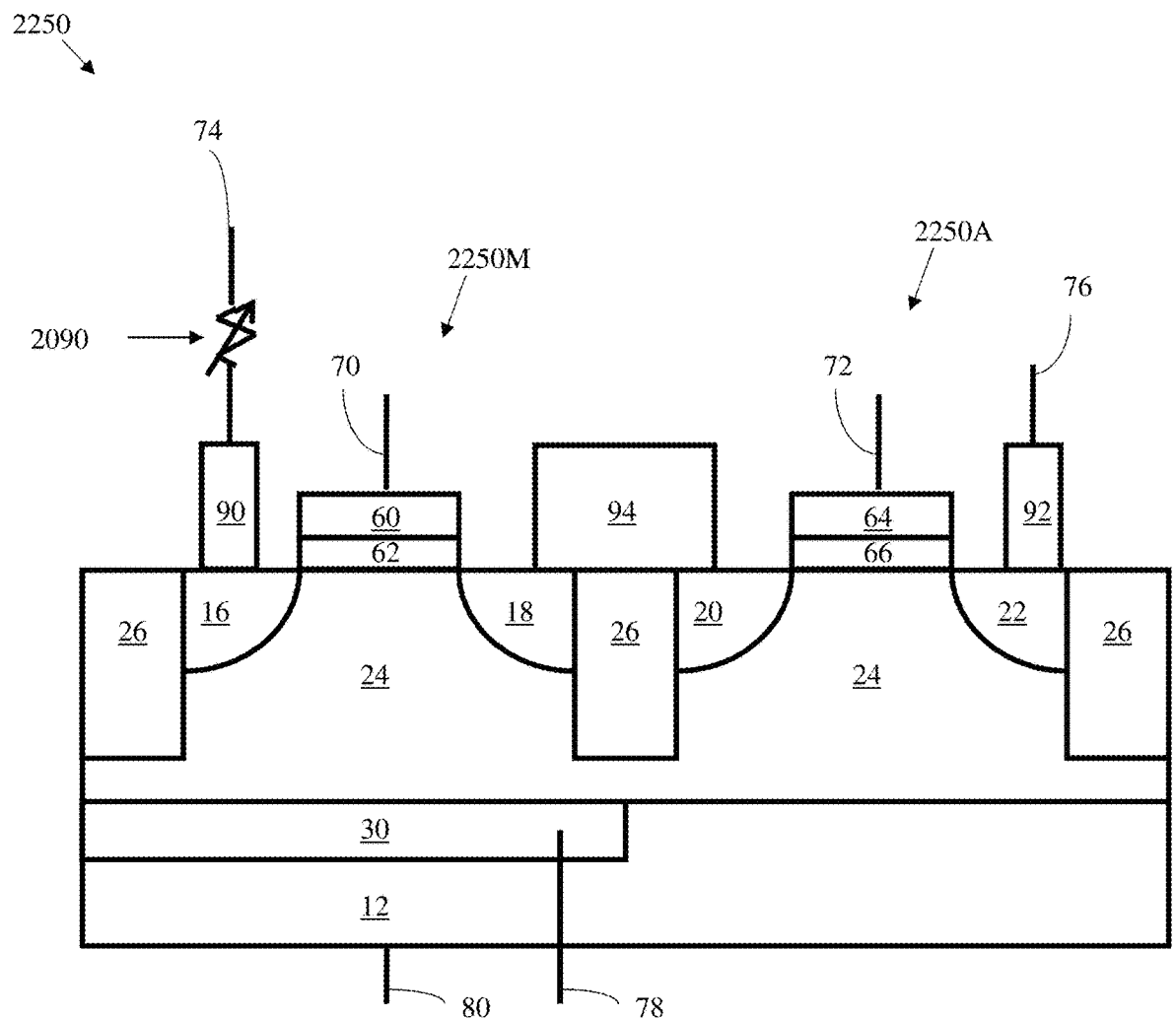
FIG. 43 schematically illustrates a memory cell which comprises a memory device and an access device having different conductivity type that are connected in series, and a resistive change element connected in series to the memory device, according to another embodiment of the present invention.
Figure 44:
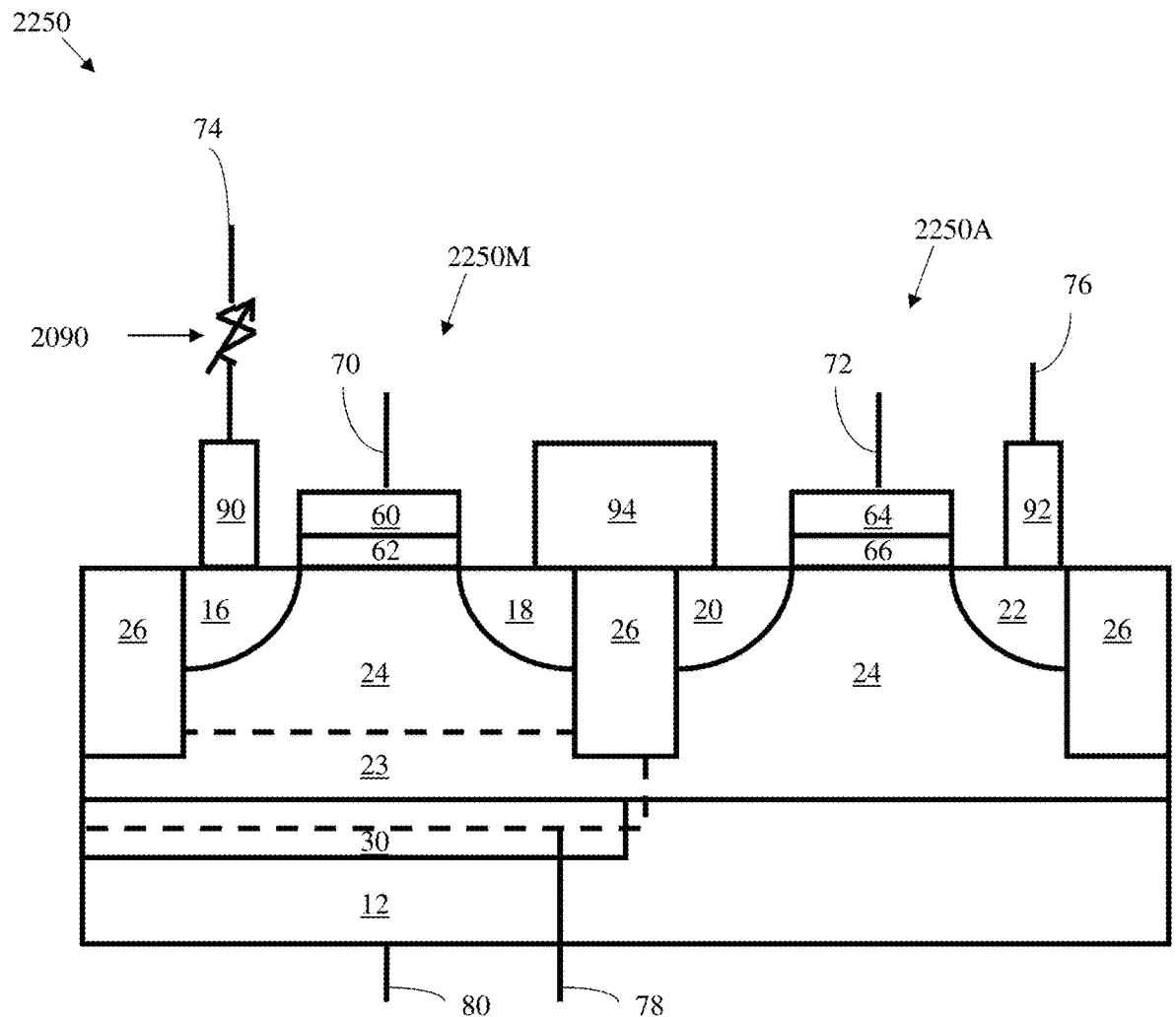
FIG. 44 schematically illustrate a depletion region that is formed as a result of a bias condition applied to the memory cell of FIG. 43 according to an embodiment of the present invention.

FIGS. 43 and 44 illustrate memory cell 2250 according to another embodiment of the present invention. As a result of a back bias application to the BW terminal 76, a depletion region 23 (enclosed in dashed lines in FIG. 44) is formed in the junction of floating body region 24 and the buried layer 22. If positive voltage is applied to the buried layer 22 while the source line region 16 or the drain region 18 is grounded or negatively biased, depletion region 23 extends into the floating body region 24 because of reverse biased p-n junction, and the top portion of the depletion region 23 resides above the bottom of the insulating layer 26. Therefore, the floating body region 24 of one memory cell 2250 is now isolated from that of adjacent memory cells 2250 and forms a potential well for excess charge storage. This has been described, for example, in U.S. Pat. No. 9,029,922, "Memory Device Comprising of an Electrically Floating Body" ("Widjaja-6"), which is all hereby incorporated herein, in its entirety, by reference thereto, or in memory cells 1150, 1250, 1250F, 1350, 1450 according to embodiments of the present invention. The depletion region may also be formed as a result of a back bias application to adjacent n-well region.

Memory cell 2250 may also comprise memory device 2250M and access device 2250A having different conductivity type.

When power is applied to memory cell 2250, cell 2250 is in volatile mode operation and operates like a bi-stable floating body device. The volatile mode operations such as: holding, read, write logic-1 and write logic-0 operations, have been described for example in Widjaja-6.

When power down is detected, e.g., when a user turns off the power to cell 2250, or the power is inadvertently interrupted, or for any other reason, power is at least temporarily discontinued to cell 2250, a shadowing operation can be performed to transfer data stored in the floating body region 24 to the resistance change memory 2090. When power is restored to cell 2250, the state of the cell 2250 as stored on the non-volatile resistance change memory 2090 is restored into floating body region 24, followed by a reset operation to reset the non-volatile resistance change memory 2090 to the initial state.

Figure 45:
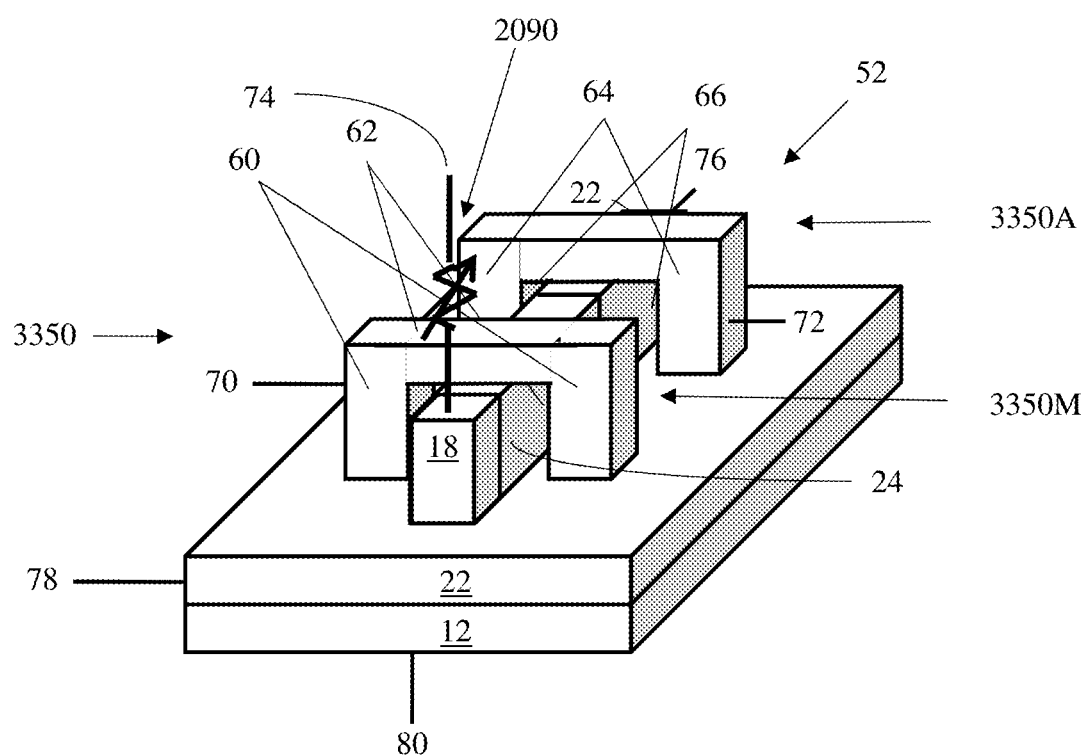
FIG. 45 schematically illustrates a memory cell having a three-dimensional fin structure, and which comprises a memory device and an access device that are connected in series, and a resistive change element connected in series to the memory device, according to another embodiment of the present invention.

FIG. 45 illustrates memory cell 3350 formed in a three-dimensional fin structure, comprising memory device 3350M and access device 3350A in series, and a resistive change element 2090 connected in series to memory device 3350M. Memory cell 3350 may comprise memory device 3350M and access device 3350A having the same conductivity type or may comprise memory device 3350M and access device 3350A having different conductivity type.

When power is applied to memory cell 3350, cell 3350 is in volatile mode operation and operates like a bi-stable floating body device. The volatile mode operations such as: holding, read, write logic-1 and write logic-0 operations, have been described for example in Widjaja-1.

When power down is detected, e.g., when a user turns off the power to cell 3350, or the power is inadvertently interrupted, or for any other reason, power is at least temporarily discontinued to cell 3350, a shadowing operation can be performed to transfer data stored in the floating body region 24 is transferred to the resistance change memory 2090. When power is restored to cell 3350, the state of the cell 3350 as stored on the non-volatile resistance change memory 2090 is restored into floating body region 24, followed by a reset operation to reset the non-volatile resistance change memory 2090 to the initial state.

From the foregoing it can be seen that a memory cell having an electrically floating body has been described. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A semiconductor memory array comprising a plurality of semiconductor memory cells arranged in a matrix of rows and columns, wherein at least two of said semiconductor memory cells each include:
   a floating body region configured to be charged to a level indicative of a state of the memory cell selected from at least first and second states;
   a first region in electrical contact with said floating body region;
   a second region in electrical contact with said floating body region and spaced apart from said first region;
   a gate positioned between said first and second regions;
   a first insulating region located above said floating body region;
   second insulating regions adjacent to said floating body region on opposite sides of said floating body region; and
   a well region adjacent to said floating body region and having a different conductivity type from a conductivity type of said floating body region, wherein:
   said floating body region is bounded by said first insulating region above said floating body region, said second insulating regions adjacent to said floating body region, said well region, and a depletion region formed as a result of an application of a back bias to said semiconductor memory cell;
   wherein said well region bounds at least two sides of said floating body region.

2. The semiconductor memory array of claim 1, wherein said application of said back bias results in at least two stable floating body charge levels.

3. The semiconductor memory array of claim 1, wherein each of said at least two of said semiconductor memory cells comprises a fin structure.

4. The semiconductor memory array of claim 1, wherein each of said at least two of said semiconductor memory cells comprises a buried layer region located below said floating body region and said second insulating regions and spaced from said second insulating regions so as not to contact said second insulating regions, wherein:
   said depletion region is formed as a result of an application of said back bias to said buried layer region.

5. The semiconductor memory array of claim 4, wherein said well region comprises well regions adjacent to said floating body region on opposite sides of said floating body region; and
   wherein said well regions are electrically connected to said buried layer region.

6. The semiconductor memory array of claim 1, wherein said depletion region is formed as a result of an application of said back bias to said well region.

7. The semiconductor memory array of claim 4, wherein each of said at least two of said semiconductor memory cells further comprises an access transistor;
   wherein said access transistor comprises said well region, and
   wherein said well region of said access transistor is electrically connected to said buried layer region.

8. The semiconductor memory array of claim 1, wherein said well region comprises well regions adjacent to said floating body region on opposite sides of said floating body region.

9. An integrated circuit comprising:
a semiconductor memory array comprising a plurality of semiconductor memory cells arranged in a matrix of rows and columns, wherein at least two of said semiconductor memory cells each include:
- a floating body region configured to be charged to a level indicative of a state of the memory cell selected from at least first and second states;
- a first region in electrical contact with said floating body region;
- a second region in electrical contact with said floating body region and spaced apart from said first region;
- a gate positioned between said first and second regions;
- a first insulating region located above said floating body region;
- second insulating regions adjacent to said floating body region on opposite sides of said floating body region; and
- a well region adjacent to said floating body region and having a different conductivity type from a conductivity type of said floating body region, wherein:
- said floating body region is bounded by said first insulating region above said floating body region, said second insulating regions adjacent to said floating body region, said well region, and a depletion region formed as a result of an application of a back bias to said semiconductor memory cell;
- wherein said well region bounds at least two sides of said floating body region;
and a control circuit to access said semiconductor memory cells.

10. The integrated circuit of claim 9, wherein said application of said back bias results in at least two stable floating body charge levels.

11. The integrated circuit of claim 9, wherein each of said at least two of said semiconductor memory cells comprises a fin structure.

12. The integrated circuit of claim 9, wherein each of said at least two of said semiconductor memory cells comprises a buried layer region located below said floating body region and said second insulating regions and spaced from said second insulating regions so as not to contact said second insulating regions, wherein:
said depletion region is formed as a result of an application of said back bias to said buried layer region.

13. The integrated circuit of claim 12, wherein each of said at least two of said semiconductor memory cells further comprises an access transistor
wherein said access transistor comprises said well region, and
wherein said well region of said access transistor is electrically connected to said buried layer region.

14. The integrated circuit of claim 12, wherein said well region comprises well regions adjacent to said floating body region on opposite sides of said floating body region; and
wherein said well regions are electrically connected to said buried layer region.

15. The integrated circuit of claim 9, wherein said depletion region is formed as a result of an application of said back bias to said well region.

16. The integrated circuit of claim 9, wherein said well region comprises well regions adjacent to said floating body region on opposite sides of said floating body region.

* * * * *